United States Patent
Krames

(10) Patent No.: US 12,107,113 B2
(45) Date of Patent: Oct. 1, 2024

(54) VARIABLE COMPOSITION TERNARY COMPOUND SEMICONDUCTOR ALLOYS, STRUCTURES, AND DEVICES

(71) Applicant: OPNOVIX CORP., Palo Alto, CA (US)

(72) Inventor: Michael R. Krames, Palo Alto, CA (US)

(73) Assignee: OPNOVIX CORP., Palo Alto, CA (US)

( * ) Notice: Subject to any disclaimer, the term of this patent is extended or adjusted under 35 U.S.C. 154(b) by 0 days.

(21) Appl. No.: 18/401,290

(22) Filed: Dec. 29, 2023

(65) Prior Publication Data

US 2024/0222416 A1     Jul. 4, 2024

Related U.S. Application Data

(60) Provisional application No. 63/436,309, filed on Dec. 30, 2022.

(51) Int. Cl.
    *H01L 27/15*     (2006.01)
(52) U.S. Cl.
    CPC .................................. *H01L 27/15* (2013.01)
(58) Field of Classification Search
    CPC ........................................................ H01L 27/15
    See application file for complete search history.

(56) References Cited

U.S. PATENT DOCUMENTS

| | | |
|---|---|---|
| 6,252,261 B1 | 6/2001 | Usui et al. |
| 6,255,198 B1 | 7/2001 | Linthicum et al. |
| 6,489,221 B2 | 12/2002 | Gehrkke et al. |

(Continued)

FOREIGN PATENT DOCUMENTS

| | | |
|---|---|---|
| JP | 2000012976 A1 | 1/2000 |
| WO | 2012/075461 | 6/2012 |

(Continued)

OTHER PUBLICATIONS

Ema et al., "Influence of Intermediate Layers on Thick InGaN Growth Using Tri-Halide Vapor phase Epitaxy," Japanese Journal of Applied Physics, 2019, vol. 58, p. SC1027-1.

(Continued)

*Primary Examiner* — Su C Kim

(57) ABSTRACT

$In_xAl_yGa_{1-x-y}N$ semiconductor structures having optoelectronic elements characterized by epitaxial layers having different in-plane a-lattice parameters and different InN mole fractions are disclosed. The active regions are configured to emit radiation in different wavelength ranges and are characterized by strain states within about 1% to 2% of compressive strain. The epitaxial layers are grown on patterned $In_xAl_yGa_{1-x-y}N$ seed regions on a single substrate, where the relaxed InGaN growth layers provide (0001) $In_xAl_yGa_{1-x-y}N$ growth surfaces characterized by different in-plane a-lattice parameters and different InN mole fractions. $In_xAl_yGa_{1-x-y}N$ semiconductor structures can be used in optoelectronic devices such as in light sources for illumination and in display applications.

29 Claims, 28 Drawing Sheets

(56) References Cited

U.S. PATENT DOCUMENTS

| | | | |
|---|---|---|---|
| 7,351,347 | B2 | 4/2008 | Akita et al. |
| 7,663,148 | B2 | 2/2010 | Yi et al. |
| 7,670,933 | B1 | 3/2010 | Wang et al. |
| 7,955,983 | B2 | 6/2011 | Imer et al. |
| 8,729,559 | B2 | 5/2014 | Krames et al. |
| 9,076,927 | B2 | 7/2015 | Keller et al. |
| 9,318,326 | B2 | 4/2016 | Von Kanel et al. |
| 10,847,625 | B1 * | 11/2020 | Krames ............... H01L 33/32 |
| 2004/0113166 | A1 | 6/2004 | Tadatomo et al. |
| 2007/0069225 | A1 | 3/2007 | Krames et al. |
| 2009/0045394 | A1 | 2/2009 | Smeeton et al. |
| 2011/0175126 | A1 | 7/2011 | Yang et al. |
| 2012/0104360 | A1 | 5/2012 | Hardy et al. |
| 2014/0131730 | A1 * | 5/2014 | Keller ............... H01L 31/0735 438/47 |
| 2015/0099348 | A1 | 4/2015 | Lee et al. |
| 2018/0277713 | A1 | 9/2018 | Ciechonski et al. |
| 2020/0058489 | A1 | 2/2020 | Ohlsson |

FOREIGN PATENT DOCUMENTS

| | | |
|---|---|---|
| WO | 2013/121289 A1 | 8/2013 |
| WO | 2017/137635 A1 | 8/2017 |
| WO | 2017/168012 A1 | 10/2017 |
| WO | 2019/068919 A1 | 4/2019 |
| WO | 2021/102198 A1 | 5/2021 |
| WO | 2021/195595 | 9/2021 |
| WO | 2022/060611 A1 | 3/2022 |

OTHER PUBLICATIONS

Even, "In incorporation improvement in InGaN based active region using InGaN pseudo substrate for monolithic white LED application," Optics, Universite Grenoble Alpes, 2018, HAL Archives, 238 pages.

Even et al., "Enhanced In incorporation in full InGaN heterostructure grown on relaxed InGaN pseudo-substrate," Applied Physics Letters, 2017, vol. 110, p. 262103, 6 pages.

Falub et al., "Perfect crystals grown from imperfect interfaces," Scientific Reports, Jul. 2013, vol. 3, No. 2276, 6 pages.

Hestroffer et al., "Relaxed c-plane InGaN layers for the growth of strain-reduced InGaN quantum wells," Semiconductor Scientific Technology, 2015, vol. 30, 105015, 10 pages.

Hiraski et al., "Growth of thick and high crystalline quality InGaN layers on GaN (0001) substrate using tri-halide vapor phase epitaxy," Journal of Crystal Growth, 2016, 6 pages.

Hu et al., "Growth of InGaN/GaN quantum wells with graded InGaN buffer for green-to-yellow light emitters," Japanese Journal of Applied Physics, 2016, vol. 55, 081001, 6 pages.

Hurni et al., "Bulk GaN flip-chip violet light-emitting diodes with optimized efficiency for high-power operation," Applied Physics Letters, 2015, vol. 106, 031101, 4 pages.

Kishino et al., "Monolithic Integration of InGaN-based nanocolumn light-emitting diodes with different emission colors," Applied Physics Express, 2013, vol. 6, 012101, 3 pages.

Ponce et al., "Microstructure and electronic properties of InGaN alloys," Physica Status Solidi, 2003, vol. 240, No. 2, p. 273-284.

Scaccabarozzi et al., "Photoluminescence study of the strain relaxation of GaAs crystals grown on deeply patterned Si substrates," Journal of Crystal Growth, 2014, 4 pages.

Yin et al., "Investigation on epitaxial lateral overgrowth of InGaN/GaN multi-quantum-well nanowires", Journal of Nanoscience and Nanotechnology, Feb. 2013, vol. 13, No. 2, pp. 1389-1391.

International Preliminary Report on Patentability for International Application No. PCT/US/2020/061377, mailed on May 17, 2022, 10 pages.

International Search Report and Written Opinion for International Application No. PCT/US2020/061377, mailed on Feb. 22, 2021, 18 pages.

Non-Final Office Action mailed on Mar. 9, 2020, for U.S. Appl. No. 16/689,064, 24 pages.

Final Office Action mailed on Jun. 19, 2020, for U.S. Appl. No. 16/689,064, 15 pages.

Notice of Allowance mailed on Jul. 16, 2020, for U.S. Appl. No. 16/689,064, 9 pages.

Non-Final Office Action mailed on Aug. 4, 2021, for U.S. Appl. No. 17/072,333, 8 pages.

Bougrioua et al., Growth of freestanding GaN using pillar-epitaxial lateral overgrowth from GaN nanocolumns, Journal of Crystal Growth, 2007, 209, pp. 113-120.

Le et al., Controlled coalescence of AlGaN nanowire arrays: An architecture for nearly dislocation-free planar ultraviolet photonic device applications, Advanced Materials, 2016, DOI: 10.1002/adma.201602645, pp. 1-9.

Sanchez-Paramo et al., Structural and optical characteristics of intrinsic GaN nanocolumns, Physica E, 13, 2002, pp. 1070-1073.

Annex to Form PCT/ISA/206 Communication Relating to the Results of the Partial International Search for PCT/US2023/086561 mailed on Apr. 17, 2024, 17 pages.

* cited by examiner

VARIABLE COMPOSITION TERNARY COMPOUND SEMICONDUCTOR ALLOYS, STRUCTURES, AND DEVICES

RELATED APPLICATIONS

This application claims the benefit under 35 U.S.C. § 119(e) of U.S. Provisional Application No. 63/436,309 filed on Dec. 30, 2022, which is incorporated by reference in its entirety.

This application is related to U.S. application Ser. No. 16/689,064 filed on Nov. 19, 2019, issued as U.S. Pat. No. 10,847,625, and to PCT International Application No. PCT/US2020/061377 filed on Nov. 19, 2020, each of which is incorporated herein by reference in its entirety.

FIELD

The present disclosure relates to indium-aluminum-gallium-nitride ($In_xAl_yGa_{1-x-y}N$) layers having substantially relaxed, device-quality mono-crystalline relaxed (0001) $In_xAl_yGa_{1-x-y}N$ regions with different in-plane a-lattice parameters and to devices fabricated upon the relaxed InGaN layers. The substantially relaxed Wurtzite (0001) $In_xAl_yGa_{1-x-y}N$ regions have an in-plane, or "a", lattice parameter greater than or equal to 3.19 Å. The substantially relaxed (0001) $In_xAl_yGa_{1-x-y}N$ regions are grown on a plurality of patterned III-nitride seed regions such as GaN, $In_xGa_{1-x}N$, $Al_yGa_{1-y}N$, $In_xAl_yGa_{1-x-y}N$ where x and y are not 0, or related alloy seed regions. During growth, $In_xAl_yGa_{1-x-y}N$ grown on the patterned seed regions relaxes and subsequently coalesces to provide substantially relaxed (0001) $In_xAl_yGa_{1-x-y}N$ growth regions that can be used as a growth surface for other semiconductor materials and epitaxial layers. The substantially relaxed (0001) $In_xAl_yGa_{1-x-y}N$ regions can be used to fabricate optical and electronic devices for use as light sources in systems used in illumination and display applications.

BACKGROUND

Micro-light emitting diode (LED) and micro-laser-based devices are envisioned to revolutionize the display and lighting industries. However, for displays, dense pixels-per-inch (PPI) and form factor constraints require multi-color emitters such as red/green/blue (RGB) pixels with dimensions on the order of microns. This means that the dimensions of each individual emitter must be on the order of a few microns or even sub-micron. At this scale, mass-transfer of diced emitters fabricated using multiple wafers with each wafer having single-color emitters becomes challenging. Depositing multiple active regions in tandem is an alternative approach but can lead to compromised quality when multiple InGaN active regions having different InN content grown on GaN are forced to lock to a single in-plane a-lattice parameter, leading to different strain states. To produce high density multi-wavelength emitters, it is desirable to realize variable composition $In_xAl_yGa_{1-x-y}N$ alloys having different in-plane a-lattice parameters on the same growth substrate.

Compound semiconductor materials are typically deposited, or grown, atomically-lattice-matched to a growth substrate to avoid the generation of growth defects such as dislocations. In some cases, it is desirable that the in-plane a-lattice parameter of a compound semiconductor material be altered to provide materials and/or devices and/or systems with particular characteristics.

$In_xGa_{1-x}N$ is currently the material of choice for the active layer(s) of GaN-based visible spectrum optoelectronic devices including, for example, blue- or violet-emitting light-emitting diodes (LED) which are currently the basis for most LED-based illumination and display systems commercialized to date, and the violet-emitting laser diode (LD) which is the basis for the Blu-Ray™ industry. Today, such devices are manufactured using InGaN active layers grown pseudomorphically on gallium-nitride (GaN) epitaxial layers. Unfortunately, the crystalline atomic lattice parameter of InGaN is larger than that of GaN, resulting in severe strain, and increasingly poor material quality with increasing InN mole fraction or increasing thickness for InGaN grown on GaN (InGaN/GaN). This limits the performance of optoelectronic devices based on InGaN/GaN including, for example, LEDs and LDs.

Attempts to grow high-quality, planar, relaxed InGaN for device applications have so far been unsuccessful in commercialization. Graded-layer approaches, used in certain III-V material systems, have been attempted for InGaN using low-temperature molecular beam epitaxy (MBE). However, these growth condition leads to material with high densities of defects (e.g., point defects), which are difficult to ameliorate and lead to poor material quality. Similar approaches using commercially preferred metal organic chemical vapor deposition (MOCVD) for c-plane InGaN are compromised by the lack of a slip system for (polar) c-plane growth and past attempts to exploit non- and semi-polar growth planes result in material having a high defect density and/or devices required to have non- and semi-polar active regions. Hydride vapor phase epitaxy (HVPE) has been used to grow thick InGaN layers with the objective of reducing crystalline defects, but the approach is limited in terms of achievable InN mole fractions and is only applicable to N-polar surfaces and therefore is not ideal for low-cost manufacturing. Growth of strained InGaN layers that can be lifted-off and bonded to compliant carriers to facilitate relaxation has been attempted, but the method results in limited lattice dilation and non-planar, trenched, surfaces. The use of nano-column or nano-rod device structures designed to avoid strain limits of conventional heteroepitaxy results in non-planar device geometries less suitable for manufacturing. Finally, the technique of generating porous GaN material as a compliant substrate for subsequent growth of InGaN has been demonstrated, but results in limited lattice dilation and also requires regrowth after the porosification process, making it complex.

The use of patterning and re-growth has been used to grow high quality, lattice-mismatched heteroepitaxy for single-element (e.g., Ge on Si) and binary III-V (e.g., GaAs on Si) zinc-blende semiconductors. However, similar approaches for Wurtzite semiconductors and/or ternary alloys such as InGaN have not been successful.

SUMMARY

According to the present invention, Wurtzite III-nitride crystal semiconductor structures comprise:
- a substrate comprising a first substrate region and a second substrate region;
- a first $In_{x1}Al_{y1}Ga_{1-x1-y1}N$ growth layer comprising a first (0001) $In_{x1}Al_{y1}Ga_{1-x1-y1}N$ growth region overlying the first substrate region;
- a second patterned $In_{x2s}Al_{y2s}Ga_{1-x2s-y2s}N$ seed region overlying the second substrate region; a second $In_{x2}Al_{y2}Ga_{1-x2-y2}N$ growth layer comprising a second (0001) $In_{x2}Al_{y2}Ga_{1-x2-y2}N$ growth region overlying the second patterned $In_{x2s}Al_{y2s}Ga_{1-x2s-y2s}N$ seed region, wherein, the first (0001) $In_{x1}Al_{y1}Ga_{1-x1-y1}N$ growth region is characterized by a first in-plane a-lattice parameter;

the second (0001) $In_{x2}Al_{y2}Ga_{1-x2-y2}N$ growth region is characterized by a second in-plane a-lattice parameter;

the second in-plane a-lattice parameter is greater than the first in-plane a-lattice parameter;

$$0 \le x2s \le 1, 0 \le y2s \le 1, \text{ and } x2s + y2s \le 1$$
$$0 \le x1 \le 1, 0 \le y1 \le 1, \text{ and } x1 + y1 \le 1; \text{ and}$$
$$0 < x2 \le 1, 0 \le y2 \le 1, x2 + y2 \le 1, \text{ and } x2 > x1.$$

According to the present invention, wafers comprise a semiconductor structure according to the present invention.

According to the present invention, optoelectronic elements comprise a semiconductor structure according to the present invention.

According to the present invention, multi-color optoelectronic devices comprise a semiconductor structure according to the present invention.

According to the present invention, semiconductor devices comprise a semiconductor structure of according to the present invention.

According to the present invention, lighting systems or display systems comprise a semiconductor device according to the present invention.

According to the present invention, methods of fabricating a Wurtzite III-nitride crystal semiconductor structure, comprise:

(a) depositing a first $In_{x1}Al_{y1}Ga_{1-x1-y1}N$ growth layer overlying a first substrate region of a substrate; and (b) depositing a second $In_{x2}Al_{y2}Ga_{1-x2-y2}N$ growth layer overlying a second substrate region of the substrate, wherein the second $In_{x2}Al_{y2}Ga_{1-x2-y2}N$ growth layer overlies a second patterned $In_{x2s}Al_{y2s}Ga_{1-x2s-y2s}N$ seed region, wherein, the first $In_{x1}Al_{y1}Ga_{1-x1-y1}N$ growth layer comprises a first (0001) $In_{x1}Al_{y1}Ga_{1-x1-y1}N$ growth region characterized by a first in-plane a-lattice parameter;

the second $In_{x2}Al_{y2}Ga_{1-x2-y2}N$ growth layer comprises a second (0001) $In_{x2}Al_{y2}Ga_{1-x2-y2}N$ growth region characterized by a second in-plane a-lattice parameter; and the second in-plane a-lattice parameter is greater than the first in-plane a-lattice parameter, wherein, $$0 \le x2s \le 1, 0 \le y2s \le 1, \text{ and } x2s + y2s \le 1$$
$$0 \le x1 \le 1, 0 \le y1 \le 1, \text{ and } x1 + y1 \le 1; \text{ and}$$
$$0 < x2 \le 1, 0 \le y2 \le 1, x2 + y2 \le 1, \text{ and } x2 > x1.$$

According to the present invention, semiconductor structures comprise semiconductor structures fabricated using the method according to the present invention.

BRIEF DESCRIPTION OF THE DRAWINGS

Those skilled in the art will understand that the drawings described herein are for illustration purposes only. The drawings are not intended to limit the scope of the present disclosure.

DETAILED DESCRIPTION

Figure 1A:
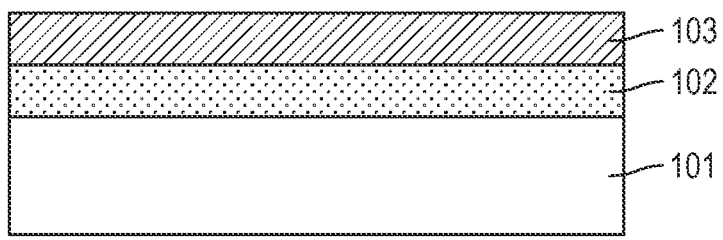
FIGS. 1A-1E show an example of a process flow for fabricating an InGaN layer having a relaxed InGaN region provided by the present disclosure.

"Substantially uniform lattice parameter" refers to a semiconductor layer characterized by a local lattice parameter of the semiconductor layer that varies by less than 1% with respect to an average lattice parameter such as, for example, less than 0.5% with respect to an average lattice parameter, or less than 0.1% with respect to an average lattice parameter.

"Defect density" refers to the density, in plan view, of extended defects, such as dislocations, in a semiconductor layer. The defect density can be determined using, for example, etching (and counting etch pit density, EPD), cathodoluminescence to observe and count dark spots, atomic force microscopy (AFM) to observe and count small pits.

A lattice parameter can be determined using X-ray diffraction (XRD) and reciprocal space map (RSM) analysis. High-angle, or near grazing incidence, XRD techniques can be used to determine the lattice parameter of upper layers in a structure in which the lattice parameter may vary as a function of depth.

"III-V material" refers to a compound semiconductor material comprising at least one column-III element and at least one column-V element from the Periodic Table. A III-V material can be $In_xAl_yGa_{1-x-y}N$ such as GaN, AlN, InN or InGaN, or (In)(Al)GaN such as GaN, AlGaN, or InAlGaN.

"Growth plane" refers to a plane parallel to the deposition plane of material onto a planar surface, such as that of a conventional substrate growth surface.

"Substantially perpendicular to the growth plane" refers to a surface that forms an angle with respect to the growth plane that is approximately 90 degrees such as from 88 degrees to 92 degrees with respect to the growth plane.

Wurtzite GaN, or GaN, is characterized by a Wurtzite crystal structure having room-temperature a- and c-lattice parameters of approximately 3.189 Å, and 5.185 Å, respectively. The crystal plane normal to the c-lattice parameter direction ("c-direction") is the c-plane, which has a Ga-face (0001) and a N-face (000-1). The planes that contain the c-direction and are perpendicular to the a-lattice parameter direction ("a-direction") are the {11-20} planes, or "a-planes". The planes that contain the c-direction and are parallel to the a-lattice parameter direction are the {1-100} planes, or "m-planes".

Wurtzite $In_xAl_yGa_{1-x-y}N$, $In_xGa_{1-x}N$, and $Al_yGa_{1-y}N$ has the same crystal structure as Wurtzite GaN, but may include a non-zero molar fraction of InN, x, to form a ternary compound wherein a specified fraction of column-III atoms are In and the remainder are substantially Ga. InN has room-temperature a- and c-lattice parameters of 3.545 Å, and 5.703 Å, respectively, and $In_xGa_{1-x}N$ has room-temperature a- and c-lattice parameters of between that of GaN and InN, and according to the molar fraction.

Wurtzite $In_{x1}Al_{y1}Ga_{1-x1-y1}N$, or InAlGaN, has the same crystal structure as Wurtzite GaN, but may include a non-zero molar fraction of InN, x, or AlN, y, to form a ternary or quaternary compounds wherein a specified fraction of column-III atoms are In and/or Al and the remainder are substantially Ga. AlN has room-temperature a- and c-lattice parameters of approximately 3.112 Å and 4.982 Å, respectively, and $Al_yGa_{1-y}N$ has room-temperature a- and c-lattice parameters of between that of GaN and AlN, and according to the molar fraction.

Although the present description focuses on growing (0001) InGaN on a GaN seed surface, the method is applicable to other Wurtzite materials, such as $In_xAl_yGa_{1-x-y}N$ on AlN, AlGaN on AlN, and AlGaN on GaN. When the seed comprises InGaN, the molar fraction of InN in the overlying InGaN layer can be different than the molar fraction of InN in the InGaN seed. For example, the molar fraction of InN in the overlying InGaN layer can be greater than the molar fraction of InN in the InGaN seed. Furthermore, the invention is applicable to non-basal-plane Wurtzite structures, such as so-called non- and semi-polar GaN and related materials. The invention is also applicable to other compound semiconductor systems, including zinc blende materials such as InGaAs on GaAs, InGaAsP on InP, InGaSb on GaSb, and II-VI compound semiconductor systems.

"Relaxed InGaN" refers to InGaN material that exhibits an in-plane a-lattice parameter that is equal to, or nearly equal to, that of fully relaxed InGaN material. For example, Wurtzite relaxed $In_xAl_yGa_{1-x-y}N$ has a room-temperature in-plane a-lattice parameter greater than 3.189 Å (0% InN) and up to 3.545 Å (100% InN). This contrasts with a strained InGaN material, such as InGaN which is grown pseudomorphic to GaN and thus exhibits an in-plane a-lattice parameter equal to, or nearly equal to, that of GaN, of, about 3.189 Å, regardless of InN mole fraction. Such strained, or non-relaxed, InGaN material is referred to as InGaN/GaN.

"Pseudomorphic" refers to a layer grown on a base layer or substrate such that the layer is epitaxially aligned to the base layer, even if the native (relaxed) lattice constant of the grown layer is different than that of the base layer or substrate. Pseudomorphic layers are thus substantially fully strained. For Wurtzite crystalline material characterized by c- and a-lattice parameters, a pseudomorphic layer will adjust to match the base layer or substrate, in which case the ratio of c/a for the pseudomorphic layer will be different than that of c/a for the base layer or substrate, depending on the growth direction. For growth in the (0001) direction under compressive strain the ratio of c/a for the pseudomorphic layer will be greater than that of the base layer or substrate, while for tensile strain the ratio of c/a for the pseudomorphic layer will be less than that of the base layer or substrate. For growth in the non-polar directions, e.g., <10-10> or <11-20> directions, under compressive strain the ratio of c/a for the pseudomorphic layer will be less than that of the base layer or substrate, while for tensile strain the ratio of c/a for the pseudomorphic layer will be greater than that of the base layer or substrate. For semipolar growth directions, the strain will depend on whether the growth direction is within 45 degrees of the [0001] direction, i.e., more vertical, or more than 45 degrees away from the [0001], i.e., more lateral. For example, for growth in the semi-polar <10-11> directions, under compressive strain the ratio of c/a for the pseudomorphic layer will be less than that of the base layer or substrate, while for tensile strain the ratio of c/a for the pseudomorphic layer will be greater than that of the base layer or substrate.

According to the present invention, $In_xAl_yGa_{1-x-y}N$ overlying a $In_xAl_yGa_{1-x-y}N$ seed region is not pseudomorphic with respect to the seed regions.

"In-plane lattice parameter" refers to the crystal lattice spacing within the growth plane. For a (0001) material such as InGaN, the in-plane lattice parameter is the a-lattice parameter.

"Lateral growth" refers to growth in a direction other than normal to the growth plane, including parallel to the growth plane.

"Crystallographically equivalent" refers to semiconductor crystal planes that have identical arrangements of atoms due to the symmetry of the crystal lattice. These planes are equivalent because they can be transformed into each other by the symmetry operations inherent to the semiconductor crystal structure, such as rotation or reflection. For Wurtzite materials like III-nitride semiconductors, one example of crystallographically equivalent planes is the m-plane set, {10-10}: (10-10), (01-10), (0-110), (0-1-10), (-1010), and (-1100). Another example of crystallographically equivalent planes is the a-plane set, {11-20}: (11-20), (1-120), (-2110), (-12-10), (2-110) and (21-10). Another example of crystallographically equivalent planes is the semi-polar set {10-11}: (10-11), (01-11), (0-111), (0-1-11), (-1011), and (-1101). Of course, there are many more crystallographically equivalent plane sets, as will be understood by those skilled in the art.

"Critical thickness" refers to the maximum thickness of an epitaxial film that can be grown on a base layer or substrate without the formation of dislocations, due to lattice mismatch between the film and the base layer or substrate. Beyond the critical thickness, strain energy exceeds the energy required to form dislocations, leading to their formation and thus result in relaxation in the epitaxial film. This transition from a pseudomorphic film (below the critical thickness) to a (even partially) relaxed film via formation of dislocations is referred to as plastic deformation.

"Overlying" such as an "overlying layer" refers to a layer such as an epitaxial layer that is situated above an underlying layer. An overlying layer can be contacting the underlying layer. An overlying layer such as an overlying InGaN layer can have a homogeneous composition or can have an inhomogeneous composition parallel and/or perpendicular to the growth plane. There can be one or more distinct epitaxial layers between an overlying layer and an underlying layer.

"Layer" such as a p-type $In_xAl_yGa_{1-x-y}N$ layer or active layer refers to a layer comprising a single layer or comprising one or more sublayers such as, for example, from 1 to 100 sublayers. Each of the sublayers comprising a layer can have the same elemental composition or at least one of the sublayers can have a different elemental composition than another sublayer. For example, a p-type $In_xAl_yGa_{1-x-y}N$ layer can comprise $In_xAl_yGa_{1-x-y}N$ sublayers having different concentrations of a p-type dopant. Each of the sublayers forming a layer can independently be deposited under the same or different deposition conditions and can independently comprise the same or different elemental composition.

"$In_xAl_yGa_{1-x-y}N$" refers to an alloy of gallium and nitrogen, aluminum and nitrogen, and optionally indium and/or aluminum. For example, $In_xAl_yGa_{1-x-y}N$ includes GaN, AlN, $In_xGa_{1-x}N$, $Al_yGa_{1-y}N$, and $In_xAl_yGa_{1-x-y}N$ where x and y are not 0.

"$In_{x1s}Al_{y1s}Ga_{1-x1s-y1s}N$" refers to an $In_xAl_yGa_{1-x-y}N$ alloy associated with a first seed region.

"$In_{x2s}Al_{y2s}Ga_{1-x2s-y2s}N$" refers to an $In_xAl_yGa_{1-x-y}N$ alloy associated with a second seed region.

"$In_{x1}Al_{y1}Ga_{1-x1-y1}N$" refers to a $In_xAl_yGa_{1-x-y}N$ alloy associated with a first growth layer and to a first (0001) growth region.

"$In_{x2}Al_{y2}Ga_{1-x2s-y2s}N$" refers to an $In_xAl_yGa_{1-x-y}N$ alloy associated with a second growth layer and to a second (0001) growth region.

"Simultaneously depositing" refers to depositing or growing an epitaxial layer over different regions of a growth substrate at the same time and under the same reactor growth conditions such as substrate temperature, gas temperature, reactants, flow rates, and pressures.

"Sequentially depositing" refers to depositing or growing an epitaxial layer over different regions of a growth substrate at different times and under the same or different reactor growth conditions such substrate temperature, gas temperature, reactants, flow rates, and pressures.

Although much of the disclosure is focused on the growth of InGaN overlying patterned (In)GaN seed regions and the formation of a relaxed InGaN region, the invention encompasses growth of $In_{x2}Al_{y2}Ga_{1-x2-y2}N$ overlying patterned $In_{x1}Al_{y1}Ga_{1-x1-y1}N$ seed regions and the formation of a relaxed $In_{x2}Al_{y2}Ga_{1-x2-y2}N$ region, where $0 \le x1 < 1$, $0 < y1 < 1$, $x1+y1 \le 1$ and is characterized by a Wurtzite III-nitride crystal structure, and where $0 \le x2 < 1$, $0 \le y2 < 1$, $x2+y2 \le 1$ and $x2 > x1$ and is characterized by a Wurtzite III-nitride crystal structure. For example, a seed region can comprise GaN, AlN, InGaN, AlGaN, or InAlGaN, and an overlying growth region can comprise InGaN, AlGaN, or InAlGaN and the relaxed (0001) region can comprise InGaN, AlGaN, or InAlGaN, respectively.

Reference is now made in detail to certain embodiments of materials, semiconductor structures, optoelectronic devices, and methods. The disclosed embodiments are not intended to be limiting of the claims. To the contrary, the claims are intended to cover all alternatives, modifications, and equivalents.

The present invention teaches the formation of a wide-area, planar, coherent, at least partially but substantially uniformly relaxed compound semiconductor material layer for use in an optical and/or electronic device. Wide area refers to sizes wider than the emitting diameter of a single optoelectronic device, such as a LED or VCSEL. Consistent with microLEDs and micro-VCSELs, wide areas are typically larger than 0.25 $\mu m^2$, but in some applications may be as wide as 1 $cm^2$ or even larger than 1 $cm^2$ in extent. Planar refers to a semiconductor layer that exhibits at least one surface that is substantially flat and is substantially free of significant thickness variations within the wide area. A planar semiconductor area can serve as a growth surface for an overlying epitaxial semiconductor layer. For example, a planar semiconductor layer can have an RMS roughness less than 1 nm, as determined using atomic force microscopy. A planar semiconductor layer can have a thickness, for example, within ±10% of the average thickness of the planar semiconductor layer. Coherent refers to the property that the material is substantially crystalline, as opposed to amorphous. Relaxed refers to the property that the in-plane lattice parameter of the material is approximately that of a freestanding, coherent, 100% relaxed version of the material having the same elemental composition. Substantially relaxed refers to a material in which the in-plane lattice parameter of the material is within 30% of that of a freestanding, coherent, 100% relaxed version of the material having the same elemental composition. Uniformly refers to the property of having a weakly varying or substantially non-varying in-plane lattice parameter within the wide area, upon which optical and/or electronic device structures can be fabricated. In addition, the invention is applicable to a wide range of semiconductor crystal systems, including Wurtzite crystal structures, and to high-order alloys including ternary and quaternary alloys. Finally, the invention is suitable for structures grown by a number of growth methods including, for example, molecular beam epitaxy (MBE) and metal-organic chemical vapor deposition (MOCVD).

In particular, the present invention teaches the formation of a large-area, planar, coherent, at least partially but substantially uniformly relaxed indium gallium nitride (InGaN) material layer for use as a base layer of an optical and/or electronic device. Various compositions such as InN molar fractions, can be achieved. Uniformly relaxed refers to layers with in-plane lattice parameters that are largely non-varying over the majority of the large area in a plane containing the growth plane. Such relaxed InGaN material is referred to in the present invention, as relaxed InGaN such as Native InGaN® (Opnovix Corporation).

The invention further teaches the formation of optical and/or electrical devices and systems based on relaxed $In_xAl_yGa_{1-x-y}N$ such as $In_xGa_{1-x}N$, which may include other InGaN layers grown pseudomorphically to relaxed InGaN (i.e., InGaN/InGaN), such as Native InGaN®.

The invention further includes optoelectronic devices having two or more optoelectronic elements configured to emit at different respective wavelengths grown over different respective $In_xAl_yGa_{1-x-y}N$ growth layers overlying a single growth layer.

Other features and aspects of the invention will be apparent from the following description and the accompanying drawings. In particular, the teachings of the present invention are applicable to other compound semiconductor device materials, such as indium gallium nitride ($In_xGa_{1-x}N$), aluminum gallium nitride ($Al_xGa_{1-x}N$), aluminum gallium indium nitride ($In_xAl_yGa_{1-x-y}N$), III-As materials, III-P materials, III-Sb materials, and others.

The present invention discloses the use of a semiconductor seed material deposited on a substrate to register crystalline growth of a compound semiconductor material. The seed material has a plurality of seed regions with edges that are planar seed surface portions and each normal to these planar seed surface portions have a crystallographically equivalent direction that is not parallel to a normal to the large area of the substrate. The limited (preferably, one) number of exposed planar seed surface crystallographically equivalent orientations ensures uniform relaxation and compositional control of a InGaN material grown thereon, avoiding competing growth modes and problems associated with uncontrolled compositional content such as non-uniform InN incorporation, rough surfaces, etc., when variable seed surface orientations are presented for InGaN growth simultaneously. The dimensions of the seed surface portions are limited in extent such that additional compound semiconductor material can be seeded and readily relax, during growth, toward its relaxed in-plane lattice parameter. The resulting "relaxed" compound semiconductor material is subsequently grown out and coalesced to form a wide-area (i.e., area greater than 0.25 m²) film. The wide-area, relaxed compound semiconductor material film provides a template for the growth of improved optical and/or electronic device structures.

In particular, the present invention discloses the use of GaN seed regions with seed surface portions to register crystalline growth of $In_xAl_yGa_{1-x-y}N$ such as, for example, InGaN, i.e., $In_xGa_{1-x}N$, wherein $In_xGa_{1-x}N$ can be GaN and/or $In_xGa_{1-x}N$ consistent with the context of use. Although aspects of the present disclosure focus on InGaN the aspects equally pertain to $In_xAl_yGa_{1-x-y}N$. The dimensions of and geometries associated with the GaN seed surface(s) are limited in extent such that the InGaN material can be seeded and readily relax during growth toward the relaxed in-plane lattice parameter of the InGaN material. The crystallographic direction characterizing the normals to the planar seed surface portions may be a non-polar direction, such as (11-20) or (1-100) or a plane rotated between the non-polar direction, or a semi-polar direction, such as (1-101). The InGaN layer is subsequently grown out and coalesced into a planar, wide-area relaxed InGaN film. The relaxed InGaN film or layer is characterized by a planar relaxed (0001) region that can serve as a growth substrate for an overlying epitaxial layer. The wide-area, relaxed InGaN film provides a template for the growth of improved InGaN-based optical and/or electronic device structures.

An example of a method for growing a relaxed InGaN layer having a relaxed (0001) InGaN region is shown in FIGS. 1A-1E.

Figure 1B:
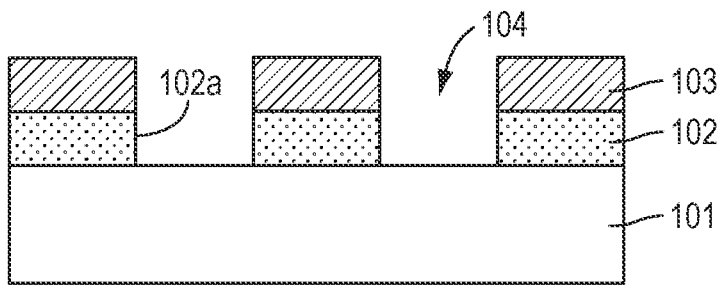

As shown in FIG. 1A, a primarily (0001), i.e., c-plane, GaN (or AlN) layer 102 can be grown on a substrate 101 using any suitable semiconductor growth method. Examples of suitable substrates include, sapphire, silicon carbide, silicon, aluminum nitride, and gallium nitride. Other useful substrate materials include engineered substrates such as silicon-on-insulator (SOI). The GaN layer 102 can be, for example, less than 3 µm thick, less than 0.3 µm thick, or less than 0.03 µm in thick. The GaN layer 102 can be overcoated with a masking layer 103 of a material that rejects or is slow to promote III-nitride material nucleation. Suitable masking materials include, for example, dielectrics such as silicon nitride, silicon oxide, and aluminum oxide, but could also include other materials such as metals or semiconductors (either single-crystalline or polycrystalline). The masking layer 103 and underlying GaN layer 102 can be patterned and etched using photolithography such as using nanolithography and wet and/or dry etching methods to provide a desired patterned as shown in FIG. 1B. Suitable etching techniques include wet chemical etching, electrochemical etching, photochemical etching, photo-electrochemical etching, reactive ion etching (RIE), inductive coupled plasma RIE, chemically assisted ion beam etching (CAIBE), and others.

Figure 1C:
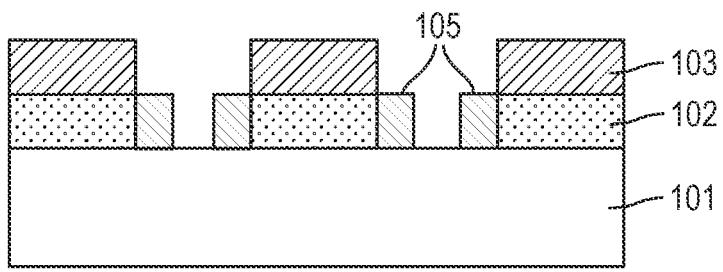
Figure 1D:
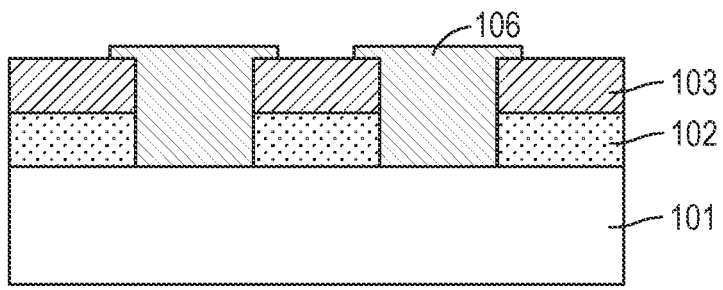
Figure 1E:
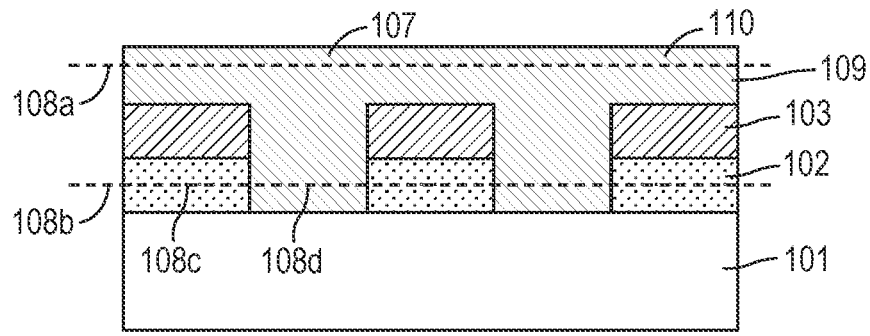

The etched regions 104 where the mask and GaN material have been removed, expose GaN seed surfaces 102a. The seed surfaces 102a can be substantially perpendicular to the GaN (0001) c-plane. As shown in FIG. 1C, GaN seed surfaces 102a can be used for at least lateral growth of InGaN 105, forming InGaN/GaN heterojunctions that are not co-planar with the substrate 101. Each exposed GaN seed surface 102a can have an equivalent crystallographic orientation. For example, the GaN seed surfaces 102a can be primarily (1-100), i.e., m-plane, or primarily (11-20), i.e., a-plane, or any plane rotated between the m- and a-planes. Moreover, the seed surfaces 102a can be intentionally mis-oriented with respect to the main GaN crystal planes, for example, to promote favorable and uniform growth characteristics. FIG. 1D shows InGaN 106 grown to fill the etch cavity and overly a portion of the mask layer 103. FIG. 1E shows InGaN layer 106 further grown to coalesce and form a relaxed InGaN layer 109 having a relaxed (0001) InGaN region 110 overlying the mask regions 103 and the substrate 101. FIG. 1E shows a plane 108*a* through the relaxed InGaN region 109 and co-planar with (0001) InGaN surface 107, and a plane 108*b* bisecting the seed regions 102, and the InGaN regions between seed regions 102. A center of a seed region is indicated as 108*c* and a center of an InGaN region between the seed regions 102 is indicated as 108*d*.

Another technique to achieve seed region facets is by material redistribution through mass transfer to form preferred facets, which involves controlled thermal annealing in a specific gas environment. By heating the material to high temperatures in a controlled atmosphere (like an inert or reducing gas, or a vapor containing specific chemical elements), atoms on the surface become mobile, allowing mass transfer to occur. This process leads to the formation and growth of certain crystal facets that are energetically more favorable, resulting in the exposure of preferred plane sets. For example, when heated to high temperatures, GaN can undergo surface reconstruction, where gallium and nitrogen atoms diffuse on the surface, leading to the preferential formation and exposure of certain crystalline facets determined by the detailed conditions, such as gaseous environment (e.g., ratio of nitrogen to ammonia and/or hydrogen).

The orientation of the GaN seed surface 102*a* can be determined by the patterning and upon the growth orientation of the underlying GaN layer 101. The orientation of the seed surface 102*a* is further dependent on the angle of the surface of the etched GaN layer 102. For example, for a (0001) GaN layer and near vertical etching, the orientation of the GaN seed surface can vary from approximately (1-100) to (11-20) and any orientation rotated in between. This orientation can be selected to optimize InGaN growth conditions and InGaN material quality.

For InGaN growth on certain GaN seed surfaces, especially those substantially perpendicular to the main surface of the substrate, to facilitate coalescence of the relaxed InGaN layer it may be desirable to enhance lateral-vs-vertical growth by optimizing growth conditions and/or by choosing a GaN seed surface orientation that promotes a fast growth rate.

The small dimensions of the GaN seed surface promote relaxation of the InGaN material deposited thereon, and provides a planar, crystallographic orientation to facilitate coherent InGaN growth. During growth, InGaN grows coherently and relaxes toward its relaxed lattice parameters, and eventually coalesces with a neighboring InGaN growth front originating in an adjacent etched region. Referring to FIG. 1C, InGaN 105 is grown from the opposing GaN seed surfaces 102*a* and in FIG. 1D InGaN 106 is grown to fill the etch cavities and to overly a portion of the mask layer 103. Continued InGaN growth causes InGaN grown on the GaN seed surfaces in adjacent cavities to coalesce. The relaxed InGaN layer is then grown above the masking layer, to form a continuous, planar, relaxed (0001) InGaN region 110 at the upper InGaN surface 107, which can serve as a relaxed (0001) InGaN growth surface or template.

In the present InGaN growth method, relaxation is allowed laterally, i.e., by twist, rather than by tilting which occurs when InGaN is grown directly on a (0001) GaN surface. Direct growth of InGaN on (0001) GaN introduces vertical InGaN strain gradients which become problematic during subsequent growth and coalescence of the InGaN. Instead, the present invention provides for reduced tilting which allows the final coalesced film to be substantially free of strain and/or compositional inhomogeneities, thus providing a high quality planar relaxed (0001) InGaN wide-area surface for semiconductor growth. Moreover, because relaxation occurs mostly uniformly at the GaN seed surface, vertical strain gradients, which can be generated when strained layers are first grown pseudomorphically (then etched and relaxed), are avoided or are minimized.

In the InGaN growth methods provided by the present disclosure, InGaN growth occurs mainly at surfaces of the GaN seed material, and growth of InGaN on other exposed surfaces is minimized or avoided altogether. For this reason, it can be beneficial to etch through the GaN seed material and into the underlying substrate, to move the substrate growth surface away from the InGaN nucleation region. In addition, growth conditions of the InGaN layer can be selected to promote growth at one or more GaN seed surfaces as opposed to InGaN nucleation and growth on the substrate, which would present a competitive growth mode. This approach is illustrated in FIGS. 2A-2E where both the GaN layer and a portion of the substrate is etched. By etching the substrate, the distance between competitive growth (at the substrate surface) and the desirable growth at the one or more surfaces of the GaN seed material is increased with the objective of rendering InGaN grown on the substrate non-competing. Furthermore, etching the substrate can serve to frustrate nucleation and growth of InGaN on the substrate, which further reduces the possibility of interfering competitive growth modes.

Figure 2A:
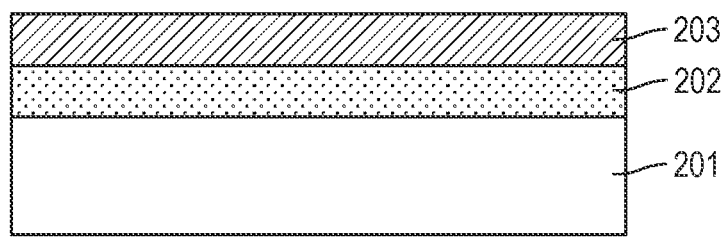
FIGS. 2A-2E shows an example of a process flow for fabricating an InGaN layer having a relaxed InGaN region provided by the present disclosure.
Figure 2B:
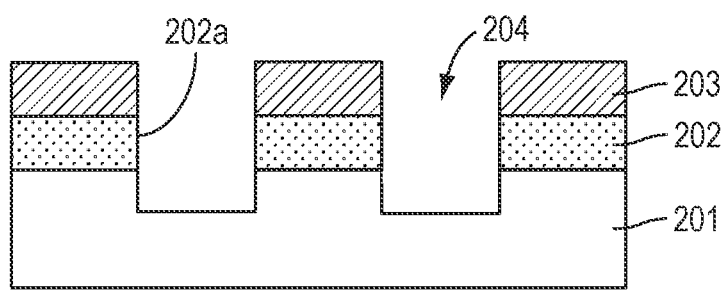
Figure 2C:
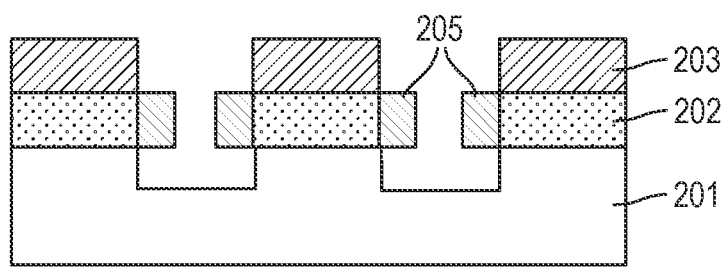
Figure 2D:
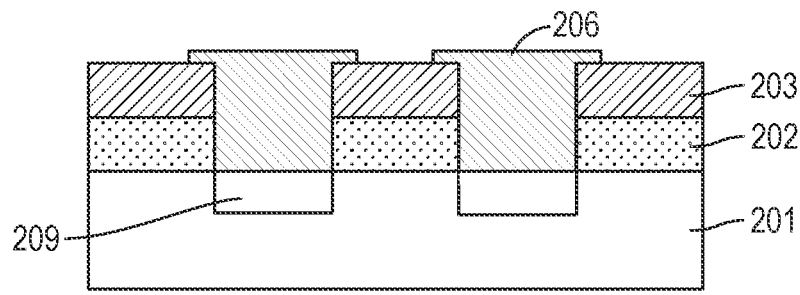
Figure 2E:
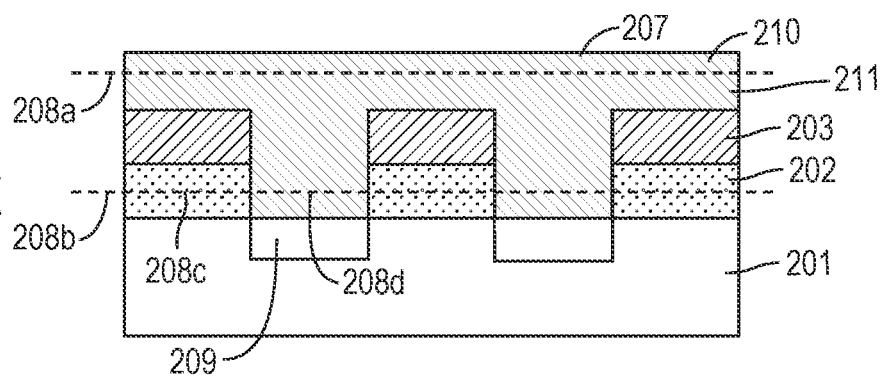

FIG. 2A shows a substrate 201, an overlying GaN layer 202, and an overlying mask layer 203. In FIG. 2B the mask layer 203, GaN layer 202 and a portion of the substrate 201 has been etched to provide cavities 204 with exposed GaN seed surfaces 202*a*. As shown in FIG. 2C, InGaN 205 is grown on the GaN seed surfaces 202*a* and laterally into the respective cavity 204 and above the substrate 201. As shown in FIG. 2D, continued InGaN growth 206 causes the lateral growth regions to coalesce and grow out of the cavities 209 and over the mask layer 203. A portion of cavity 209, that is a void, can be created between the substrate 201 and the coalesced InGaN 206 within the cavity. In some embodiments, such voids can be used to aid in light extraction, such as in LED devices. As shown in FIG. 2E, continued InGaN growth causes the InGaN grown from adjacent cavities to coalesce and form an InGaN layer 211 having a relaxed (0001) InGaN region 210 and a relaxed (0001) InGaN surface 207, which can be used for growth of overlying semiconductor layers. FIG. 2E shows a plane 208*a* through the relaxed InGaN (0001) region 210 and co-planar with relaxed (0001) InGaN surface 207, and a plane 208*b* bisecting the seed regions 202, and the InGaN regions between the seed regions 202. A center of a seed region is indicated as 208*c* and a center of an InGaN region between the seed regions 202 is indicated as 208*d*.

Figure 13:
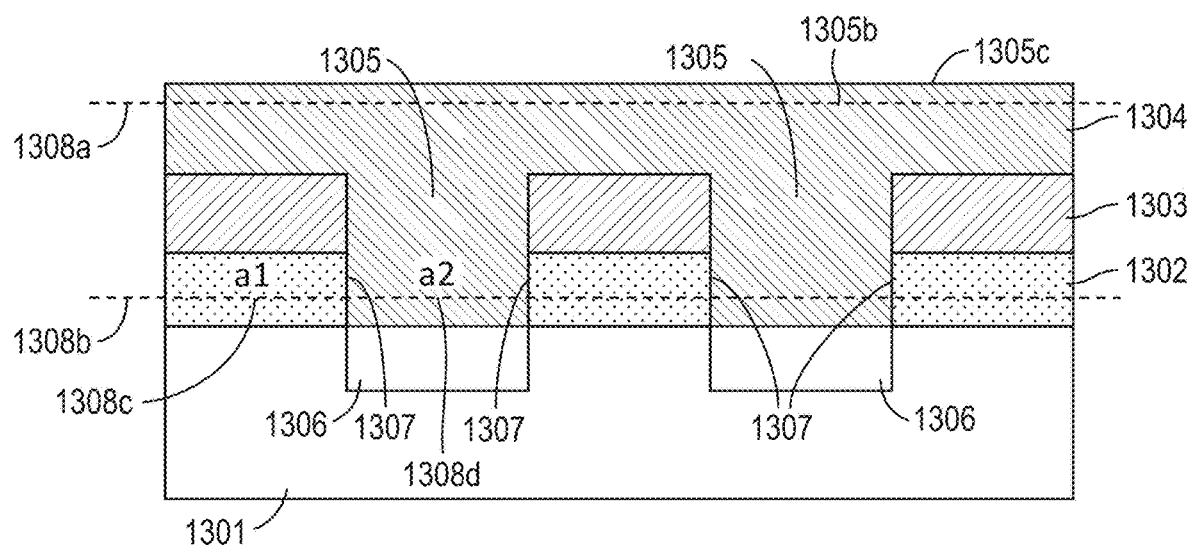
FIG. 13 shows a cross-sectional view of an example of a III-nitride semiconductor structure provided by the present disclosure.

FIG. 13 is a detailed cross-section view of a structure resulting from the process flow illustrated in FIGS. 2A-2E. A substrate 1301, such as (0001) sapphire, includes optionally etched regions 1306 extending into the substrate 1301. GaN (or AlN) seed layer material 1302, characterized by in-plane a-lattice parameter a1, overlies the substrate 1301 in the non-etched regions, and underlies masking layer 1303. InGaN 1305 has been nucleated at the edges of seed layer material 1302 on GaN seed surfaces, forming InGaN/GaN heterojunctions 1307 (i.e., a heterojunction is located at the interface between the InGaN region and the GaN seed region) normal to those surfaces that share an equivalent crystallographic direction that is not parallel to the primary surface of substrate 1301. The InGaN material 1305 has been grown out, at least partially laterally, to relax toward the relaxed InGaN in-plane a-lattice parameter a2, in InGaN regions between the GaN seed surfaces 1307. A plane 1308b parallel to the primary surface of the substrate 1301 and bisecting the GaN seed surfaces 1307 is characterized by different in-plane a-lattice parameters at different positions within the cross-section. For example, at a center point within the GaN seed regions, the lattice parameter along plane 1308b is characterized by lattice parameter a1 commensurate with that of the GaN a-lattice parameter, and at a center point 1305 between the GaN seed surfaces 1307, the lattice parameter along plane 1308b is approximately a2, commensurate with that of at least partially relaxed InGaN according to the average molar fraction of InN in the InGaN layer. The average molar fraction of InN in the InGaN layer is determined, for example, by epitaxial growth conditions such as temperature and relative flow rates of organometallic precursors such a trimethyl-indium (TMI) compared to that of trimethyl-gallium (TMG) in MOCVD. In regions between the a1 and a2 center points, the lattice parameter along plane 1308b is characterized by an in-plane a-lattice parameter greater than a1 and less than a2, since a2>a1. In plan-view (not shown) the variation of the in-plane a-lattice parameter within plane 1308a is characterized by the two-dimensional mask pattern applied to the GaN seed layer (see FIGS. 5 and 6).

Referring to FIG. 13, the InGaN material 1305 is coalesced above the masking layer 1303 to form a relaxed InGaN region 1304 with planar (0001) InGaN surface 1305c. A plane 1308a parallel to the primary surface of the original growth substrate and positioned within relaxed InGaN region 1304 is predominantly characterized by an in-plane a-lattice parameter a2. In particular, at a center point 1305b between the GaN seed surfaces, the InGaN lattice parameter along plane 1308a is characterized by an in-plane lattice parameter a2, and at a center point above the GaN seed surfaces, the InGaN in-plane a-lattice parameter along plane 1308a is slightly less than a2. In plan-view (not shown) the variation of the in-plane a-lattice parameter within plane 1308a is characterized by the two-dimensional mask pattern applied to the GaN seed layer (see FIGS. 5 and 6). Variations in the in-plane a-lattice parameter for InGaN can be detected, for example, using X-ray diffraction (XRD) and reciprocal space maps (RSM), and can be resolved at the sub-micrometer scale using techniques known in the art, and in the relaxed (0001) InGaN region using grazing incidence angle techniques.

The mid-point of plane 1308b within the seed region is indicated as 1308c and the mid-point of plane 1308b between the seed regions is indicated as 1308d.

GaN seed regions 1302 have in-plane dimensions, for example, that are less than 3 μm, less than 0.3 μm, or less than 0.03 μm. The height of GaN seed regions 1302 can be, for example, less than 3 μm, less than 0.3 μm, or less than 0.03 μm. The distances between neighboring GaN seed regions 1302, e.g., the width of GaN seed regions 1302, can be less than 3 μm, less than 0.3 μm, or less than 0.03 μm. The thickness of mask layer 1303 can be, for example, from 0.01 μm to 1 μm, from 0.02 μm to 0.8 μm, from 0.05 μm to 0.5 μm, or from 0.1 μm to 0.4 μm.

FIGS. 3A-3E show an example of a process flow for fabricating relaxed InGaN using a silicon-on-insulator (SOI) substrate. In this embodiment, it can be desirable to include strain-control interlayers, such as GaN, AlGaN, InGaN, or InAlGaN interlayers within the semiconductor structure (not shown) to control wafer bow, as is well known for the growth of GaN on Si.

Figure 3A:
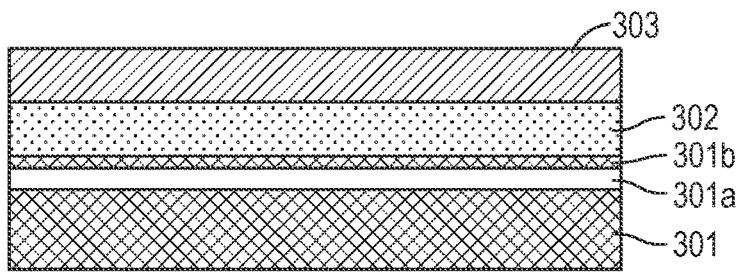
FIGS. 3A-3E show an example of a process flow for fabricating an InGaN layer having a relaxed InGaN region provided by the present disclosure.
Figure 3B:
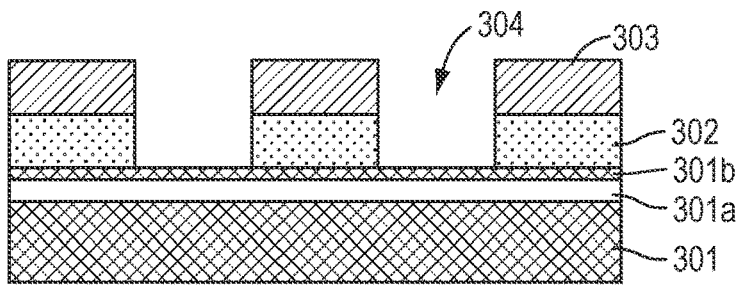
Figure 3C:
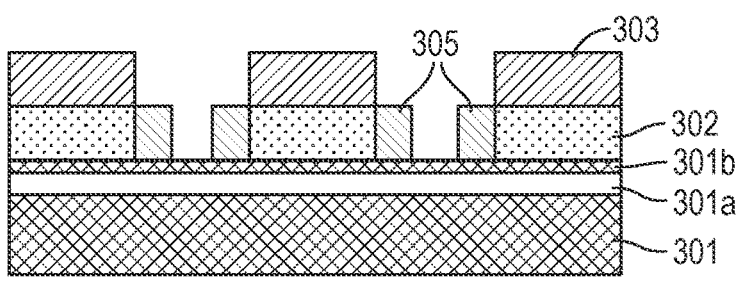
Figure 3D:
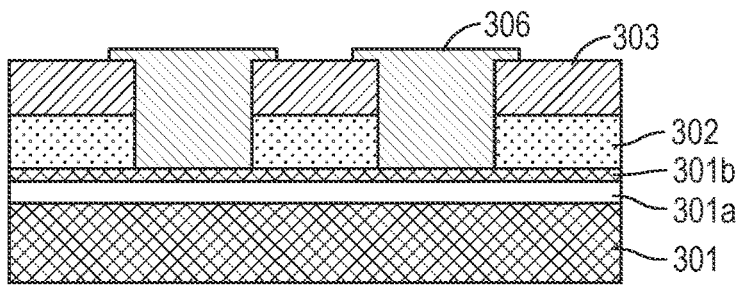
Figure 3E:
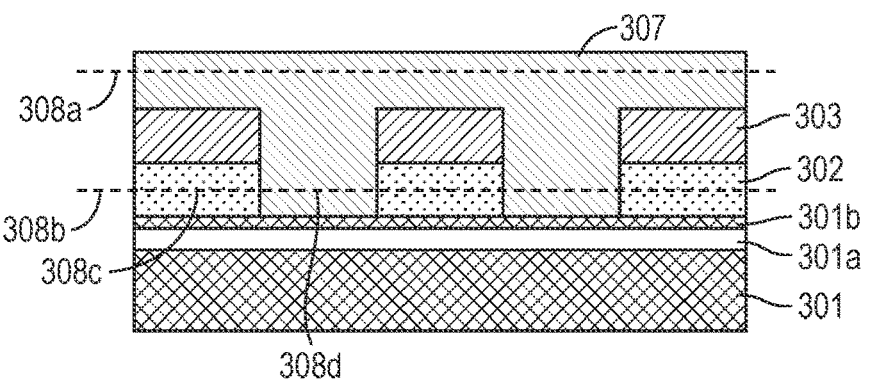

FIG. 3A shows substrate 301, oxide layer 301a, silicon layer 301b, seed layer 302, and mask layer 303. FIG. 3B shows cavity 304 after etching down to silicon layer 301b, which forms seed regions and seed surfaces from seed layer 302. FIG. 3C shows lateral growth of InGaN 305 on the seed surfaces of seed regions from seed layer 302 within the cavities 304. This InGaN growth has a sufficiently high molar fraction of InN to induce strain relaxation. In FIG. 3D, InGaN growth 306 from the seed layer 302 has grown out and the InGaN growth fronts coalesced to fill the cavity and to extend over a portion of mask layer 303. As shown in FIG. 3E, continued InGaN growth provides a planar relaxed InGaN layer 307. FIG. 3E shows a plane 308a through the relaxed InGaN region and co-planar with surface relaxed (0001) InGaN surface 307, and a plane 308b bisecting the seed regions 302, and the InGaN regions between seed regions 302. A center of a seed region is indicated as 308c and a center of an InGaN regions between the seed regions 302 is indicated as 308d.

FIGS. 4A-4E show another example of a process flow for fabricating a relaxed InGaN layer using a SOI substrate. This example is similar to that of FIGS. 3A-3E, with the addition that the top silicon layer of the SOI substrate 401b and buried oxide layer 401a are removed by etching (in regions 404) to minimize competing growth of InGaN on the silicon substrate and to favor InGaN growth on the seed surfaces.

Figure 4A:
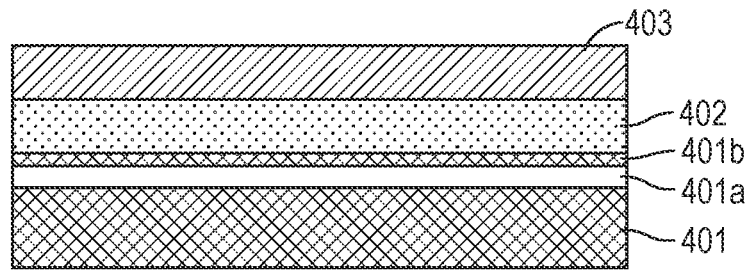
FIGS. 4A-4E show an example of a process flow for fabricating an InGaN layer having a relaxed InGaN region provided by the present disclosure.
Figure 4B:
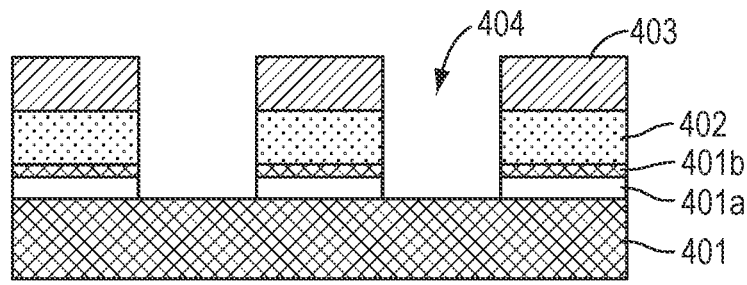
Figure 4C:
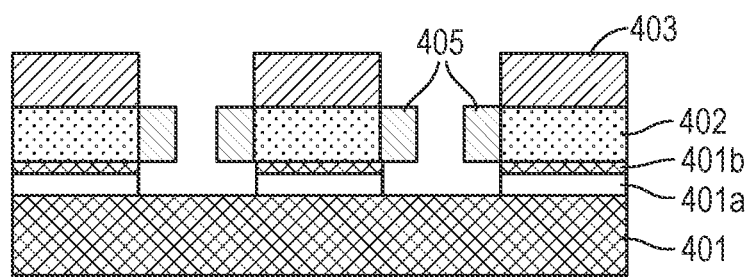
Figure 4D:
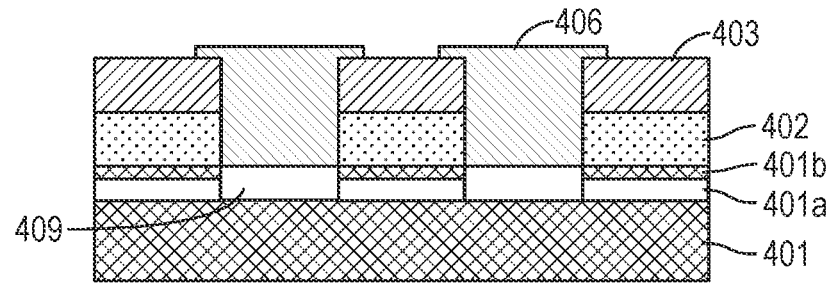
Figure 4E:
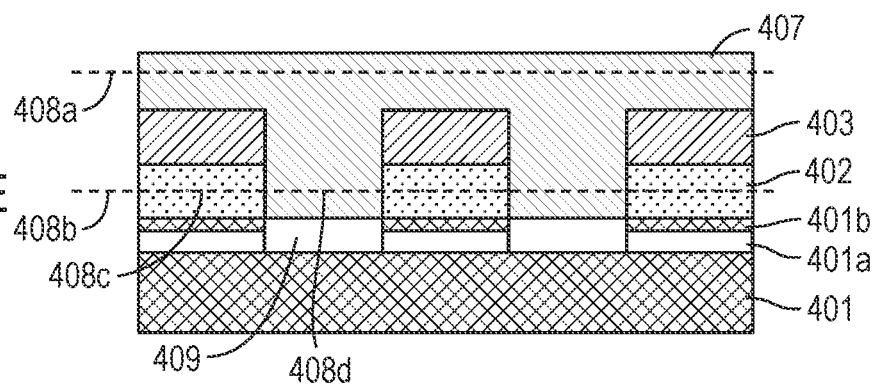

FIG. 4A shows silicon-on-insulator (SOI) substrate 401, oxide layer 401a, silicon layer 401b, seed layer 402, and overlying mask layer 403. FIG. 4B shows cavity 404 resulting from etching down to substrate 401 which forms seed regions from seed layer 402. In FIG. 4C, lateral InGaN growth 405 extends from edge surfaces of seed layer 402 into the cavity 404. This InGaN growth has a sufficiently high molar fraction of InN to induce strain relaxation. As shown in FIG. 4D, continued InGaN growth 406 causes InGaN grown from opposite seed surfaces to coalesce and then grow vertically to fill the upper portion of the cavity and to extend over the mask layer 403. Preferential growth from the seed surfaces compared to growth on the substrate creates a space 409, that is, a void, between the substrate 401 and InGaN layer 406. As shown in FIG. 4E, continued InGaN growth provides a planar relaxed (0001) InGaN surface 407. FIG. 4E shows a plane 408a through the relaxed InGaN region and co-planar with surface 407, and a plane 408b bisecting the seed regions 402, and the InGaN regions between seed regions 402. A center of a seed region is indicated as 408c and a center of an InGaN regions between the seed regions 402 is indicated by 408d.

Figure 5:
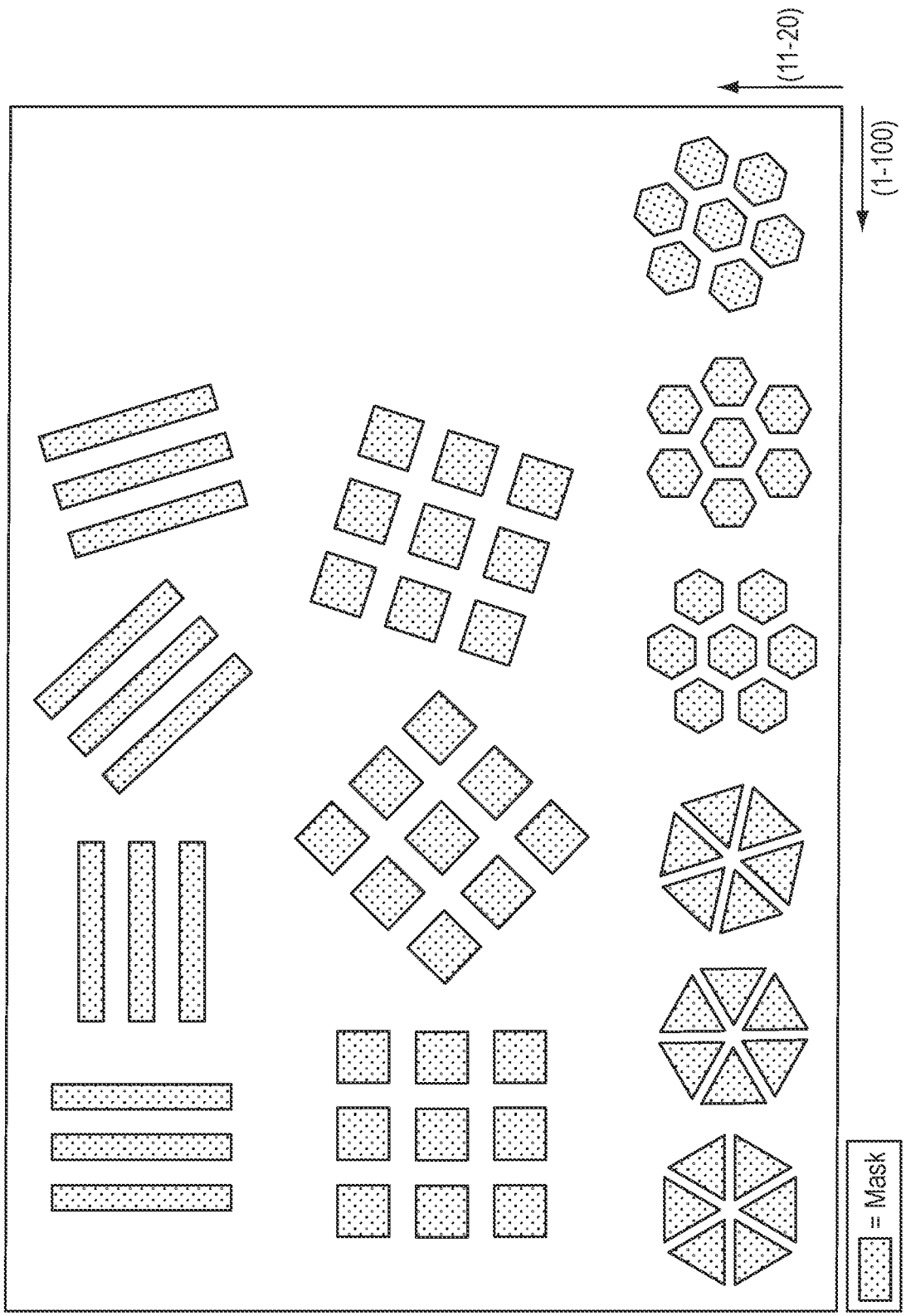
FIG. 5 shows an example of a positive etch mask having various shapes, dimensions, and orientations with respect to the (1-100) and (11-20) crystallographic directions of a III-nitride Wurtzite material.

FIG. 5 shows examples mask patterns for etching the seed material, including stripes, rectangles, triangles, and hexagons. For Wurtzite material such as III-nitride materials, including InGaN, preferred pattern features are ones with edges that share an equivalent crystallographic orientation, such as hexagonal or triangular. Other shapes and other relative dimensions can be used. The smallest dimensions of the mask patterns can be, for example, less than 3 μm, less than 0.3 μm, or less than 0.03 μm. The edges of the mask patterns can be aligned to certain crystal planes. For example, for Wurtzite materials with a (0001) primary growth plane, the mask edges can be aligned to (1-100) or (11-20) planes, or any orientation in between to facilitate growing a high quality, relaxed InGaN layer.

Figure 6:
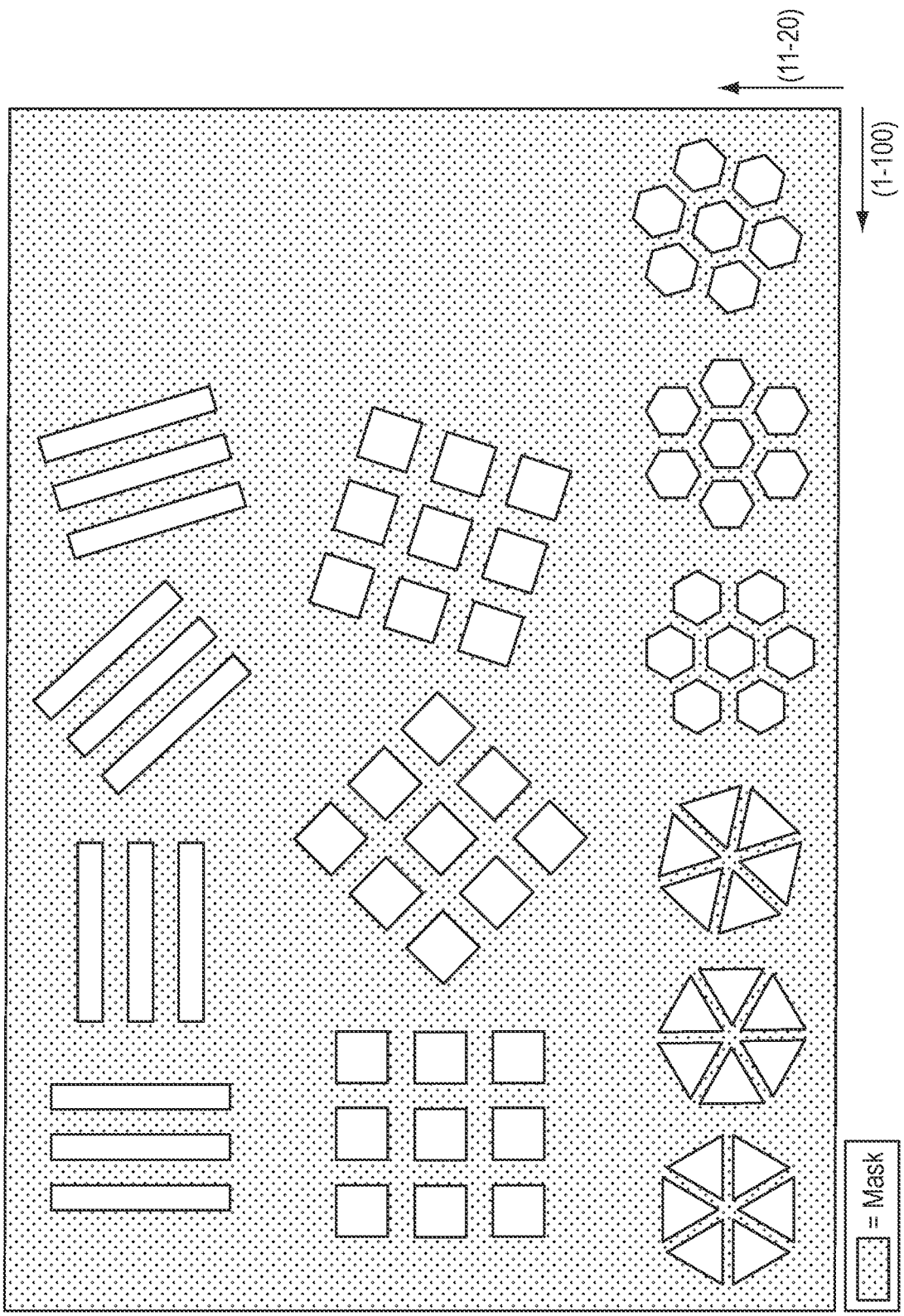
FIG. 6 shows an example of a negative etch mask having various shapes, dimensions, and orientations with respect to the (1-100) and (11-20) crystallographic directions of a III-nitride Wurtzite material of GaN or $In_xAl_yGa_{1-x-y}N$.

FIG. 6 shows an alternative set of mask patterns, which are the negative of those shown in FIG. 5, but similar in other respects.

Figure 7:
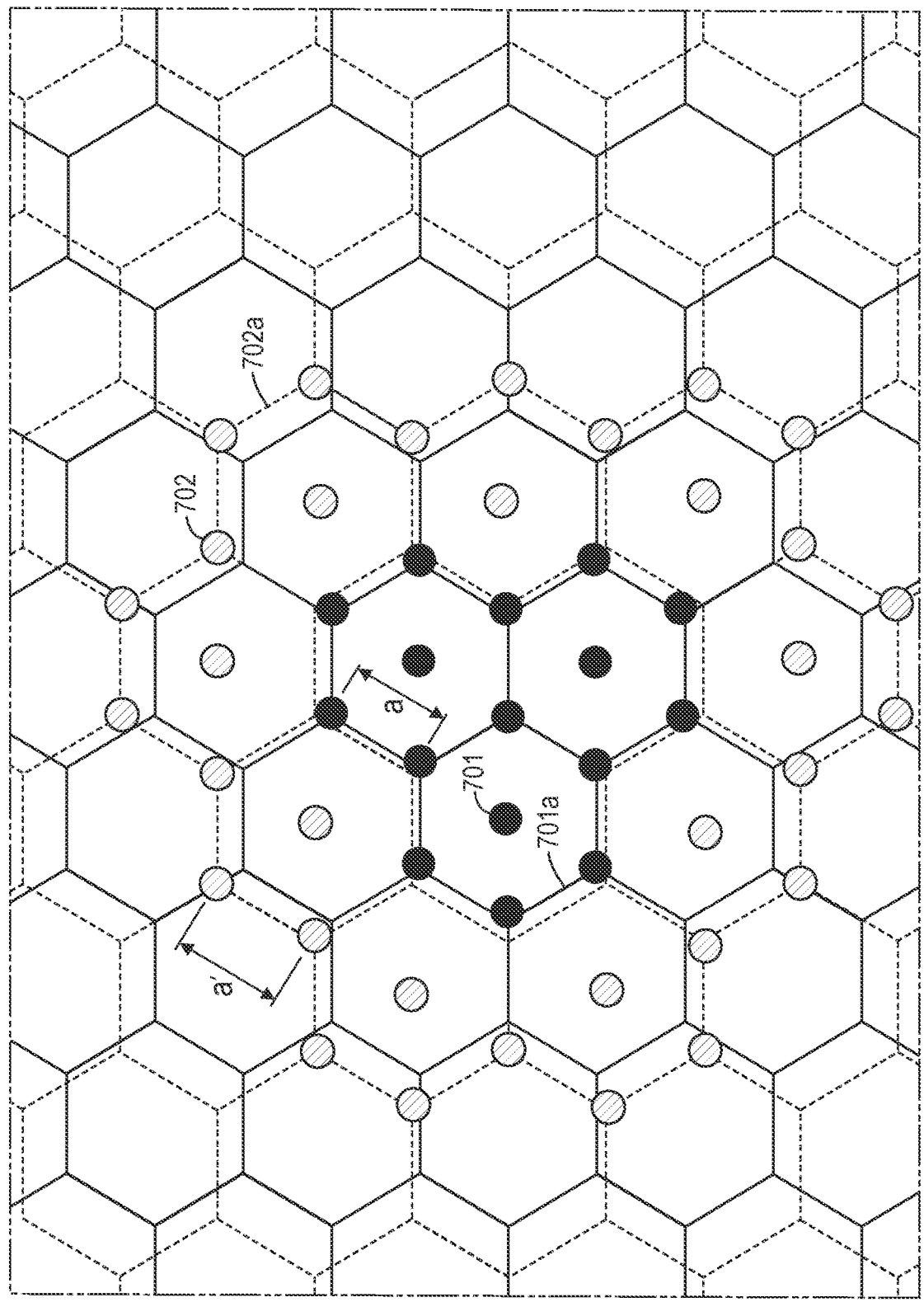
FIG. 7 shows a transition of an InGaN lattice characterized by a lattice parameter "a" similar to that of GaN (solid circles) to a larger, relaxed InGaN lattice characterized by a lattice parameter "a'" (hashed circles).

FIG. 7 shows a conceptual plan-view cross-section of a patterned GaN seed material with lattice parameter a, with side surfaces upon which lateral heteroepitaxy is performed for the growth of an InGaN layer which is allowed to relax via twist to the relaxed lattice parameter a. FIG. 7 shows a transition of an InGaN lattice 701/701*a* characterized by a lattice parameter "a" similar to that of GaN (solid circles) to a larger, relaxed InGaN lattice 702/702*a* characterized by a lattice parameter "a'" (hashed circles). For sufficiently small dimensions, deformation is completely elastic, and no defects are formed. For larger dimensions, some plastic deformation may occur but may be tolerable provided the final defect-density in subsequently deposited, overlying semiconductor layers is sufficiently low. For example, it is desirable that the extended defect densities in the subsequently deposited semiconductor layers be less than 5E9 $cm^2$, such as less than 5E8 $cm^2$, or less than 5E7 $cm^2$, or less than 5E7 $cm^2$, or less than 5E6 $cm^2$, or less than 5E5 $cm^2$. The lateral InGaN growth and coalescence methods provided by the present disclosure can facilitate the annihilation of threading dislocation in III-nitride materials.

Further control over thickness and compositional uniformity of the relaxed InGaN growth may be provided by growing multilayer structures, rather than by using bulk InGaN layers. For example, a 25% bulk InGaN layer may be replaced, for example, by alternating layers of 3 nm-thick GaN and 1 nm-thick InN, or 2 nm-thick GaN and 2 nm-thick $In_{0.5}Ga_{0.5}N$. Layer thicknesses for the individual layers can range, for example, from 0.5 nm to 100 nm, such as from 1 nm to 30 nm. Multilayer structures are not limited to the base layer and/or buffer layers but may be used throughout the epitaxial stack including the semiconductor device layers such as n-type InGaN, p-type InGaN, and active layers overlying the relaxed InGaN layer, or in layers between the relaxed InGaN layer and overlying device layers. Such multilayer structures are sometimes referred to as superlattice layers. The multi-layer structure is not limited to GaN and InGaN but can comprise other alloys available to the III-nitride system. For example, layers may include InAlGaN, InGaN, AlGaN, and InAlN, and other chosen compositions. Layer-pairs might include, in addition to InGaN/GaN, InGaN/AlGaN, InGaN/InAlGaN, InAlGaN/InAlGaN, InGaN/InAlN, and InAlN/GaN, among others.

Graded composition growth can also be used to transition from the seed region to the relaxed InGaN material. For example, the InN mole fraction in the layer grown on the GaN seed region may be slowly increased from ~0% to a target InN mole fraction to distribute stress and relaxation mechanism (e.g., defects) in a uniform manner outside the seed region. In another example, a higher InN mole fraction may be used adjacent the GaN seed region, to quickly induce strain relaxation, followed by a grading down of the InN mole fraction as necessary to achieve optimum growth conditions for the overlying relaxed InGaN layer(s).

The increased in-plane lattice parameter of the relaxed InGaN layer compared to that of InGaN/GaN allows for growth of subsequently deposited semiconductor layers at much higher temperatures than used for InGaN/GaN. For example, InGaN with an in-plane a-lattice parameter of 3.205 Å has been shown to incorporate about 7% InN, compared to about 4% for InGaN/GaN. Because InN mole fraction incorporation into GaN is inversely proportional to growth temperature using MOCVD, this suggests that an InGaN in-plane a-lattice parameter increase of about 0.015 Å to 0.020 Å can increase the useful growth temperature by about 50° C. Further increases in InGaN in-plane a-lattice parameter will allow even higher temperatures to be used for the same InN mole fraction. This effect can be exploited not only in the realization of higher quality semiconductor layers grown on relaxed InGaN achieved by reduced point-defect formation at higher temperatures, but also by the reduction or elimination of pits that occur at the location of threading dislocations in the surfaces of InGaN films. Ideally, the growth temperature of the InGaN layers is kept sufficiently high to eliminate or at least restrict the pits to diameters much less than 1 μm, such as less than 200 nm, or less than 50 nm. Small pits can be "filled" using thin, high-temperature GaN or AlGaN layers grown over the pitted InGaN films.

Methods provided by the present disclosure can include recursion, which may be helpful in obtaining large lattice parameter changes. For example, a relaxed InGaN layer may be used as a seed layer to provide seed surfaces for growth of higher-InN mole fraction relaxed InGaN layers. The resulting, new relaxed InGaN layer, can then be used as a seed layer in another step of the process, and so on. This approach may be helpful in obtaining relaxed InGaN layers with very high InN mole fractions, which may be suitable as base layers for the growth of active semiconductive layers configured to emit radiation at long wavelengths, such as beyond red, to deep red, and even infra-red wavelengths such as, for example, at wavelengths within a sub-range from 700 nm to 1.6 μm. Similarly, such an approach may be used to form photo-sensitive materials optimized for solar photo-voltaic applications.

A relaxed InGaN layer provided by the present disclosure can serve as a template for and/or supporting structure for growing optical and/or electrical devices. Very large area wafers are possible, including 150 mm, 200 mm, or larger diameter wafers, which facilitates high-volume, low-cost manufacturing of these devices.

Figure 8:
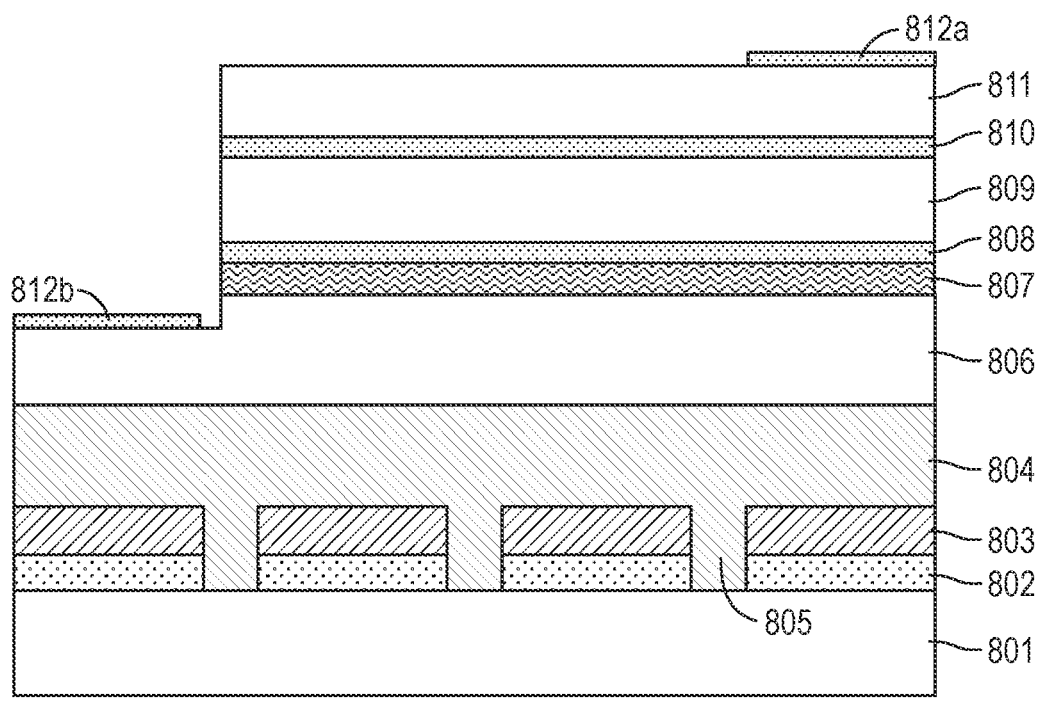
FIG. 8 shows an example of an LED incorporating a III-nitride semiconductor structure provided by the present disclosure.

As an example, FIG. 8, shows an LED structure formed by growing an n-type layer 806 (doped with Si or Ge, for example) above the relaxed (0001) InGaN surface of InGaN layer 804, followed by an InGaN-containing active region 807, an optional p-type electron blocking layer 808 comprising, for example, GaN, AlGaN, or InGaN (or multi-layers comprising these alloys), and then an overlying p-type layer 809 such as a p-type GaN or InGaN layer. A highly doped, e.g., Mg-doped, p-type contact layer 810 comprising, for example, GaN or InGaN overlies p-type layer 809 and provides for an Ohmic contact to the device on the p-side. As shown in FIG. 8 the semiconductor structure underlying the InGaN layer 804 includes substrate 801, GaN seed regions 802, and mask regions 803. To the extent there is refractive index contrast between these various features, the presence of refractive index contrast can help improve light extraction from the device. In related embodiments voids are formed underlying regions 805, and further light extraction benefits may be realized. The resulting semiconductor wafer can undergo a series of process steps such as lithography, etching, and semiconductor deposition to form isolated LED areas with suitable electrical contact materials to the n- and p-type layers. Such contact materials can include those with suitable optical characteristics such as high optical reflectively and/or transparency. Electrode metallizations 812*a* (e.g., NiAg, NiAu, TiAlCrNiAu, etc.) and 812*b* (e.g., TiAl, TiAlCrNiAu, etc.) can be deposited and patterned to provide electrical connection, for example, using wire bonds. Various transparent conducting oxide (TCO) materials such as indium-tin-oxide (ITO) can be used to fabricate a current spreading layer 811, especially for resistive p-type layers. After fabrication of the semiconductor structure, the wafers can be diced to provide individual optoelectronic elements and devices capable of being mounted into suitable optoelectronic packages by various means, including epoxy die-attach, gold-gold bonding, or soldering, among others. Electrical contact can be made to the p- and n-type layers, for example, using wire bonds, to form a functioning optoelectronic element or device, to which electrical power can be eventually supplied. The devices can further include luminescent down-conversion materials, and/or encapsulation materials such as silicone, to provide desirable optical output characteristics, including white light for illumination applications. The devices can be employed in a system for illumination and/or in a display application.

The blocking layer 808 may be placed directly above the active region 807, or it may be spaced from the active region by a spacer layer (not shown in FIG. 8). Typically, the spacer layer is nominally undoped and may be a layer during which the Cp2Mg source is turned on during MOCVD growth in anticipation of p-type doping of the blocking layer or layers above the blocking layer.

As shown in FIGS. 9A-9D, various flip-chip (FC) LED architectures are possible, including (a) standard, (b) thin-film flip-chip (TFFC) where the initial growth substrate has been removed but the mask and seed layer portions retained, (c) TFFC with mask and seed layer portions removed, and (d) TFFC with mask and seed layer portions removed and the exposed InGaN layer textured (for light extraction purposes), such as by photolithographic and/or chemical-based etching techniques.

Figure 9A:
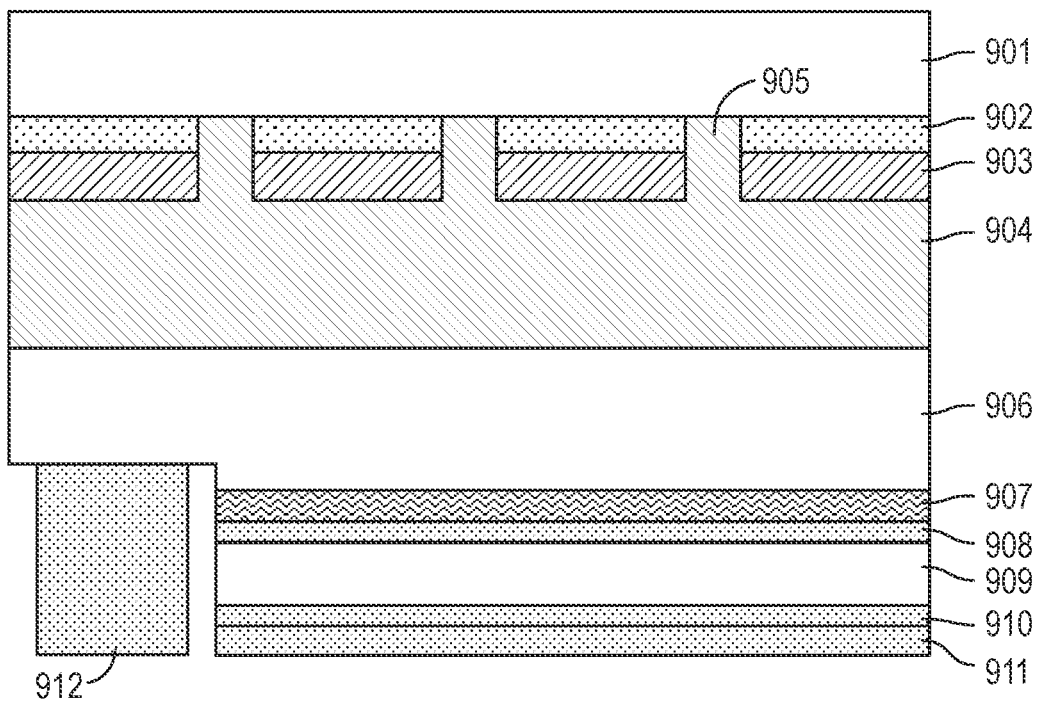
FIGS. 9A-9D show examples of LEDs incorporating a III-nitride semiconductor structure provided by the present disclosure.
Figure 9B:
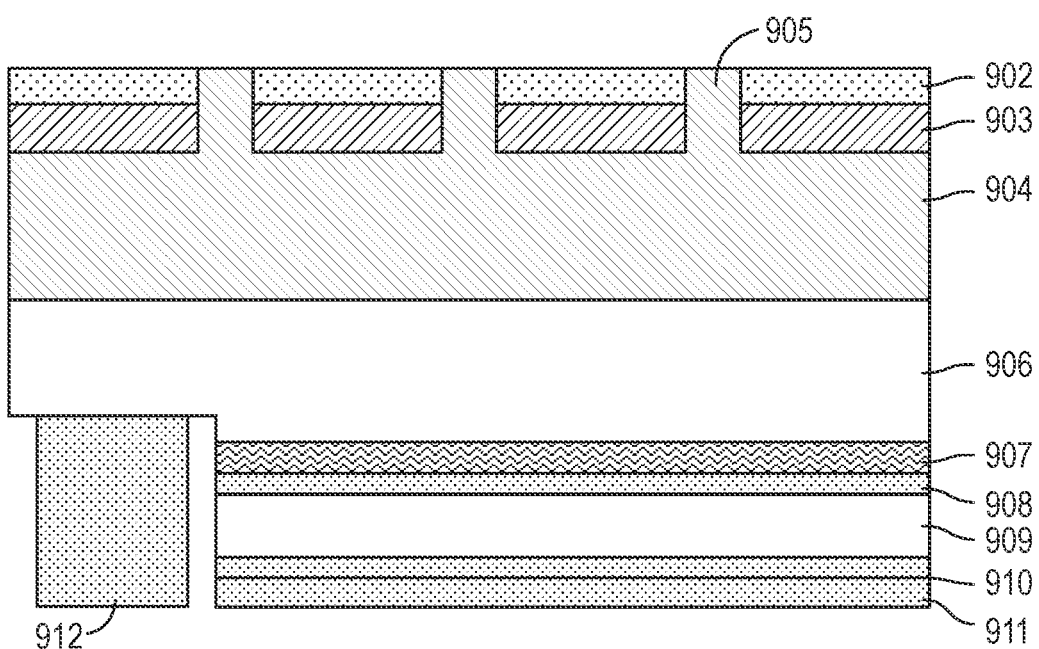
Figure 9C:
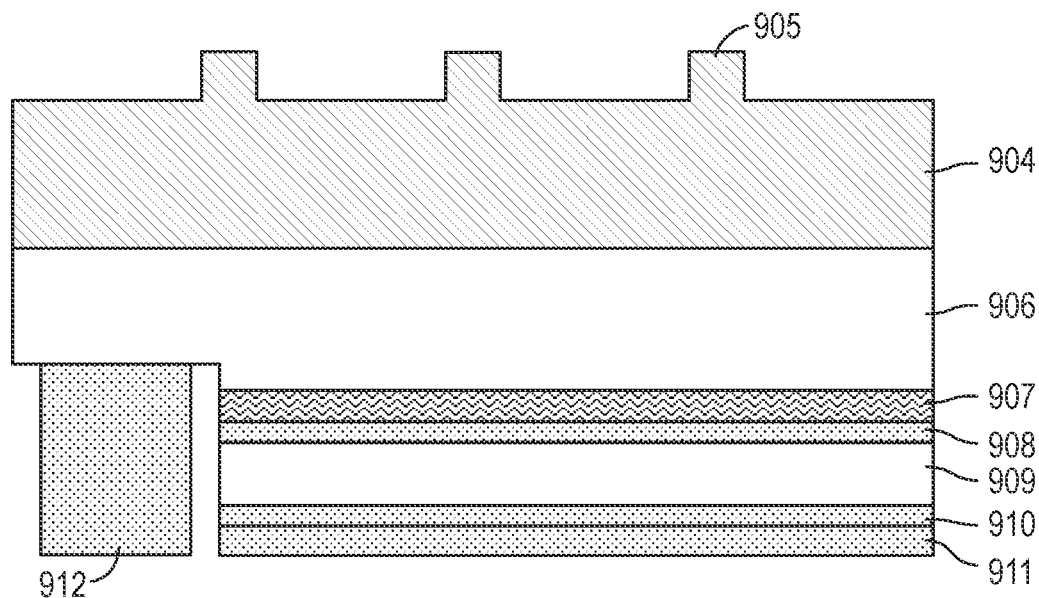
Figure 9D:
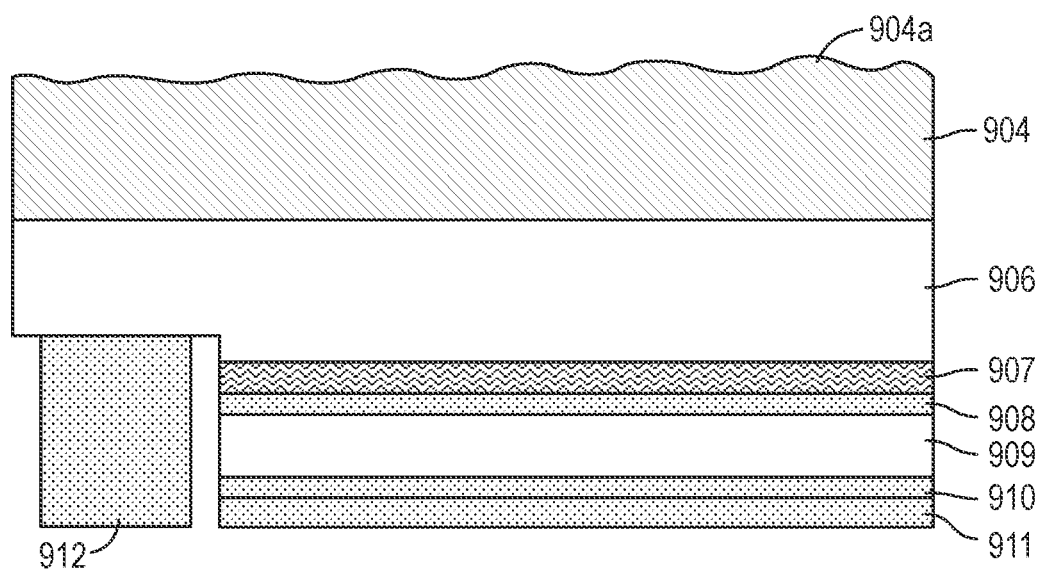

The semiconductor structures shown in FIGS. 9A-9D include substrate 901, seed region 902, mask regions 903, relaxed InGaN layer 904 and initial InGaN growth region 905, n-type layer 906, InGaN-containing active region 907, optional p-type electron blocking layer structure 908, p-type layer 909, p-type contact layer 910, p-side electrode metallization 911, and n-side electrode metallization 912. In FIG. 9B, the substrate has been removed, in FIG. 9C the growth regions and mask regions have been removed, and in FIG. 9D a portion of the relaxed InGaN region 904 has been removed and/or roughened 904a to enhance, for example, certain optical characteristics of the device.

Figure 10:
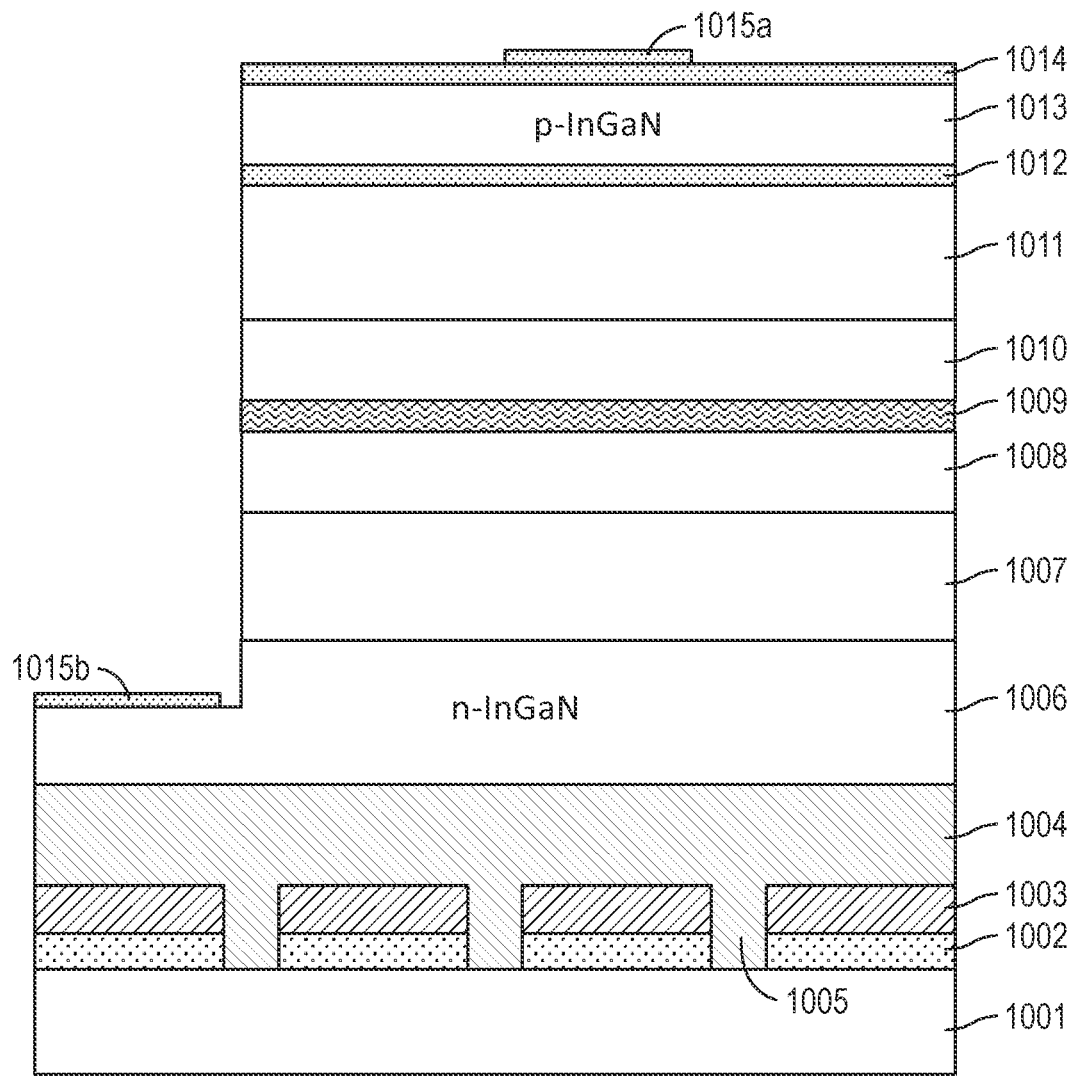
FIG. 10 shows an example of a laser diode (LD) incorporating a III-nitride semiconductor structure provided by the present disclosure.

FIG. 10 shows a laser diode structure grown over a relaxed InGaN layer. As shown in FIG. 10, relaxed InGaN layer 1004 including initial InGaN regions 1005 overlies mask regions 1003, seed regions 1002, and substrate 1001. The laser diode can be formed by growing an n-type optical confining ("cladding") layer 1007 over the relaxed InGaN material 1004 and an n-type InGaN contact layer 1006, and then growing an InGaN-based active region 1009 including a waveguide region comprising waveguide layers 1008 and 1010 on either side of an InGaN-containing active layer 1009, and subsequently growing a p-type optical confining ("cladding") layer 1011. Layer 1012 and layer 1013 overlie p-cladding layer(s) 1011 and may include a p-type AlGaN "electron blocker layer" and a p-type GaN layer, respectively. Wafer fabrication for laser diodes is similar to that for LEDs except that the devices are formed into stripes to form laser cavities. After dicing or other singulation techniques and the formation of etched or cleaved mirror facets, high-reflection and anti-reflection dielectric coatings can be deposited on the back and front facets, respectively (not shown). The laser diodes can be mounted, either epi-side down or substrate-side down, depending on material choices and application details, into suitable optoelectronic packages. Electrical contact can be made to highly doped p-type contact layer 1014 and n-type contact layer 1006 via electrode metallizations 1015a and 1015b, respectively, to form a functioning optoelectronic element or device, to which electrical power can be supplied. The laser diodes be employed in a system for illumination and/or in a display application.

Figure 11:
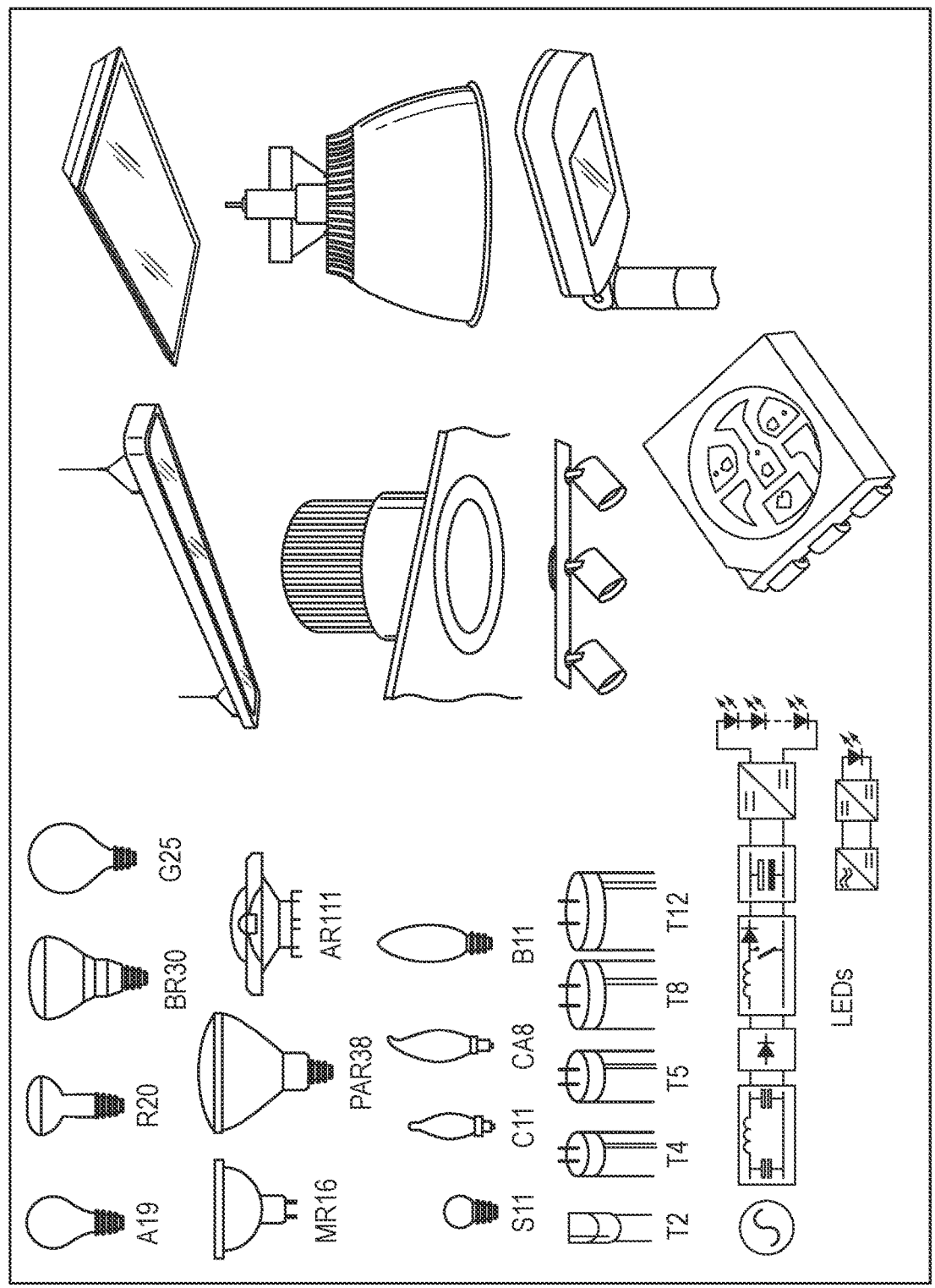
FIG. 11 shows examples of lighting devices and systems in which LEDs provided by the present disclosure can be incorporated.
Figure 12:
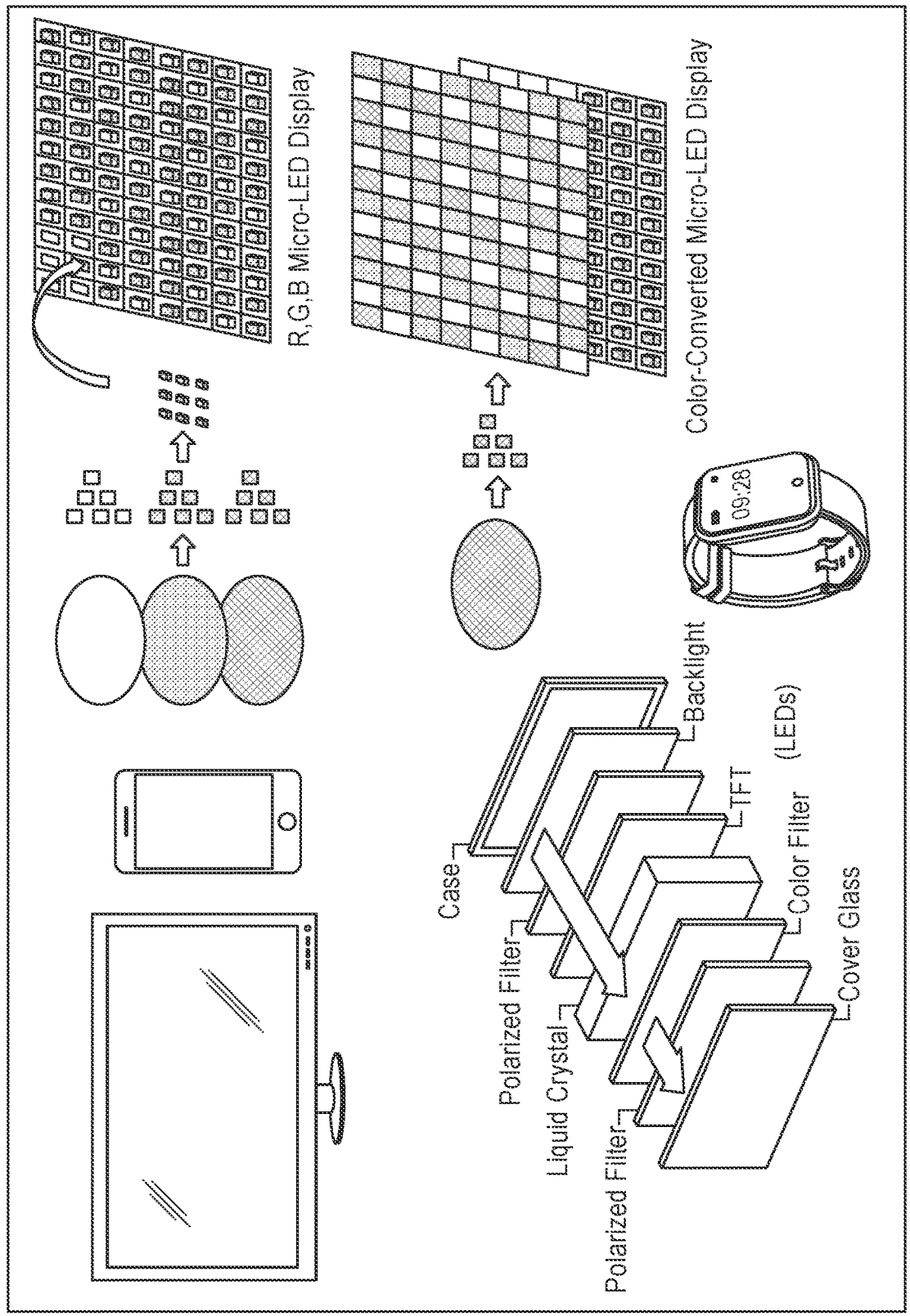
FIG. 12 shows examples of display devices and systems in which LEDs provided by the present disclosure can be incorporated.

Relaxed InGaN layers provided by the present disclosure are applicable to a wide range of compound semiconductor devices which impact the performance of a wide range of system solutions for various applications, including lighting devices and systems (FIG. 11) and display devices and systems (FIG. 12). The approach may also be applied to solar photo-voltaic applications.

Target compositions for a relaxed InGaN layer can be selected according to intended device, application, and performance requirements. For conventional InGaN light-emitting diodes lattice-matched to GaN, the best performing devices are those emitting in the violet wavelength range. At these wavelengths, the strain state of InGaN quantum wells with respect to the GaN base layers is from about 1% to 2% compressive. The corresponding compositional differences are sufficiently high such that bandgap engineering can provide very high quantum efficiency devices, while the strain state is sufficiently low to allow for relatively thick InGaN quantum well (QW) layers which serve to reduce carrier density and mitigate non-radiative Auger recombination (aka "droop"). Applying this acceptable range of strain states to other emission wavelengths, preferred compositional ranges for relaxed InGaN base layers provided by the present disclosure can be calculated for a wide range of emitters, from blue (about 450 nm) to the infra-red (about 1.3 μm) wavelengths. The preferred ranges are listed in Tables 1 and 2.

TABLE 1

Preferred ranges of InN mole fraction of relaxed (0001) InGaN base layers for light-emitting diodes and laser diodes according to emission color

| Parameter | Violet | Blue | | Green | | Amber | | Red | |
|---|---|---|---|---|---|---|---|---|---|
| base InN mol % | 0% | 2% | 7% | 13% | 18% | 20% | 26% | 26% | 30% |
| a_base | 3.189 | 3.196 | 3.214 | 3.235 | 3.253 | 3.260 | 3.282 | 3.282 | 3.296 |
| PWL | 405 | 440 | | 520 | | 580 | | 620 | |
| Eg | 3.06 | 2.82 | | 2.38 | | 2.14 | | 2.00 | |
| a_QW | 3.22104 | 3.24596 | | 3.28868 | | 3.31716 | | 3.3314 | |
| QW InN mol % | 9% | 16% | | 28% | | 36% | | 40% | |
| strain % | 1.00% | 1.56% | 1.00% | 1.65% | 1.09% | 1.75% | 1.08% | 1.52% | 1.08% |
| PWL | 420 | 460 | | 540 | | 600 | | 640 | |

TABLE 1-continued

Preferred ranges of InN mole fraction of relaxed (0001) InGaN base layers for light-emitting diodes and laser diodes according to emission color

| Parameter | Violet | Blue | Green | Amber | Red |
|---|---|---|---|---|---|
| Eg | 2.95 | 2.70 | 2.30 | 2.07 | 1.94 |
| a_QW | 3.23172 | 3.25664 | 3.29936 | 3.32428 | 3.34208 |
| QW InN mol % | 12% | 19% | 31% | 38% | 43% |
| strain % | 1.34% 1.89% | 1.33% 1.98% | 1.42% 1.97% | 1.30% 1.84% | 1.40% |

(PWL = peak wavelength in nm, Eg = bandgap in eV, a_base = base layer in-plane a-lattice parameter at 300K in Å, a_QW = quantum well layer in-plane a-lattice parameter at 300K in Å).

TABLE 2

Preferred ranges of InN mole fraction of relaxed InGaN (0001) base layers for light-emitting diodes and laser diodes according to emission wavelength

| Parameter | 700 nm | | 850 nm | | 980 nm | | 1300 nm | |
|---|---|---|---|---|---|---|---|---|
| base InN mol % | 32% | 38% | 44% | 50% | 52% | 57% | 69% | 75% |
| a_base | 3.303 | 3.324 | 3.346 | 3.367 | 3.374 | 3.392 | 3.435 | 3.456 |
| PWL | 690 | | 840 | | 940 | | 1300 | |
| Eg | 1.80 | | 1.48 | | 1.32 | | 0.95 | |
| a_QW | 3.35988 | | 3.4026 | | 3.42752 | | 3.49516 | |
| QW InN mol % | 48% | | 60% | | 67% | | 86% | |
| strain % | 1.72% | 1.07% | 1.70% | 1.06% | 1.58% | 1.05% | 1.76% | 1.13% |
| PWL | 710 | | 870 | | 980 | | 1350 | |
| Eg | 1.75 | | 1.43 | | 1.27 | | 0.92 | |
| a_QW | 3.367 | | 3.40972 | | 3.4382 | | 3.50228 | |
| QW InN mol % | 50% | | 62% | | 70% | | 88% | |
| strain % | 1.94% | 1.29% | 1.92% | 1.27% | 1.90% | 1.36% | 1.97% | 1.34% |

(PWL = peak wavelength in nm, Eg = bandgap in eV, a_base = base layer in-plane a-lattice parameter at 300K in Å, a_QW = quantum well layer in-plane a-lattice parameter at 300K in Å).

Figure 14A:
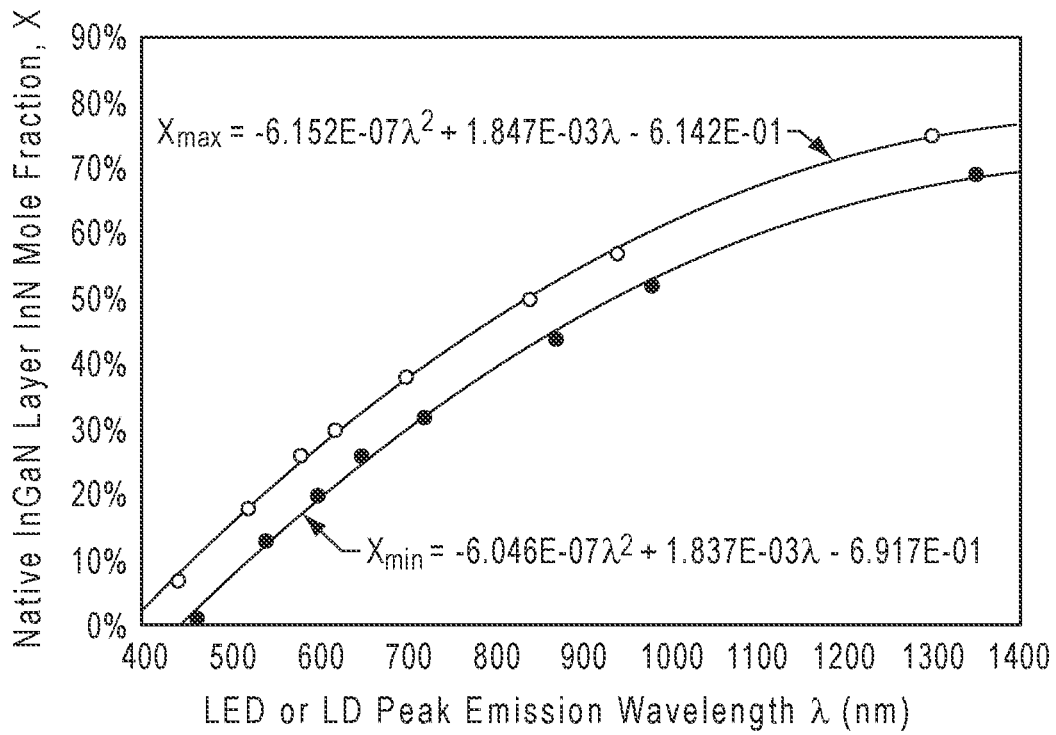
FIGS. 14A-14B show ranges of InN molar fractions and a-lattice parameters, respectively, for relaxed (0001) InGaN regions according to peak emission wavelength.
Figure 14B:
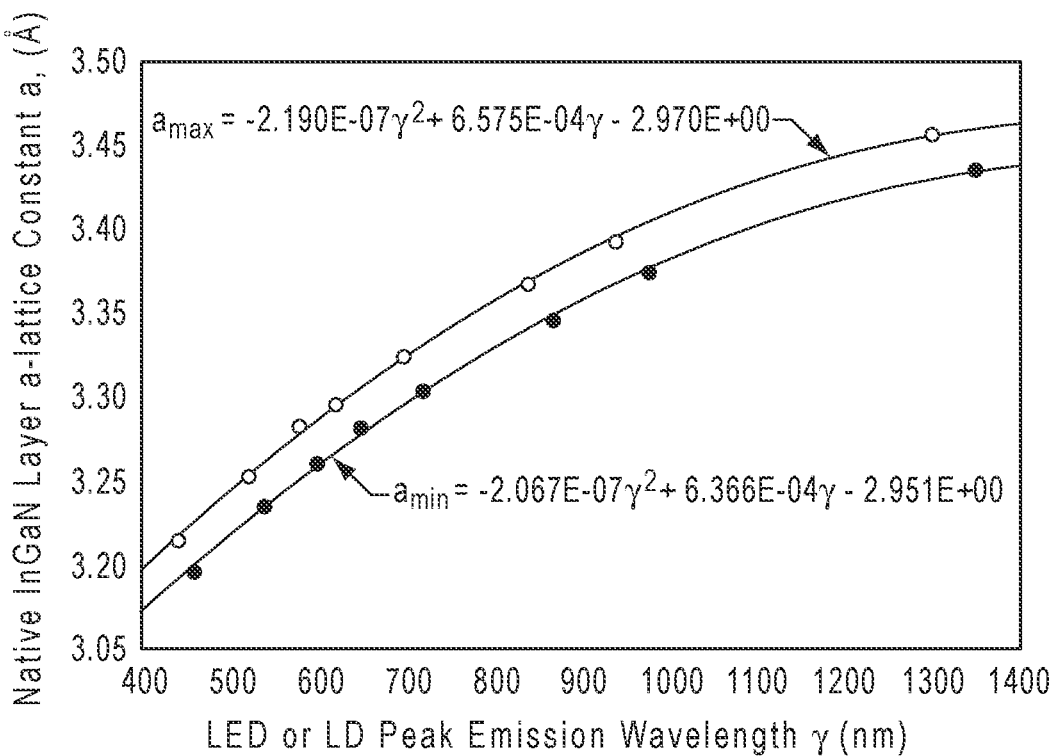

FIGS. 14A and 14B graphically illustrate the preferred ranges of InN molar fractions, and a-lattice parameters, for relaxed (0001) InGaN layers for use as templates for fabricating light emitting diodes and laser diodes, according to peak emission wavelength, consistent with the parameters presented in Tables 1 and 2. Curve fits of these data suggest, as a function of peak emission wavelength, $\lambda$, the InN molar fraction, x, for a relaxed $In_xGa_{1-x}N$ base layer should satisfy the condition $x_{min} \leq x \leq x_{max}$, where $X_{min}$ and $X_{max}$ are defined by EQN. 1 and EQN. 2, respectively:

$$x_{min} = -6.046E{-}07\lambda^2 + 1.837E{-}03\lambda - 6.917E{-}01, \quad \text{EQN. 1}$$

$$(\lambda \geq 440 \text{ nm})$$

$$x_{max} = -6.152E{-}07\lambda^2 + 1.847E{-}03\lambda - 6.142E{-}01, \quad \text{EQN. 2}$$

$$(\lambda \geq 440 \text{ nm})$$

Similarly, as a function of peak emission wavelength, $\lambda$, the in-plane lattice parameter, a, for a relaxed $In_xGa_{1-x}N$ base layer should satisfy the condition $a_{min} \leq a \leq a_{max}$, where $a_{min}$ and $a_{max}$ are defined by EQN. 3 and EQN. 4, respectively:

$$a_{min} = -2.067E{-}07\lambda^2 + 6.366E{-}04\lambda - 2.951, (\lambda \geq 440 \text{ nm}) \quad \text{EQN. 3}$$

$$a_{max} = -2.190E{-}07\lambda^2 + 6.575E{-}04\lambda - 2.970, (\lambda \geq 440 \text{ nm}) \quad \text{EQN. 4}$$

Methods and semiconductor structures provided by the present disclosure can be adapted to fabricate vertical cavity surface emitting layers (VCSELs). The compositional choices for relaxed InGaN base layers for LDs or VCSELs are similar to those for LEDs and are shown in Tables 1 and 2.

Figure 15A:
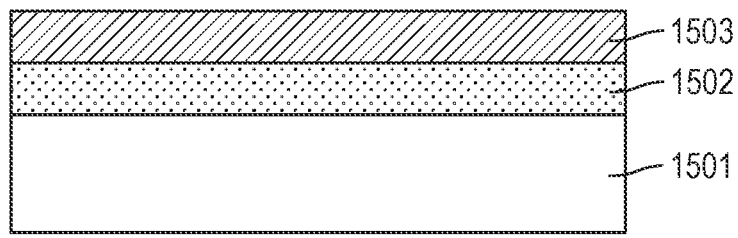
FIGS. 15A-15F show an example of a process flow for fabricating a relaxed $In_xAl_yGa_{1-x-y}N$ layer having a relaxed (0001) $In_xAl_yGa_{1-x-y}N$ region provided by the present disclosure.
Figure 15B:
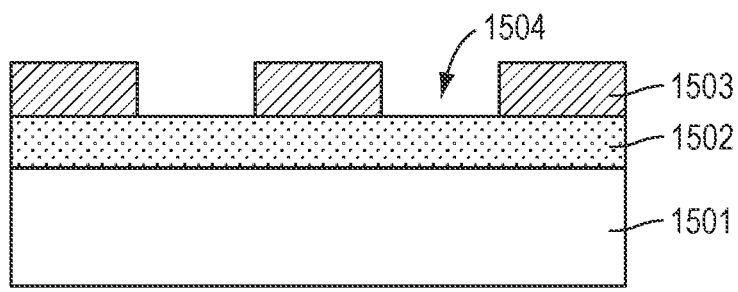
Figure 15C:
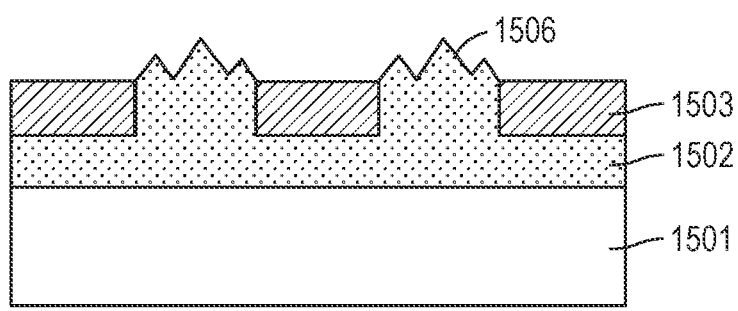
Figure 15D:
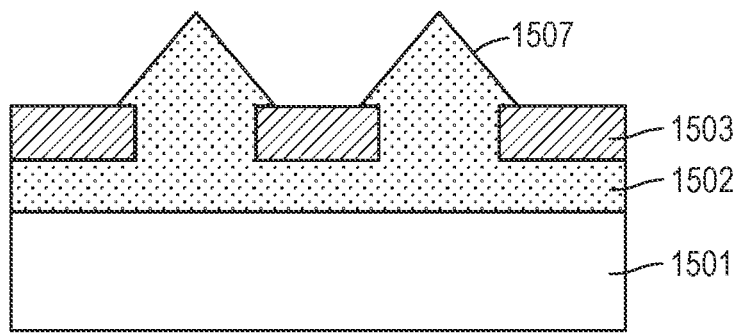
Figure 15E:
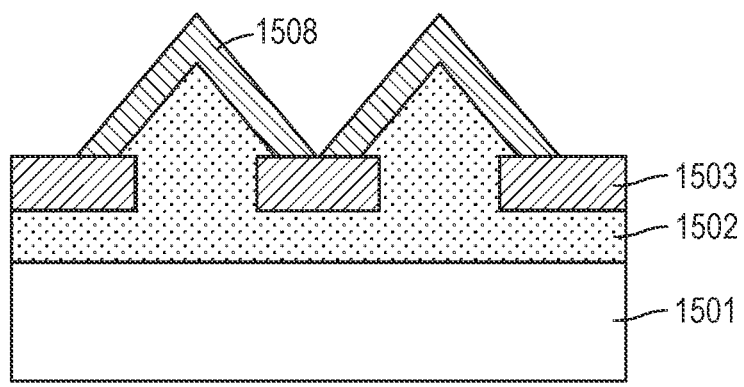
Figure 15F:
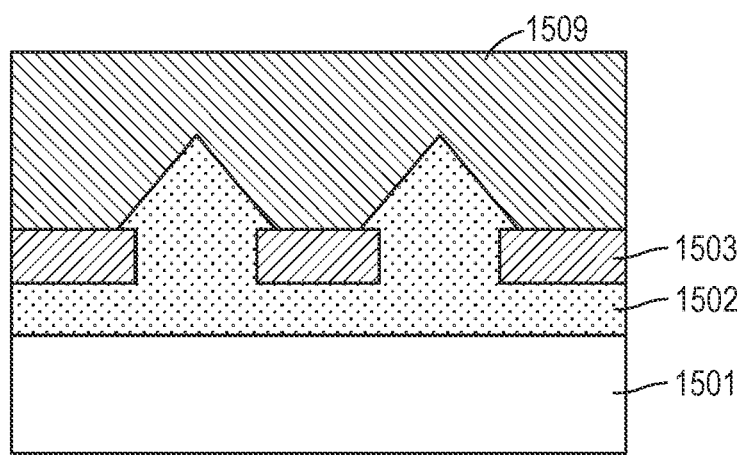

FIGS. 15A-15F show examples of steps in a method for fabricating relaxed InGaN layers on faceted GaN seed region edge surfaces. In this method, a (0001) GaN or AlN seed layer 1502 on a substrate 1501 is provided. FIG. 15A shows substrate 1501, overlying seed layer 1502, and overlying mask layer 1503. The GaN seed layer can be, for example, less than 3 μm thick, less than 0.3 μm thick, or less than 0.03 μm thick. Referring to the process flow illustrated in FIGS. 15A-15F, the seed layer 1502 can be overcoated with a masking layer 1503 comprising a material that rejects or is slow to promote GaN nucleation. The masking layer 1503 can be patterned and etched using any suitable photolithography including nanolithography and etching methods (wet, or dry, or a combination thereof) into various patterns as described herein. The exposed GaN in the openings in the mask 1504 created by etching can then be used to nucleate a GaN seed material 1506, which as shown in FIGS. 15C and 15D can be grown out from the openings in the mask and by proper selection of growth conditions, allowed to form seed regions with edges that are, for example, triangular facets with hexagonal bases. For example, the structures may be six sided with a hexagonal base and have triangular facets that are {1-101} equivalent planes. After the facets are fully formed as shown in FIG. 15D, the triangular facet surfaces 1507 can be used as seed surfaces for at least lateral growth of InGaN, forming heterojunctions that are not co-planar with the substrate surface. The small dimensions of the GaN seed surfaces (facets) and choice of InGaN target composition promote relaxation of the overgrown InGaN as the InGaN thickness increases, while providing a flat, crystallographically equivalent orientations to ensure coherency. The InGaN 1508 grows coherently and relaxes toward its relaxed lattice parameter to form hexagonal structures with triangular facets that are relaxed InGaN as shown in FIG. 15E. These InGaN facets can be further grown out and can eventually coalesce with neighboring InGaN growth fronts of other planar seed facets. As shown in FIG. 15F, the coalesced InGaN then grows above the masking layer and seed regions, and growth conditions (e.g., growth temperature and TMI flow) are selected to form a continuous, planar, relaxed InGaN layer or template 1509 having a relaxed (0001) InGaN surface as an upper region of the structure. This method has the advantage that no etching of GaN (or InGaN, AlGaN or AlN) seed material is required to provide seed surface portions for the nucleation of InGaN. Furthermore, this method is very suitable when the growth substrate is a III-nitride material, such as a GaN or AlN substrate. As such, this method facilitates the fabrication of LD devices, where low dislocation densities (e.g., less than $5E7$ $cm^{-2}$ for a GaN substrate) are preferred for long-life operation (>10,000 hours).

Figure 16A:
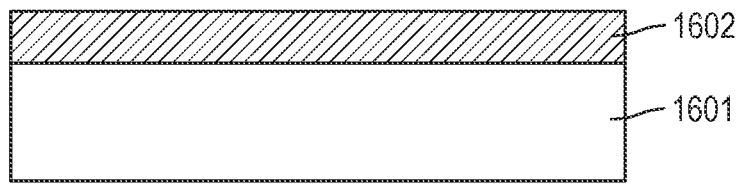
FIGS. 16A-16F show an example of a process flow for fabricating a relaxed $In_xAl_yGa_{1-x-y}N$ layer having a relaxed (0001) $In_xAl_yGa_{1-x-y}N$ region provided by the present disclosure.
Figure 16B:
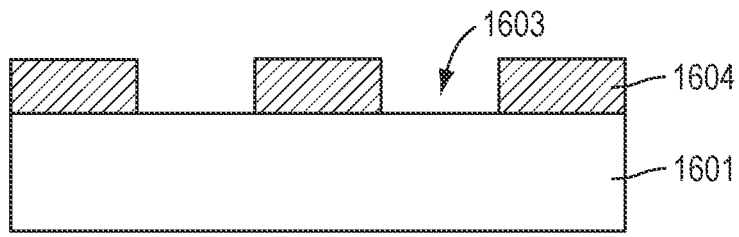
Figure 16C:
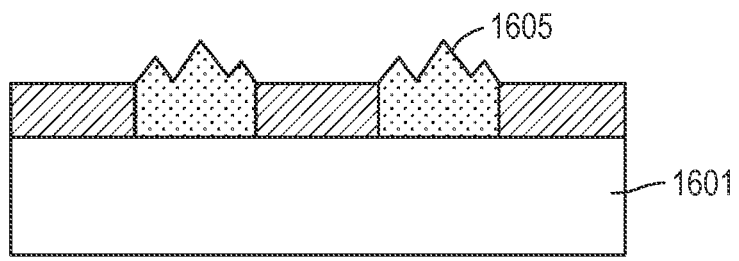
Figure 16D:
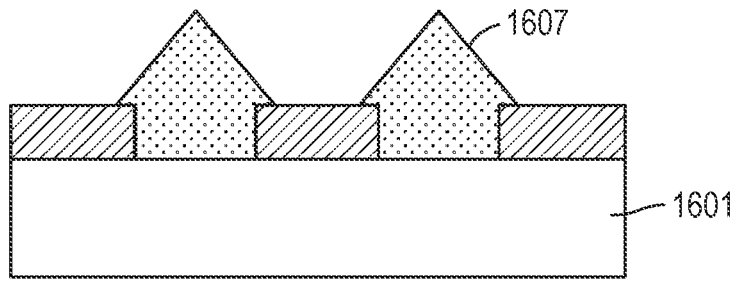
Figure 16E:
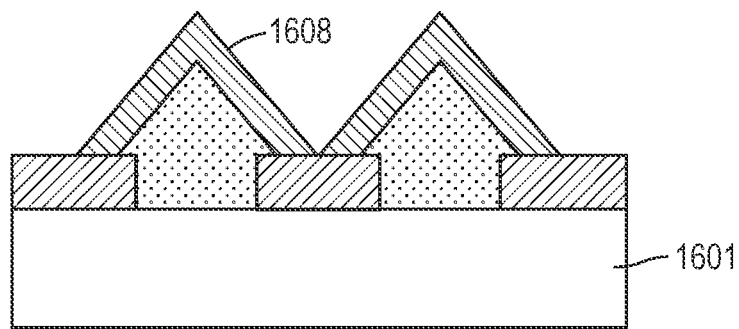
Figure 16F:
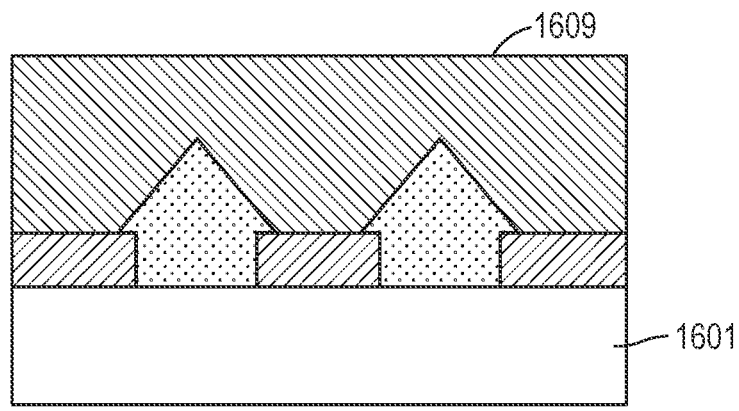

FIGS. 16A-16F show another method for fabricating relaxed InGaN layers on faceted GaN surfaces. This method is similar to the method illustrated in FIGS. 15A-15F except that the GaN seed material is nucleated directly on the substrate. In this approach, a substrate 1601 suitable for GaN nucleation can be provided such as sapphire, SiC, sapphire, AlN or GaN. Referring to FIG. 16A, the substrate 1601 can be overcoated with a masking layer 1602 of a material that is slow to promote GaN nucleation. As shown in FIG. 16B the masking layer 1602 is patterned and etched using photolithography such as nano-lithography and etching techniques (wet, or dry, or a combination thereof) into various patterns 1604. The exposed substrate 1603 in the openings in the mask created by etching can then be used to nucleate GaN seed material 1605 as shown in FIG. 16C, which is grown out from the openings in the mask and, by proper selection of growth conditions, allowed to form GaN seed regions with edges that are triangular facets and have a hexagonal base. For example, the seed region may be six sided and have triangular facets that are {1-101} crystallographically equivalent planes. As shown in FIG. 16D, after the seed regions are fully formed, the triangular facet surfaces 1607 are used as seed surfaces for at least lateral growth of InGaN, forming six heterojunctions in crystallographically equivalent planes that are not co-planar with the substrate. The small dimensions of the GaN seed surfaces and choice of target composition of the grown InGaN material promote relaxation of the InGaN grown on the seed surfaces. Furthermore, each seed surface provides flat, crystallographically equivalent orientations to ensure coherency throughout the grown-out InGaN material. The InGaN grows coherently and relaxes towards its relaxed lattice parameter, to form facets 1608 that are relaxed InGaN as shown in FIG. 16E. These facets are further grown out and eventually coalesce with neighboring InGaN growth fronts grown from other seed regions. As shown in FIG. 16F, the coalesced InGaN then grows above the masking layer, and growth conditions (e.g., growth temperature and TMI flow) are selected to form a continuous, planar, relaxed InGaN region 1609 having a relaxed (0001) InGaN surface or template across the substrate. This method has the advantage that no etching of GaN (or AlN) material is required to provide seed surfaces for the nucleation of InGaN. The method also has the advantage that the entire process can be provided in a single epitaxial growth process. Furthermore, this method is very suitable when the growth substrate is a III-nitride material, such as a GaN or AlN substrate.

Figure 17A:
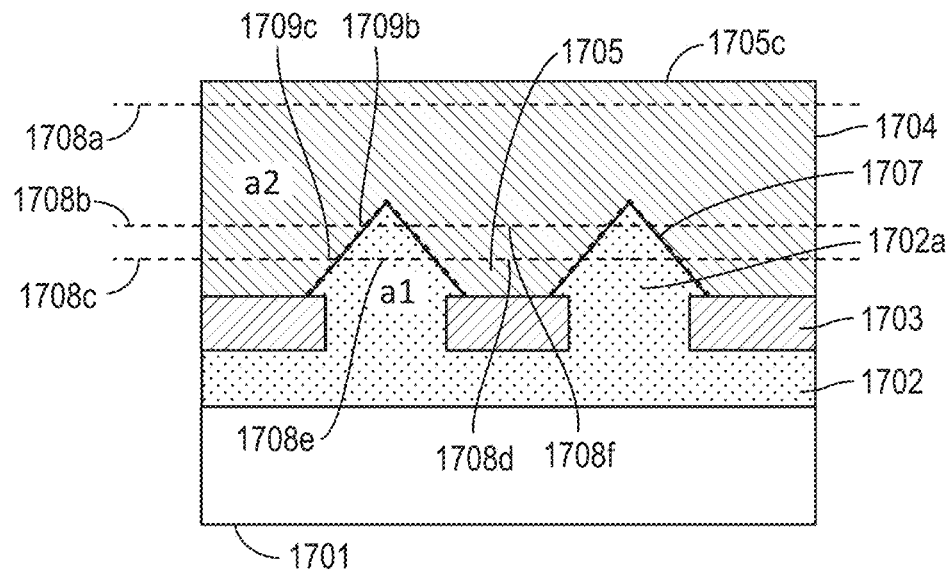
FIGS. 17A and 17B show a cross-sectional view of examples of a III-nitride semiconductor structure having a relaxed (0001) $In_xAl_yGa_{1-x-y}N$ region provided by the present disclosure.

FIG. 17A provides a detailed cross-sectional view of a structure resulting from the process flow shown in FIGS. 15A-15F. A substrate 1701, such as (0001) sapphire can serve as a primary growth substrate for GaN (or InGaN, AlGaN, or AlN) seed layer 1702, characterized by in-plane a-lattice parameter a1. The GaN seed layer 1702 has been grown out between masked regions 1703, to form GaN seed regions 1702a, which have exposed edges of planar GaN seed surfaces that are crystallographically equivalent. InGaN material has been nucleated on the triangular GaN seed surfaces of the GaN seed region, forming heterojunctions 1707 which are not parallel to the primary surface of the original growth substrate 1701. Heterojunctions 1707 may be formed on stable crystallographically equivalent facets of the GaN seed region, such as on the {1-101} crystallographically equivalent facets. The InGaN material been grown out, at least partially laterally, to relax toward a relaxed InGaN in-plane a-lattice parameter, a2, in regions 1705 between GaN seed surfaces. A plane 1708b parallel to the primary surface of the original growth substrate and bisecting the GaN seed material is characterized by different in-plane a-lattice parameters at different positions along the plane. In particular, at a center point within the GaN seed regions 1702a, the GaN material is characterized by an in-plane a-lattice parameter a1, and at a center point 1705 between GaN seed regions 1702a, the in-plane a-lattice parameter is approximately a2. In GaN regions between these two center points, the in-plane a-lattice parameter is greater than a1 and less than a2, because a2>a1. In plan-view (not shown), the variation in the GaN in-plane a-lattice parameter within plane 1708b is characterized by the two-dimensional mask pattern that has been applied to the GaN seed layer material (see FIGS. 5 and 6).

Figure 17B:
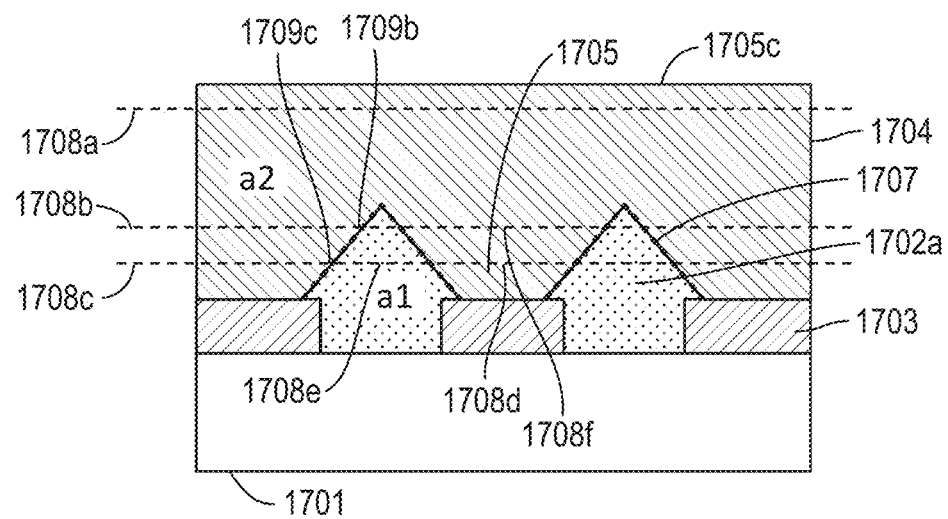

As shown in FIGS. 17A and 17B, plane 1708b intersects an edge of seed regions 1702a to locate a heterojunction 1709b at the interface between the InGaN region 1704 and the seed region. The heterojunction is coplanar with a first crystallographic plane or a first facet of the seed region. Any plane such as plane 1708b, which is parallel to the primary growth surface and intersects both the InGaN region (such as at 1708c) and seed regions 1702a, intersects an edge of a seed region 1702a to locate a heterojunction 1709c at the interface between the InGaN region and the seed region which is coplanar with a second crystallographic plane or second facet of the seed region. As shown in FIGS. 17A and 17B the first and second crystallographic planes are the same. The first and second crystallographic planes or facets can be crystallographically equivalent crystallographic planes or facets.

The InGaN material is coalesced above the masking layer 1703 to form a relaxed InGaN layer 1704 with planar relaxed (0001) InGaN surface 1705c. A plane 1708a parallel to the primary surface of the original growth substrate and positioned within InGaN layer 1704 near surface 1705c is predominantly characterized by an InGaN in-plane a-lattice parameter a2. At a center point 1705 between the GaN seed regions, the InGaN a-lattice parameter is a2, and at a center point within the GaN seed regions, the in-plane a-lattice parameter may be slightly less than a2. In plan-view (not shown), any variation in in-plane a-lattice parameter within plane 1708b is characterized by the two-dimensional mask pattern applied to the seed layer material (see FIGS. 5 and 6). Variations in the in-plane a-lattice parameters are detectable by measurement techniques such as XRD and RSM and can be resolved at the sub-micrometer scale. A mid-point along plane 1708c within seed region 1702a is indicated as 1708e and a mid-point point along plane 1708c between seed regions 1702a is indicated as 1708d and a mid-point along plane 1708b between seed regions 1702a is indicated as 1708f.

GaN seed regions 1702a can have in-plane dimensions, for example, of less than 3 µm, less than 0.3 µm, or of less than 0.03 µm. The height of GaN seed regions 1702a can be, for example, less than 3 µm, less than 0.3 µm, or less than 0.03 µm. The distances between neighboring GaN seed regions 1702a can be, for example, less than 3 µm, less than 0.3 µm, or less than 0.03 µm. The thickness of mask material 1703 can be, for example, from 0.01 µm to 1 µm.

FIG. 17B provides a detailed cross-sectional view of a structure resulting from the process flow in FIGS. 16A-15F. This structure is similar to the structure shown in FIG. 17A, with similar elements identified the same way numerically. However, in the structure of FIG. 17B, there is no planar starting GaN (or AlN) seed layer 1702. Instead, the GaN (or AlN) seed material is nucleated directly on substrate 1701 in the opening between mask regions 1703. The substrate can be sapphire, GaN, AlN, silicon carbide, or silicon, among others.

A Wurtzite III-nitride crystal semiconductor structure can comprise, for example, a substrate comprising a first substrate region and a second substrate region; a first $In_{x1}Al_{y1}Ga_{1-x1-y1}N$ growth layer comprising a first (0001) $In_{x1}Al_{y1}Ga_{1-x1-y1}N$ growth region overlying the first substrate region; a second patterned $In_{x2s}Al_{y2s}Ga_{1-x2s-y2s}N$ seed region overlying the second substrate region; a second $In_{x2}Al_{y2}Ga_{1-x2-y2}N$ growth layer comprising a second (0001) $In_{x2}Al_{y2}Ga_{1-x2-y2}N$ growth region overlying the second patterned $In_{x2s}Al_{y2s}Ga_{1-x2s-y2s}N$ seed region, wherein, the first (0001) $In_{x1}Al_{y1}Ga_{1-x1-y1}N$ growth region is characterized by a first in-plane a-lattice parameter; the second (0001) $In_{x2}Al_{y2}Ga_{1-x2-y2}N$ growth region is characterized by a second in-plane a-lattice parameter; the second in-plane a-lattice parameter is greater than the first in-plane a-lattice parameter; $0 \leq x2s \leq 1$, $0 \leq y2s \leq 1$, and $x2s+y2s \leq 1$; $0 \leq x1 \leq 1$, $0 \leq y1 \leq 1$ and $x1+y1 \leq 1$; and $0 < x2 \leq 1$, $0 \leq y2 \leq 1$, $x2+y2 \leq 1$, and $x2 > x1$.

The substrate can comprise sapphire, silicon, silicon carbide, gallium nitride, silicon-on-insulator, gallium oxide or aluminum nitride.

The second patterned $In_{x2s}Al_{y2s}Ga_{1-x2s-y2s}N$ seed region comprises GaN.

The first patterned $In_{x1s}Al_{y1s}Ga_{1-x1s-y1s}N$ seed region can overly the first substrate region, wherein $0 \leq x1s \leq 1$, $0 \leq y1s \leq 1$, and $x1s+y1s \leq 1$; and the first $In_{x1}Al_{y1}Ga_{1-x1-y1}N$ growth layer can overly the first patterned $In_{x1s}Al_{y1s}Ga_{1-x1s-y1s}N$ seed region. The first patterned $In_{x1s}Al_{y1s}Ga_{1-x1s-y1s}N$ seed region and the second patterned $In_{x2s}Al_{y2s}Ga_{1-x2s-y2s}N$ seed region can comprise GaN. The first patterned $In_{x1s}Al_{y1s}Ga_{1-x1s-y1s}N$ seed region and the second patterned $In_{x2s}Al_{y2s}Ga_{1-x2s-y2s}N$ seed region can comprise the same composition. The first patterned $In_{x1s}Al_{y1s}Ga_{1-x1s-y1s}N$ seed region and the second patterned $In_{x2s}Al_{y2s}Ga_{1-x2s-y2s}N$ seed region can comprise a different composition.

A first plane parallel to a (0001) plane of the Wurtzite III-nitride structure and intersecting the seed regions can be characterized by an intersection of the first plane and a first edge of the second patterned seed region locates a first $In_{x1s}Al_{y1s}Ga_{1-x1s-y1s}N/In_{x1}Al_{y1}Ga_{1-x1-y1}N$ heterojunction; and the first $In_{x1s}Al_{y1s}Ga_{1-x1s-y1s}N/In_{x1}Al_{y1}Ga_{1-x1-y1}N$ heterojunction is coplanar with a first crystallographic plane of the seed region. The first $In_{x1s}Al_{y1s}Ga_{1-x1s-y1s}N/In_{x1}Al_{y1}Ga_{1-x1-y1}N$ heterojunction can comprise a grading of composition from x1s and y1s, to x1 and y1.

Any second plane parallel to the (0001) plane of the Wurtzite III-nitride crystal structure and intersecting a second edge of the seed regions locates a second $In_{x1s}Al_{y1s}Ga_{1-x1s-y1s}N/In_{x1}Al_{y1}Ga_{1-x1-y1}N$ heterojunction, wherein the second $In_{x1s}Al_{y1s}Ga_{1-x1s-y1s}N/In_{x1}Al_{y1}Ga_{1-x1-y1}N$ heterojunction is coplanar with a second crystallographic plane of the seed region. Each of the first crystallographic plane and the second crystallographic plane is crystallographically equivalent.

A first plane parallel to a (0001) plane of the Wurtzite III-nitride structure and intersecting the seed regions is characterized by an intersection of the first plane and a first edge of the first patterned seed region locates a first $In_{x2s}Al_{y2s}Ga_{1-x2s-y2s}N/In_{x2}Al_{y2}Ga_{1-x2-y2}N$ heterojunction; and the first $In_{x2s}Al_{y2s}Ga_{1-x2s-y2s}N/In_{x2}Al_{y2}Ga_{1-x2-y2}N$ heterojunction is coplanar with a first crystallographic plane of the seed region. The first $In_{x2s}Al_{y2s}Ga_{1-x2s-y2s}N/In_{x2}Al_{y2}Ga_{1-x2-y2}N$ heterojunction can comprise a grading of composition from x2s and y2s, to x2 and y2.

Any second plane parallel to the (0001) plane of the Wurtzite III-nitride crystal structure and intersecting a second edge of the seed regions locates a second $In_{x2s}Al_{y2s}Ga_{1-x2s-y2s}N/In_{x2}Al_{y2}Ga_{1-x2-y2}N$ heterojunction, wherein the second $In_{x2s}Al_{y2s}Ga_{1-x2s-y2s}N/In_{x2}Al_{y2}Ga_{1-x2-y2}N$ heterojunction is coplanar with a second crystallographic plane of the seed region.

A III-nitride semiconductor structure can comprise (a) seed regions comprising $In_xGa_{1-x}N$ ($0 \leq x \leq 1$) and a Wurtzite III-nitride crystal structure; (b) a first plane parallel to a (0001) plane of the Wurtzite III-nitride structure and intersecting the seed regions, wherein an intersection of the first plane and a first edge of a seed region locates a $In_xGa_{1-x}N/In_yGa_{1-y}N$ heterojunction, where $0 < y \leq 1$ and $y > x$; and the $In_xGa_{1-x}N/In_yGa_{1-y}N$ heterojunction is coplanar with a first crystallographic plane of the seed region; (c) any second plane parallel to the (0001) plane of the Wurtzite III-nitride crystal structure and intersecting a second edge of the seed region locates a III-nitride heterojunction, where the III-nitride heterojunction is coplanar with a second crystallographic plane of the seed region; and (d) a relaxed (0001) InGaN region overlying the seed regions, where the relaxed (0001) InGaN region is characterized by an in-plane a-lattice parameter that is greater than 3.19 Å, where each of the first and second crystallographic planes is crystallographically equivalent.

A III-nitride semiconductor structure can comprise (a) seed regions comprising $In_xGa_{1-x}N$ ($0 \leq x \leq 1$) and a Wurtzite III-nitride crystal structure; (b) a first plane parallel to a (0001) plane of the Wurtzite III-nitride structure and intersecting the seed regions, wherein an intersection of the first plane and a first edge of a seed region locates a $In_xGa_{1-x}N/In_yGa_{1-y}N$ heterojunction, where $0 < y \leq 1$ and $y > x$; and the $In_xGa_{1-x}N/In_yGa_{1-y}N$ heterojunction is coplanar with a first crystallographic plane of the seed region; (c) any second plane parallel to the (0001) plane of the Wurtzite III-nitride crystal structure and intersecting a second edge of the seed region locates a III-nitride heterojunction, where the III-nitride heterojunction is coplanar with a second crystallographic plane of the seed region; and (d) a relaxed (0001) InGaN region overlying the seed regions, where the relaxed (0001) InGaN region is characterized by an in-plane a-lattice parameter that is greater than 3.19 Å, where each of the first and second crystallographic planes is crystallographically equivalent.

The first parallel plane can intersect two facets of a seed region. An example is plane 1708b in FIGS. 17A and 17B. The facets of the seed region are parallel to a crystallographic plane of the seed region, such as a crystallographic plane of a Wurtzite crystal structure. The facets of the seed region can be crystallographically equivalent facets. The intersection of the first parallel plane with a facet of the seed region locates a heterojunction such as a $In_xGa_{1-x}N/In_yGa_{1-y}N$ where $0 \leq x < 1$, $0 < y \leq 1$, and $y > x$, or where $0 \leq x \leq 1$, $0 < y \leq 1$, and $y > x$.

Any second plane parallel to the (0001) plane of the Wurtzite III-nitride crystal structure and intersecting the seed regions locates a III-nitride heterojunction. An example is plane 1708c in FIGS. 17A and 17B. The second plane can intersect the same facets as the first plane. The second plane can intersect facets of the seed regions that are coplanar with a crystallographic plane of the seed region. Each of the crystallographic planes can be a crystallographically equivalent plane. Each of the seed regions can be characterized by facets parallel to crystallographic planes of the seed region such as crystallographic planes of a Wurtzite crystal structure. Each of the crystallographic planes can be crystallographically equivalent planes. Each of the crystallographic planes can be crystallographically equivalent to the {10-11} plane. Each of the crystallographic planes can be crystallographically equivalent to the {1-100} plane. Each of the crystallographic planes can be crystallographically equivalent to the {11-20} plane. Each of the crystallographic planes can be a plane between that of a (1-100) plane or a (11-20) plane.

An InGaN region is situated between the seed regions. The InGaN region, or at least a portion of the InGaN region between the seed regions can be a partially relaxed InGaN region. The InGaN region can comprise more than one InGaN layer or region where each of the InGaN layers or regions has a different elemental composition. A relaxed (0001) InGaN region can overly the seed regions. The relaxed (0001) InGaN region can be a fully relaxed (0001) InGaN region and can have an in-plane a-lattice parameter that is greater than 3.19 Å, such as from 3.20 Å to 3.50 Å.

A seed region can have 2 or more facets, such as 2, 3, 4, 5, or 6 facets. A seed region can have 6 facets. A seed region can have, for example, a rectangular base, a triangular base, a square base, a pentagonal base, or a hexagonal base. A seed region can have a triangular base or a hexagonal base. A seed region can have a hexagonal base.

Each seed region can comprise, for example, (0001) GaN, and can have, for example, an in-plane a-lattice parameter of about 3.189 Å. Each seed region can comprise GaN and the edge of each seed region can locate a $In_xGa_{1-x}N/GaN$ heterojunction, where $x > 0$, and the III-nitride heterojunction is a GaN-InGaN heterojunction.

Each seed region can comprise, for example, (0001) GaN, and can have, for example, an in-plane a-lattice parameter of about 3.189 Å. Each seed region can comprise GaN and the edge of each seed region can locate a $Al_yGa_{1-y}N/GaN$ heterojunction, where $x > 0$, and the III-nitride heterojunction is a GaN-AlGaN heterojunction.

Each seed region can comprise, for example, (0001) $In_xGa_{1-x}N$, and can have, for example, an in-plane a-lattice parameter greater than 3.189 Å. Each seed region can comprise $In_xGa_{1-x}N$ and the edge of each seed region can locate a $In_xGa_{1-y}N/In_yGa_{1-y}N$ heterojunction, where $x > y$ and the III-nitride heterojunction is an InGaN-InGaN heterojunction.

Each seed region can comprise, for example, $In_{x1}Al_{y1}Ga_{1-x1-y1}N$ ($0 \leq x1 \leq 1$, $0 < y1 < 1$, $x1+y1 \leq 1$) and a Wurtzite III-nitride crystal structure. Each seed region can comprise $In_{x1}Al_{y1}Ga_{1-x1-y1}N$ and the edge of each seed region can locate a $In_{x1}Al_{y1}Ga_{1-x1-y1}N/In_{x2}Al_{y2}Ga_{1-x2-y2}N$ heterojunction, where $0 \leq x2 < 1$, $0 \leq y2 < 1$, $x2+y2 \leq 1$ and $x2 > x1$ and is a (In)(Al)GaN/(In)(Al)GaN heterojunction.

Figure 18C:
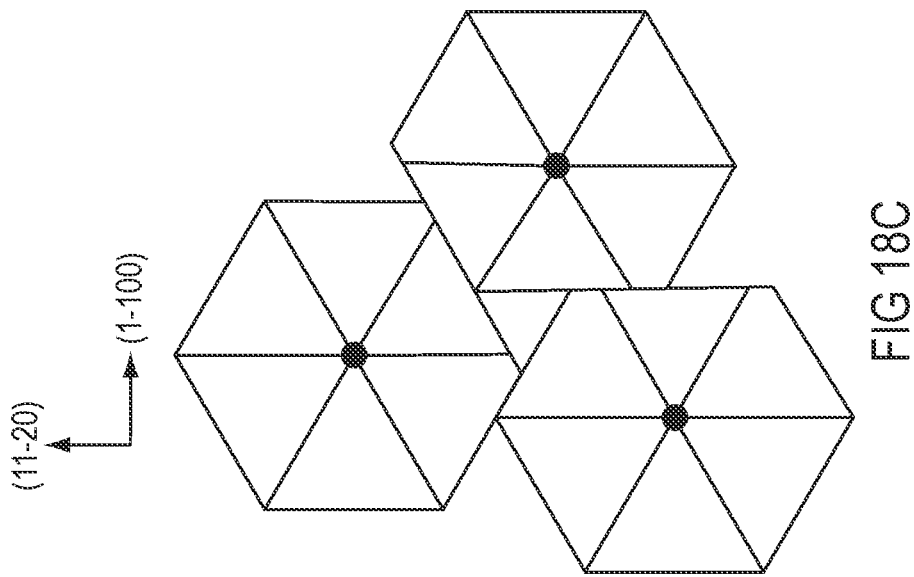
FIGS. 18A-18C show an example of the progressive growth of $In_xAl_yGa_{1-x-y}N$ on (10-11) facets of a III-nitride semiconductor to fill in "v-pit" structures.
Figure 18B:
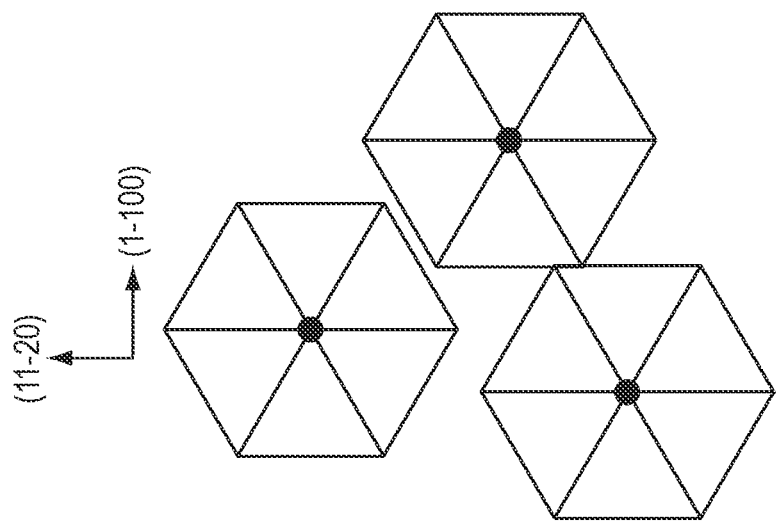
Figure 18A:
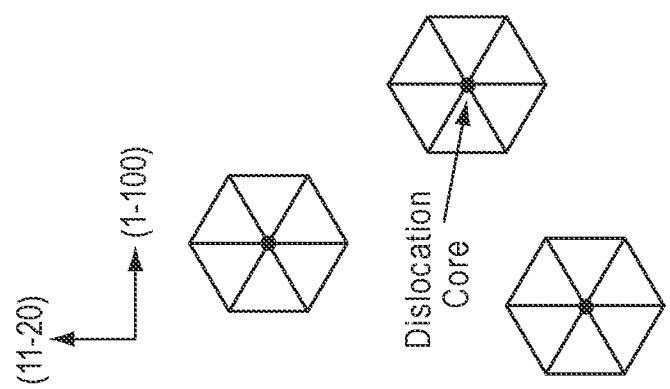
Figure 19:
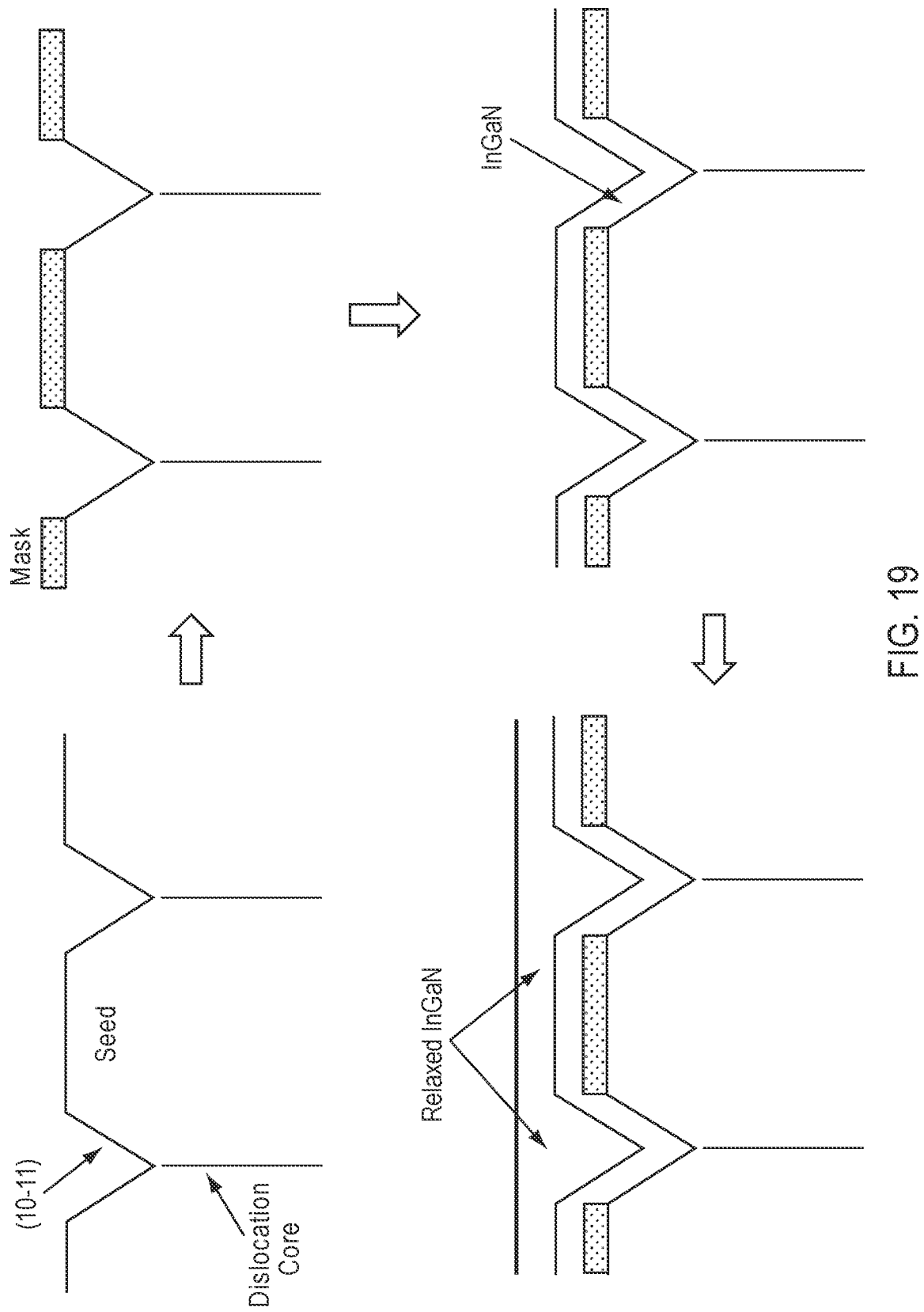
FIG. 19 shows the progressive growth of $In_xAl_yGa_{1-x-y}N$ on (10-11) GaN seed facets to provide a relaxed (0001) $In_xAl_yGa_{1-x-y}N$ region.
Figure 20:
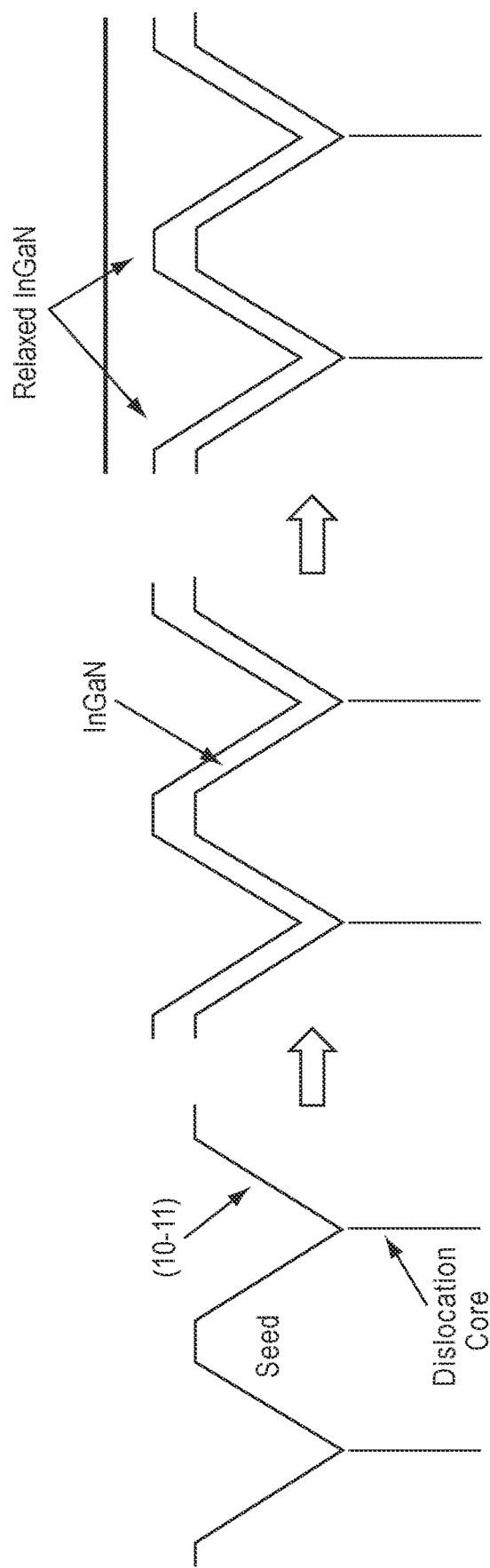
FIG. 20 shows an example of the progressive growth of $In_xAl_yGa_{1-x-y}N$ on (10-11) GaN seed facets to provide a relaxed (0001) $In_xAl_yGa_{1-x-y}N$ region.

FIGS. 18-20 illustrate aspects of the invention. FIGS. 18A, 18B, and 18C show plan view schematics of so-called "v-pit" structures that can form in III-nitride growth on the basal plane. In particular, for III-nitride material grown at low temperatures, e.g., GaN grown using MOCVD at temperatures less than 800° C., adatom kinetics are such that semiconductor material does not tend to fill in near dislocation cores, causing pits to form from stable (10-11) planes with dislocation cores at the epicenter. As growth continues under the low-temperature conditions, the pits become larger (FIG. 18B) and collide (FIG. 18C). As the pits become larger, the total surface area of exposed (10-11) facets becomes comparable to or even larger than that of the exposed (0001) surface. The presence of this large surface area of (10-11) facets, with each facet being crystallographically equivalent, provides an opportunity to form high quality, relaxed InGaN on (10-11) seed surfaces, e.g., GaN, as conceived in the present invention.

For example, as shown in FIG. 19, GaN can be nucleated at low temperature onto a suitable substrate, such as GaN, sapphire, Si, SiC, AlN, etc. After a reasonably high quality GaN epitaxial film is achieved, for example, by growing a GaN epitaxial film at elevated temperatures (e.g., greater than 900° C.), the growth conditions can be altered again so that v-pits are formed, for example, by growing GaN at temperatures below 800° C. The growth can then be discontinued, the growth structure removed from the MOCVD reactor, and a suitable growth-mask layer such as a dielectric layer of $SiO_2$, or $SiN_x$ can be selectively deposited on the (0001) GaN surface, but not on the (10-11) GaN surfaces. This can be achieved by various means such as by using high-angle sputtering or deposition, or by selective deposition of photoresist into the v-pits followed by, for example, deposition and lift-off. The GaN structure can then be returned to the reactor such as an MOCVD or MBE reactor. Then, InGaN, optionally preceded by the deposition of a thin layer of GaN, can be grown selectively on the exposed GaN seed region material on the (10-11) facets. The InN molar fraction can be targeted to induce large strain and thus relaxation upon increased thickness of the InGaN layer. The InGaN can be allowed to continue to grow out over the masked regions and to coalesce with InGaN grown from adjacent seed regions, providing a planar, high quality, relaxed (0001) InGaN region and surface, which can serve as a template for device fabrication, as described in the present disclosure. The InGaN layers can be grown at higher temperatures than is typical for InGaN/GaN growth such as at temperatures greater than 900° C., which is possible because the relaxed InGaN material incorporates In much more easily than InGaN that is pseudomorphic to GaN. The increased growth temperature allows filling in the v-pit defects and providing a coalesced, planar film. Control over the morphology and compositional uniformity of the relaxed InGaN growth can be facilitated by growing multilayer structures, rather than by using bulk InGaN layers. For example, a 25% bulk InGaN layer can be replaced by alternating layers of 3 nm GaN and 1 nm InN, or 2 nm GaN and 2 nm $In_{0.5}Ga_{0.5}N$. Layer thicknesses for the individual layers can range, for example, from 0.5 nm to 100 nm, such as from 1 nm to 30 nm. Many periods of such multi-layer structures may be used, such as from 2 to 10 layers, from 2 to 100 layers, or greater than 100 layers.

In another example, the masking step can be eliminated, and the entire process can be completed in situ in the growth chamber. For example, as shown in FIG. 20, GaN can be nucleated onto a suitable substrate, such as GaN, sapphire, Si, AlN, etc. After a reasonably high quality GaN epitaxial film is achieved, for example, by growing at elevated temperatures (e.g., >900° C.), the growth conditions can be altered again so that v-pits are formed, for example, by growing GaN at temperatures below 800° C. The v-pits can be grown out so that the exposed surface area of the {10-11} equivalent facets is larger than the exposed surface area of (0001) GaN. The exposed surface area of the (10-11) facets can be more than twice that of the exposed surface area of (0001) GaN, for example, ten times that of the exposed surface area of (0001) GaN. Then, InGaN can be grown selectively on the (10-11) facets which are the seed regions. The InN composition can be targeted to induce large strain and thus relaxation upon increased thickness of the InGaN layer, whereby the critical thickness has been exceeded. The InGaN growth can be allowed to continue to grow out and coalesce with InGaN grown from adjacent seed regions, providing a planar, high quality, relaxed (0001) InGaN region, which can serve as a template for device fabrication.

Because the (0001) GaN growth surface area is smaller than the (10-11) growth surface area, the latter growth mode dominates, allowing the InGaN to relax and become the dominant growth surface with increasing film thickness. It can be useful to grow the InGaN layers at higher temperatures than is typical for InGaN/GaN growth, which is possible because the relaxed InGaN material can incorporate In much more easily than InGaN pseudomorphic to GaN. The increased growth temperature allows the v-pit defects to fill in to provide a coalesced, planar film. Control over the morphology and compositional uniformity of the relaxed InGaN growth can be facilitated by growing multilayer structures, rather than by using bulk InGaN layers. For example, a 25% bulk InGaN layer may be replaced by alternating layers of 3 nm GaN and 1 nm InN, or 2 nm GaN and 2 nm $In_{0.5}Ga_{0.5}N$. Layer thicknesses for the individual layers can range, for example, from 0.5 nm to 100 nm, such as from 1 nm to 30 nm. Many periods of such multilayer structures can be used, such as from 2 to 10 layers, from 2 to 100 layers, or greater than 100 layers.

As an example, a c-plane (0001) sapphire substrate can be loaded into a MOCVD reactor capable of supplying at least tri-methyl gallium, tri-methyl indium, and ammonia. A low-temperature GaN nucleation layer can be provided, followed by higher temperature GaN growth which can include three-dimensional island formation before coalescing into a two-dimensional (0001) GaN film. This three- to two-dimensional transition helps redirect threading dislocations laterally and helps to reduce the overall threading dislocation density at the growth surface, which can be reduced to less than 1E9 cm-2. A dislocation density of 1E8 $cm^{-2}$ can be achieved eventually in the planar GaN layer. Next, the growth temperature can be reduced (e.g., less than 800° C.) to form v-pit structures at dislocation cores, which are characterized by inclined (10-11) planes. These planes can form an angle with respect to the (0001) growth surface of about 63 degrees. The thickness of the low temperature layer controls the v-pit height and is increased by growth such that the total surface area of exposed {10-11} facets is greater than the surface area of (0001), as shown in Table 3 for this specific example.

TABLE 3

Examples of growth structures.

| | | | | | |
|---|---|---|---|---|---|
| V-pit height (μm) | 0.01 | 0.10 | 0.14 | 0.20 | 0.25 |
| (10-11) plane surface area per V-pit (μm²) | 0.038 | 0.377 | 0.528 | 0.754 | 0.943 |
| % Surface Area Ratio (10-11) plane | 03.8% | 37.7% | 52.8% | 75.4% | 94.3% |

For example, in the case of a dislocation density of 1E8 $cm^{-2}$, the target v-pit height can be 0.14 μm or greater.

Lower dislocation densities can be achieved by various mechanisms, such as starting with a lower dislocation density substrate, such as a "free standing" GaN substrate, and by using various threading dislocation filtering methods such as in situ $SiN_x$ layers, epitaxial lateral overgrowth techniques, or just increased growth thickness. By these and other means known in the art, dislocation densities can be reduced to less than 1E7 $cm^{-2}$, less than 1E6 cm-2, and even less than 1E5 $cm^{-2}$. Such lower dislocation densities are especially useful for the performance and reliability of laser diodes.

After the desired surface area-ratio between the (10-11) and (0001) material is achieved, trimethylindium (TMI) is flowed into the chamber to grow one or more InGaN layers on the (10-11) seed regions and to induce strain relaxation. The InGaN layers can be periodically alternated with GaN layers. For example, each InGaN layer can be from 0.5 nm to 100 nm thick, such as from 1 nm to 30 nm thick, and can be sandwiched between GaN layers having a similar thickness. To induce strain relaxation, the average composition of the strain relaxation layers should be reasonably high, for example, the average InN content can be greater than 5%. After or before strain relaxation is initiated, the growth temperature can be raised to help planarize the growth and achieve a planar, uniform, relaxed (0001) InGaN layer for device fabrication.

Planarization techniques, not only for this embodiment but for all the embodiments disclosed herein, including changing growth conditions such as growth temperature, V/III ratio, and the use of dopants (e.g., Mg-doping) to promote lateral vs. vertical growth. Also, composition can play a role, including the use of multi-layer films (as described in this specification elsewhere) to promote planarization of epitaxial films.

While the above discussion focused on V-pits which rely on dislocation cores for their formation, other means to form semi-polar facets throughout a III-Nitride base material or substrate can be employed, such as annealing and decomposition techniques designed to reveal specific growth planes within the system. These techniques do not necessarily rely on dislocation cores and can offer techniques to provide desired seed region facets without relying on dislocations.

It is important to note that although the foregoing discussion is directed to GaN seed regions, it is also possible to utilize InGaN (or AlGaN) seed regions, provided the material is pseudomorphic to any underlying GaN layer, e.g., GaN nucleation and/or buffer layers. The seed regions are regions in the vicinity of the InGaN-GaN (or InGaN-InGaN) heterojunctions that eventually induce relaxation. The seed material below these regions is referred to as seed material and not seed regions.

Relaxed InGaN layers and semiconductor structures comprising relaxed InGaN layers provided by the present disclosure can be used to fabricate electronic and optoelectronic devices including InGaN-based optoelectronic devices such as LEDs, LDs, and VCSELs. LEDs and LDs comprising relaxed InGaN layers provided by the present disclosure can be used in lighting systems and display systems. In particular, for LEDs, devices may be formed on a relaxed InGaN base layer overlying a substrate. The substrate can be thinned by techniques such as grinding, lapping, or etching, and can be diced by means known in the art such as sawing, scribe-and-break, or laser scribing and breaking, to provide individual LED chips or dies. More common LED chips or die dimensions can be, for example, from 100×100 $\mu m^2$ to 5×5 $mm^2$. MicroLEDs can have device dimensions below 100×100 $\mu m^2$, to smaller than 0.5×0.5 $\mu m^2$. Individual LED chips can then be attached to suitable package elements, which provide leads for electrically contacting and heatsinking the devices. Die-attach can be accomplished using any suitable method such as epoxy or silicone attachment, solder-based attach, or mass-transfer techniques in the case of small devices such as, for example, micro-LEDs with a dimension less than 30 $\mu m$. Electrical connection for the chip to the package can be completed by using bond wire such as Au or Ag wires, to connect the anode and cathode leads in the package to respective contact metallizations, i.e., electrodes, on the LED chip. In the case of flip-chip devices, electrical contact can be made through an intermediary submount, positioned between the LED chip and package. The chip electrodes can be attached to the submount carrier by means such as solder-attach or Au-bump attach. The submount carrier can be diced and then mounted into the package by any suitable method.

Desired emission color from the packaged LED device is obtained by fabricating and providing a relaxed InGaN-based LED, with a desired peak emission wavelength. Multiple such LED chips, optionally with different peak emission wavelengths, can be included in separate packages, or combined together in a multi-chip package. For example, a single package can include red-emitting, green-emitting, and blue-emitting LED chips, which may be arranged in a circuit and electrically coupled to a driver circuit, either within or outside the package, for operating the LEDs. The circuit details and driver can be selected to allow the different color LEDs to operate separately, or together, to provide a wide range of total emission characteristics, including white light emission for use in illumination applications, or for use as a backlight for a liquid crystal display (LCD) device, such as a television display, computer monitor, mobile phone display, wearable display device, etc.

One or more LED chips can be combined with luminescent down-conversion materials to provide a desired emission spectrum. Such luminescent down-conversion materials may include phosphors, semiconductor nanoparticles such as quantum dots, or perovskite materials. Multiple luminescent down-conversion materials can be combined together in a single package. The LED chip emission wavelength can be selected to excite the luminescent down-conversion materials so that emission from the package is a combination of the LED chip direct emission and that of the luminescent down-conversion material, or the emission may be primarily just that of the luminescent down-conversion material, with the LED chip light mostly fully absorbed by the luminescent down-conversion materials or otherwise blocked or filtered from exiting the package. Packaged LEDs using luminescent down-conversion materials can be used to produce white light, which can be useful in illumination applications. Such devices can be electrically coupled to driver circuits, powered by an external power source such as mains or battery power, thermally coupled to a heatsink, and optically coupled to various optics or lenses to provide lighting devices such as LED lamps or LED light fixtures.

LED chips with smaller dimensions may be fabricated using the present invention. In particular, devices with dimensions from 0.5×0.5 $\mu m^2$ to 50×50 $\mu m^2$, so called "micro-LEDs", can be fabricated. For micro-LEDs, conventional dicing techniques are less suitable and therefore other means for singulating the devices can be employed. For example, singulation may be enabled by forming LEDs of desired dimensions on a substrate, and then bonding the top surfaces of the LEDs to a carrier, such as blue tape or a submount carrier, then removing the substrate. The individual devices may then be picked up and placed into a package element or onto a backplane for micro-LED based display. Advanced die-handling techniques, as known in the art, can be used for handling micro-LED devices. In particular, red-emitting, green-emitting, and blue-emitting LEDs based on the present invention may be formed into micro-LEDs and arranged to provide a micro-LED display and incorporated into systems such as televisions, computer monitors, tablets, mobile phones, wearable device, etc. In general, other singulation techniques than conventional dicing include laser cutting, stealth dicing, chemical etching, and plasma etching.

LDs incorporating relaxed InGaN layers provided by the present disclosure can also be incorporated into various systems. LD packaging is similar to LED packaging as described herein, except that means are provided for managing the higher power densities in a LD device from a thermal perspective and means for optically accessing the laser facet is provided. LDs of multiple emission colors may be provided in separate packages or combined into a single package. LDs may be coupled to luminescent down-conversion materials to provide a desired emission spectrum. LDs are useful in applications wherein very high light density is required, such as in automotive forward lighting systems, or projection displays, which may include light modulation means such as rastering optics, micro-mirror devices, and LCD modulators.

Examples of lighting and display systems are shown in FIGS. 11 and 12, respectively.

Controlled crystal lattice engineering, such as described in the preceding paragraphs can be exploited to realize the deposition of variable composition III-V compound semiconductor alloys with high quality on the same growth substrate. Controlled crystal lattice engineering refers to the ability to fabricate high quality relaxed layers of III-V materials using a patterned growth layer that allows for the incorporation of different InN content determined by the configuration of the patterned growth layer to provide optoelectronic devices configured to emit radiation within a desired wavelength range.

In one method of fabricating a multi-color optoelectronic device, groups of optoelectronic elements, where each optoelectronic element within the group is characterized by a similar in-plane a-lattice parameter and a similar InN content, can be serially fabricated on the same growth substrate such as a GaN layer. For example, a first group of optoelectronic elements can be fabricated on a first portion of a growth substrate, a second group of optoelectronic elements can be fabricated on a second portion of the growth substrate, and a third group of optoelectronic elements can be fabricated on a third portion of the growth substrate. Each of the first group, the second group, and third group of optoelectronic elements can be characterized by a different in-plane a-lattice parameter and a different InN content and can be configured to emit radiation within a different wavelength range.

Figure 21:
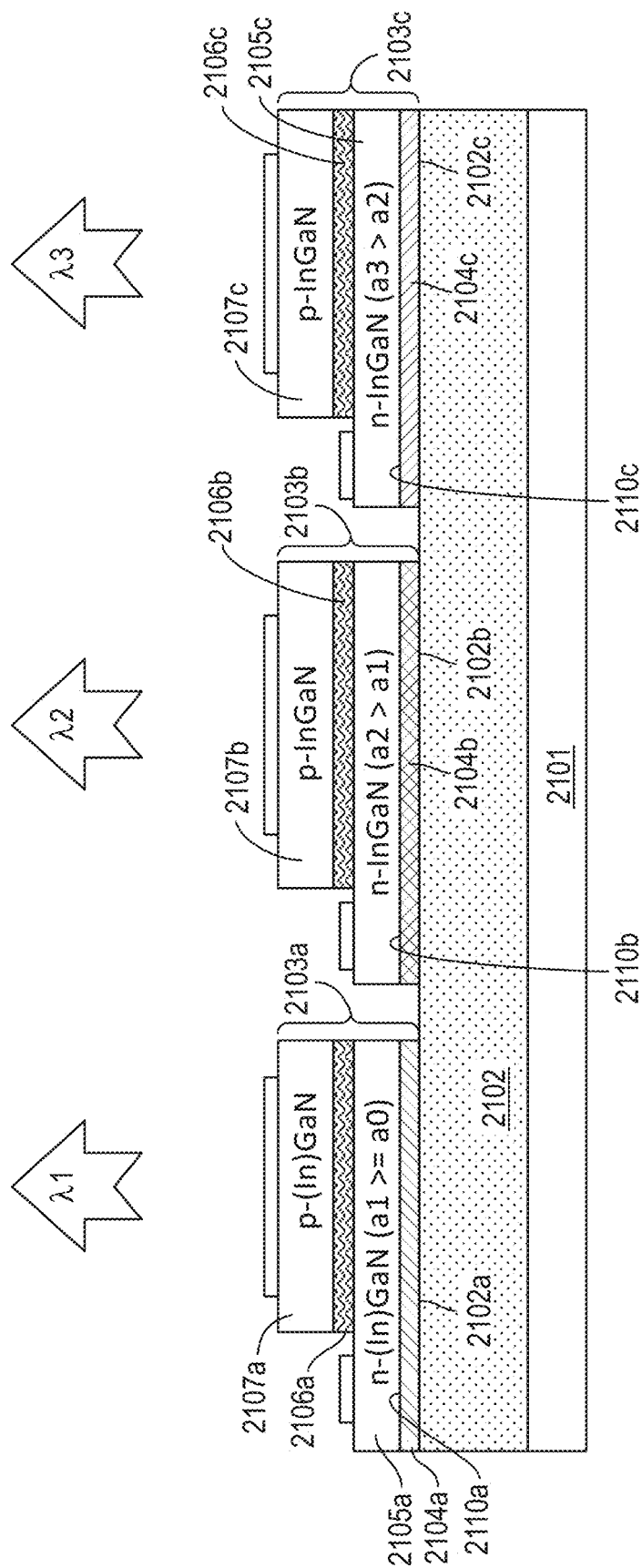
FIG. 21 shows an example of an optoelectronic device provided by the present disclosure including three optoelectronic elements configured to emit at three different wavelength regions grown on three different relaxed InGaN growth layers having different relaxed (0001) $In_xAl_yGa_{1-x-y}N$ regions overlying the same growth layer.

For example, as shown in FIG. 21, a first wavelength (Q) optoelectronic element 2103a can be grown on a suitable substrate that can include a conventional GaN buffer layer 2102 having in-plane a-lattice parameter a0.

The substrate can be masked and etched to expose a first region 2102a of the GaN buffer layer 2102.

An optional first relaxed InGaN growth layer (comprising a pattern 1) 2104a can be deposited overlying the first region 2102a of the GaN buffer layer 2102 such that the top (0001) InGaN growth region 2110a of the first relaxed InGaN growth layer 2104a has an in-plane a-lattice parameter a1≥a0. The in-plane a-lattice parameter of overlying InGaN layers will adopt the in-plane a-lattice parameter a1≥a0. Epitaxial layers such as an n-type InGaN layer 2105a, an active layer 2106a, and a p-type InGaN layer 2107a can be deposited on or overlying the first relaxed (0001) InGaN surface 2110a of the first relaxed InGaN growth layer 2104a to provide first optoelectronic element 2103a.

Alternatively, a relaxed InGaN growth layer 2105b may not overly a first region 2102a of the GaN buffer layer 2102 and the epitaxial layers of the optoelectronic element may be grown directly over the GaN buffer layer 2102 and will be pseudomorphic to GaN and have an in-plane a-lattice parameter a0.

After the first optoelectronic element 2103a is fabricated, the wafer including the first optoelectronic element can be masked and etched to expose a second region 2102b of the GaN buffer layer 2102 so that a second relaxed InGaN growth layer and (0001) InGaN growth region can be grown under optimized conditions. A second relaxed InGaN growth layer (comprising pattern 2) 2104b can be deposited overlying the second region 2102b of the GaN buffer layer 2102 to allow a controlled degree of lattice relaxation such that the in-plane a-lattice parameter of this layer is a2 which is greater than a1.

Epitaxial layers can be deposited on or over the second relaxed (0001) InGaN surface 2110b of the second relaxed (0001) InGaN growth region 2110b to provide second optoelectronic element 2103b. The in-plane a-lattice parameter of the overlying InGaN layers will be a2 which is greater than a1. Epitaxial layers such as an n-type InGaN layer 2105b, an active layer 2106b, and a p-type InGaN layer 2107b can be deposited overlying the second relaxed InGaN growth layer 2104b to provide second optoelectronic element 2103b.

After the second optoelectronic element 2103b is fabricated, the wafer can be masked and etched to expose a third region 2102c of the GaN buffer layer 2102 to enable a third relaxed InGaN growth layer 2104c to be grown on third region 2102c of GaN buffer layer 2102 under optimized conditions.

A third relaxed InGaN growth layer (comprising pattern 3) 2104c can be deposited onto the third region 2102c of the GaN buffer layer 2102 to allow a controlled degree of further lattice relaxation such that the in-plane a-lattice parameter of the (0001) InGaN growth region 2110c of the third relaxed InGaN growth layer 2104c is a3 which is greater than a2.

Epitaxial layers can then be deposited on or over the third relaxed (0001) InGaN surface 2110c of the third relaxed (0001) InGaN growth region 2110c to provide third optoelectronic element 2103c. The in-plane a-lattice parameter of the overlying layers will be a3 which is greater than a2. Epitaxial layers such as an n-type InGaN layer 2105c, an active layer 2106c, and a p-type InGaN layer 2107c can be deposited overlying the third relaxed InGaN growth layer 2104c to provide third optoelectronic element 2103c.

Each of the relaxed InGaN growth layers 2104a/2104b/2104c can comprise a different pattern configured such that the (0001) InGaN growth surface 2110a/2110b/2110c of each of the respective relaxed InGaN growth layers 2104a/2104b/2104c is characterized by a different in-plane a-lattice parameter and a different InN content. Also, at least one of these layers may not comprise patterning. The relaxed InGaN growth layers can be configured to impart a different in-plane a-lattice parameter and different InN molar fraction to overlying epitaxial layers such as InGaN layers. The different InN molar fraction of the active layers will result in optoelectronic elements capable of emitting radiation in different wavelength ranges.

Each of the relaxed InGaN growth regions 2104a/2104b/2104c includes a relaxed (0001) InGaN surface 2110a/2110b/2110c overlying the relaxed (0001) InGaN region. The relaxed (0001) InGaN regions overlie a partially relaxed InGaN region which overlies seed regions.

For structure, pattern and/or elemental compositions of each of the seed regions of each of the relaxed InGaN growth regions 2104a/2104b/2104c can independently be the same or different depending on the selected emission wavelength. An optoelectronic device can comprise a plurality of optoelectronic elements capable of emitting radiation within a particular wavelength range.

For example, referring to FIG. 21, a multi-color optoelectronic device can comprise a plurality of optoelectronic elements 2103a, a plurality of optoelectronic elements 2103b, and a plurality of optoelectronic elements 2103c. The optoelectronic elements 2103a/2103b/2103c can be arranged to form pixels. A multi-color optoelectronic device can comprise, for example, from 1 to 10, or from 1 to 3 sub-groups of optoelectronic elements having a relaxed (0001) InGaN region provided by the present disclosure, with each sub-group comprising a plurality of optoelectronic elements capable of emitting radiation at a different wavelength. For example, an optoelectronic device can comprise 3 sub-groups of optoelectronic elements having a relaxed (0001) InGaN region provided by the present disclosure, with each sub-group comprising a plurality of optoelectronic elements capable of emitting radiation at a different wavelength. For example, a multi-color optoelectronic device can comprise 2 sub-groups of optoelectronic elements having a relaxed (0001) InGaN region provided by the present disclosure, with each sub-group comprising a plurality of optoelectronic elements capable of emitting radiation at a different wavelength.

In a multi-color optoelectronic device capable of emitting at multiple wavelengths, the composition of the relaxed (0001) InGaN surface overlying relaxed (0001) InGaN region will be different for each wavelength.

In another method of fabricating a multi-color optoelectronic device, a relaxed InGaN growth layer overlying a GaN buffer layer, can comprise groups of InGaN growth layers wherein each group of relaxed InGaN growth layers is coalesced and characterized by a relaxed (0001) InGaN growth region having a different in-plane a-lattice parameter and a different InN content. Then, epitaxial layers can be deposited overlying the relaxed InGaN growth layers to provide groups of optoelectronic elements overlying the respective groups of relaxed InGaN growth layers, where each group of optoelectronic elements is configured to emit radiation within a different wavelength range.

A first optoelectronic element can include a first InGaN active layer and a second InGaN active layer where the first active layer is characterized by a first in-plane a-lattice parameter; the second InGaN active layer is characterized by a second in-plane a-lattice parameter; and where the second in-plane a-lattice parameter is greater than the first in-plane a-lattice parameter. For example, the second in-plane a-lattice parameter can be greater that the first in-plane a-lattice parameter by greater than 0.005 Å, greater than 0.01 Å, greater than 0.05 Å or greater than 0. A. For example, the second in-plane a-lattice parameter can be greater that the first in-plane a-lattice parameter by from 0.005 Å to 0.05 Å. For example, the second in-plane a-lattice parameter can be greater that the first in-plane a-lattice parameter by from 0.01 Å to 0.55 Å or from 0.01 Å to 0.1 Å.

Figure 22:
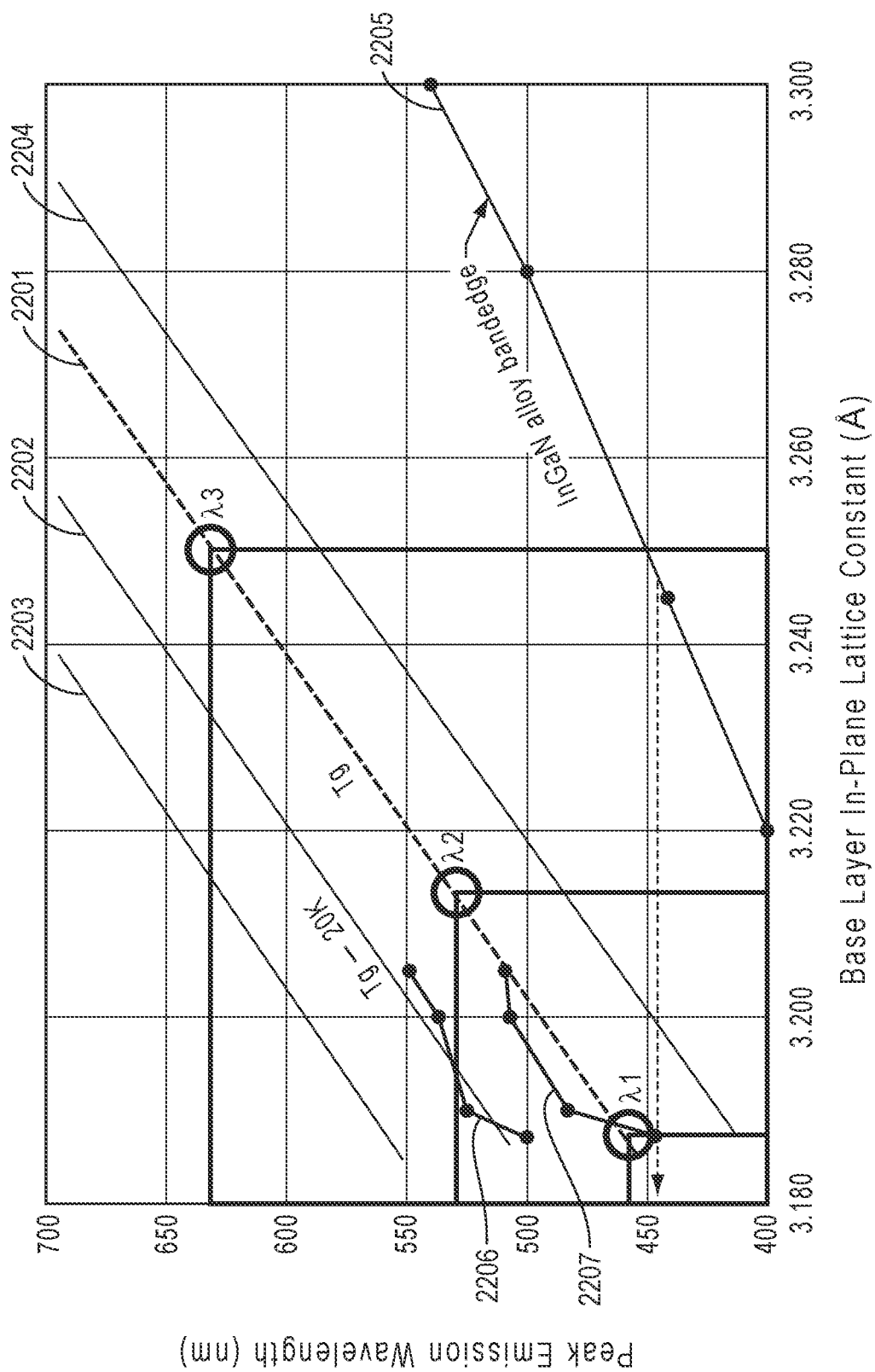
FIG. 22 shows the relationship between the in-plane a-lattice parameter and the peak emission wavelength for different InGaN compositions deposited at different growth temperatures.

FIG. 22 is a chart showing the relationship between the peak emission wavelength of light emitting diodes and the in-plane a-lattice parameter of the respective active layer. FIG. 22 shows the relationship between the in-plane a-lattice parameter of the active region and the peak emission wavelength of light emitting diodes at a MOCVD growth temperature ($T_g$) typical for growth of conventional InGaN blue LEDs on GaN (line 2201), at $T_g$–20 K (line 2202), at $T_g$–40K (line 2203) and at $T_g$+20K (2204). For example, at $T_g$, an active region having an in-plane a-lattice parameter of about 3.187 Å will have a peak emission wavelength of about 458 nm, an active region having an in-plane a-lattice parameter of about 3.213 Å will have a peak emission wavelength of about 528 nm, and an active region having an in-plane a-lattice parameter of about 3.250 Å will have a peak emission wavelength of about 635 nm. The InGaN alloy band edge is shown as line 2205. The data associated with line 2206 and line 2207 represents experimental measurements of the peak emission wavelength for LEDs at temperatures of $T_g$–20 K (line 2206) and at $T_g$ (line 2207) having the respective in-plane a-lattice parameters as presented by Even et al., *Applied Physics Letters* 110, 262103, 2017.

Controlled crystal lattice engineering permits the growth of light-emitting active regions, such as light-emitting diodes (LEDs), super-luminescent light emitting diodes, laser diodes (LDs), and vertical cavity surface emitting lasers (VCSELs), having different emission wavelengths on a single wafer. Because the lattice engineering can be controlled within selected growth regions at the sub-micron level, single color active region areas can be fabricated at the micron- or even sub-micron level on a single wafer.

Controlled crystal lattice engineering can also be exploited to realize the simultaneous deposition of variable composition III-V compound semiconductor alloys with high quality. This permits the growth of light-emitting active regions, such as light-emitting diodes (LEDs), super-luminescent light emitting diodes, laser diodes (LDs), and vertical cavity surface emitting lasers (VCSELs), of different emission wavelengths in a single epitaxial deposition process.

As described, controlled crystal lattice engineering can be used to fabricate high quality optoelectronic elements and devices on a large area wafer, wherein each of the plurality of optoelectronic elements is configured to emit radiation within substantially the same wavelength range. In this method, the epitaxial layers comprising the optoelectronic elements are grown on a patterned growth layer, which has a single pattern across the surface of the wafer.

Controlled crystal lattice engineering can be extended to fabricate optoelectronic elements configured to emit radiation within different wavelength ranges. In this fabrication method, the relaxed InGaN growth layer can comprise a plurality of GaN seed regions having different pattern configurations (e.g., feature size, shape, and spacing). InGaN is grown on the growth surfaces of the GaN seed regions. Continued growth of InGaN will result in InGaN grown from adjacent GaN seed regions to coalesce and from a relaxed InGaN region between the GaN seed regions. Further InGaN growth results in a relaxed InGaN region overlying the GaN seed regions and having a (0001) InGaN growth region characterized by an in-plane a-lattice parameter. Depending on the configuration of the GaN seed regions, the coalesced relaxed InGaN growth layers will have a different in-plane a-lattice parameter and to incorporate a different amount of InN into the crystal lattice of the III-V semiconductor. Optoelectronic elements grown overlying the different relaxed InGaN growth layers can emit radiation within a wavelength range consistent with the incorporated InN content.

As described herein, a III-nitride epitaxial layer on a growth substrate or GaN buffer layer can be selectively patterned with a dielectric material such $SiO_x$, $SiN_x$ or $AlO_x$, using any suitable semiconductor deposition, lithography (including nanolithography), and etching techniques. The degree of patterning is intentionally selected to produce a desired in-plane strain state in an overlying InGaN layer. For example, growth of InGaN over a non-patterned (0001) GaN seed layer can result in an overlying strained InGaN layer lattice matched to GaN (i.e., pseudomorphic to GaN). Growth of InGaN on densely patterned GaN seed regions can result in an overlying InGaN layer that is substantially relaxed and characterized by an in-plane a-lattice parameter near that of a fully relaxed InGaN layer having the same composition. Finally, regions with a pattern density between that of a non-patterned GaN seed region and a densely patterned GaN seed region can exhibit an in-plane a-lattice parameter of partially relaxed InGaN.

Control over the in-plane a-lattice parameter allows active regions with different compositions to have similar strain states that are optimal for device performance. For example, optimum strain states for InGaN-based emitters are between about 1% and about 2% of the compressive strain, regardless of emission wavelength. One way to have the emitters exhibit similar, beneficial strain states, while allowing the InGaN composition of the respective active regions to differ and thereby emit at different wavelengths such as from blue to green to red wavelength ranges, is to adjust the in-plane a-lattice parameter of the underlying material on which the InGaN-based emitters are grown.

A III-nitride epitaxial layer on a growth substrate can be selectively patterned with a dielectric material using known deposition, lithography (including nanolithography), and etching techniques to define GaN seed regions. The patterning can be intentionally selected to produce a desired strain state of a relaxed InGaN growth layer grown on the plurality of GaN seed regions.

Because the in-plane a-lattice parameters of the relaxed InGaN growth layers overlying the various patterned GaN seed regions are different, the incorporated InN molar fraction in each relaxed InGaN growth layer will be different, even though the epitaxial TMI/III ratio and growth temperature used to deposit the InGaN layers overlying each of the respected relaxed InGaN growth layers are the same. Using this method, it is possible to selectively grow multi-colored active regions simultaneously on a single growth substrate in a single growth run, with micron or even sub-micron scale resolution.

Figure 23:
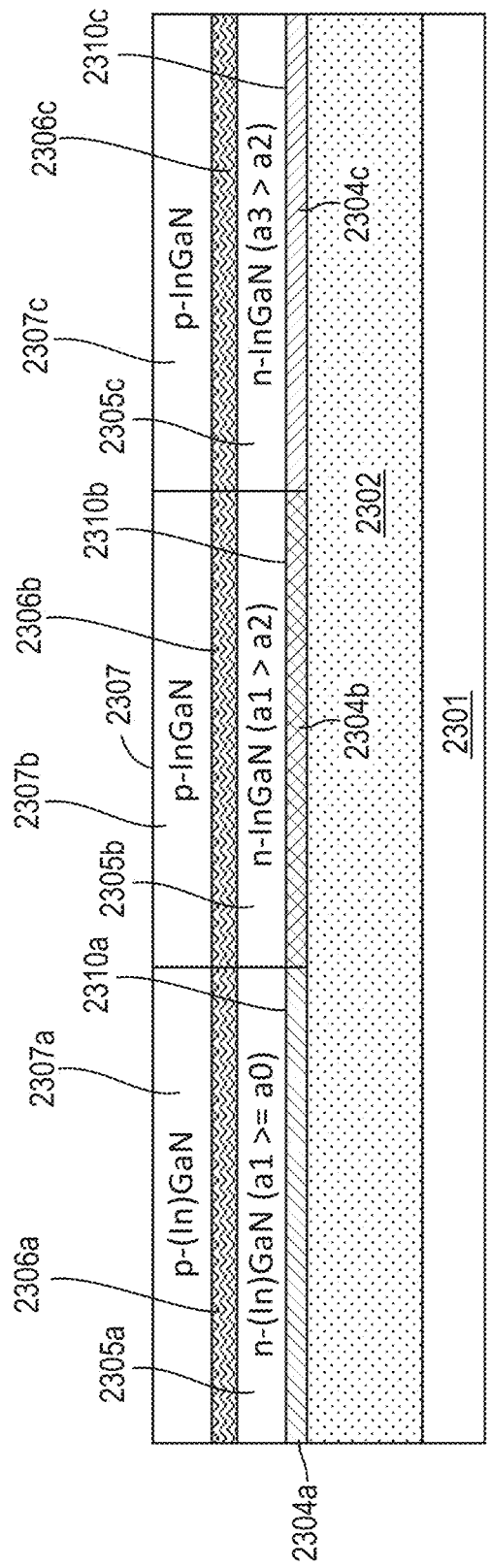
FIG. 23 shows epitaxial layers during an intermediate step in the fabrication of a multi-wavelength optoelectronic device provided by the present disclosure.

FIG. 23 shows the epitaxial layers of a multi-color optoelectronic structure at an intermediate step in a fabrication process.

As shown in FIG. 23, three different relaxed InGaN growth layers 2304a/2304b/2304c can be grown overlying a growth substrate such as GaN buffer layer 2302. The three relaxed InGaN growth layers 2304a/2304b/2304c comprise GaN seed regions having different patterns such as, for example, in terms of size, shape and fill-factor. InGaN grown on the differently patterned GaN seed regions will coalesce to from relaxed InGaN regions with respective (0001) InGaN growth regions 2310a/2310b/230c characterized by different in-plane a-lattice parameters and different InN molar fractions. Note that as shown in FIG. 23, region 2304a can comprise GaN and have an in-plane a-lattice parameter of a1=a0. Region 2304a can comprise relaxed (0001) InGaN region having an in-plane a-lattice parameter of a1≥a0.

Because the in-plane a-lattice parameters of the two or three (0001) InGaN growth regions 2310a/2310b/2310c are different, epitaxial InGaN layers including an active region grown overlying each of the three (0001) InGaN growth regions will be characterized by a different in-plane a-lattice parameter and a different InN molar fraction.

In a first step in an example of a fabrication process for making a multi-color optoelectronic structure, a GaN buffer layer 2302 characterized by an in-plane a-lattice parameter a0 can be deposited onto a substrate 2301.

Individual relaxed InGaN growth layers 2304a/2304b/2304c can independently be deposited onto discrete portions of the GaN buffer layer 2301. As shown in FIG. 23, the relaxed InGaN growth layer 2304 comprises three relaxed InGaN growth layers 2304a/2304b/2304c. Examples of relaxed InGaN growth layers are shown in FIGS. 1-6, 13, 15-17, 19, and 20. Each relaxed InGaN growth layer can comprise a patterned GaN seed region, a patterned masking region, a relaxed InGaN region, and a partially or substantially relaxed (0001) InGaN region.

The configuration of the patterned GaN seed region and patterned masking region can be different for each group of relaxed InGaN growth layers. The configuration of the patterned GaN seed regions and patterned masking regions can be selected such that each group of relaxed InGaN growth layers 2304a/2304b/2304c is configured to emit radiation within a selected wavelength range.

For example, each relaxed InGaN growth layer of a first group of relaxed InGaN growth layers can comprise the same or similar pattern of GaN seed regions and can be configured to emit radiation in a first wavelength range such as within a red wavelength range from 625 nm to 740 nm.

For example, each relaxed InGaN growth layer of a second group of relaxed InGaN growth layers can comprise the same or similar pattern of GaN seed regions and can be configured to emit radiation in a second wavelength range such as within a green wavelength range from 515 nm to 570 nm.

For example, each relaxed InGaN growth layer of a third group of relaxed InGaN growth layers can comprise the same or similar pattern of GaN seed regions and can be configured to emit radiation in a third wavelength range such as within a blue wavelength range from 400 nm to 495 nm.

The different groups of relaxed InGaN growth layers can be configured in regular arrays and/or can be configured to form pixels overlying the substrate. The configuration or arrangement may be Cartesian or may be tri-lateral (i.e., triangular or hexagonal relationship). The multiple relaxed InGaN growth layers can be configured as interleaved arrays.

The pattern of each group of relaxed InGaN growth layers can be different, for example, with respect to the pitch of the GaN seed structures, the height/depth of the GaN seed structures, the geometry of the GaN seed structures, the lateral dimensions of the GaN seed structures, and/or the growth facets of the GaN seed structures.

In the multi-color optoelectronic device shown in FIG. 23 there are three different relaxed InGaN growth layers 2304a/2304b/2304c with each relaxed InGaN growth layer having a respective relaxed (0001) InGaN growth region 2310a/230b/230c having a relaxed (0001) InGaN surface characterized by a different in-plane a-lattice parameter and different InN molar fraction.

As shown in FIG. 23, the relaxed (0001) InGaN growth region 2310a and relaxed (0001) InGaN surface of relaxed InGaN growth layer 2304a can have an in-plane a-lattice parameter a1 which is greater than or equal to the in-plane a-lattice parameter of GaN buffer layer 2302. Epitaxial layers grown overlying the (0001) InGaN growth region 2310a of relaxed InGaN growth layer 2304a including, for example, an n-type InGaN layer 2305a, active region 2306a, and p-type InGaN layer 2307a, will have an in-plane a-lattice parameter a1 with a commensurate InN molar fraction, capable of emitting radiation within a first wavelength range.

As shown in FIG. 23, the relaxed (0001) InGaN growth region 2310b and relaxed (0001) InGaN surface of relaxed InGaN growth layer 2304b can have an in-plane a-lattice parameter a2 which is greater than a1. Epitaxial layers grown overlying the (0001) InGaN growth region 2310b of relaxed InGaN growth layer 2304b including, for example, n-type InGaN layer 2305b, active region 2306b, and p-type InGaN layer 2307b, will have an in-plane a-lattice parameter a2 with a commensurate InN molar fraction, capable of emitting radiation within a second wavelength range.

As shown in FIG. 23, the relaxed (0001) InGaN growth region 2310c and relaxed (0001) InGaN surface of relaxed InGaN growth layer 2304c can have an in-plane a-lattice parameter a3 which is greater than a2. Epitaxial layers grown overlying the (0001) InGaN growth region 2310c of relaxed InGaN growth layer 2304c including n-type InGaN layer 2305c, active region 2306c, and p-type InGaN layer 2307c, will have an in-plane a-lattice parameter a3 with a commensurate InN molar fraction, capable of emitting radiation within a third wavelength range.

The structure can include additional groups of relaxed InGaN growth layers configured to emit radiation in additional wavelength ranges.

The relaxed InGaN growth layers can be fabricated as described herein to provide (0001) InGaN growth regions having a desired InN molar fraction and in-plane a-lattice parameter.

For example, as shown in FIG. 23, a first optoelectronic structure configured to emit radiation at wavelength 11 can be grown on a suitable substrate or on a conventional GaN buffer layer having in-plane a-lattice parameter a0.

An optional first mask (pattern 1) can be deposited overlying a first region 2304a of the GaN buffer layer 2302, while simultaneously different mask patterns (pattern 2 and pattern 3) are deposited in regions 2304b and 2304c.

Then, the wafer can be etched to expose the GaN buffer layer 2302 in each patterned GaN seed region.

After the GaN buffer layer is exposed in each region, epitaxial growth is performed to form GaN seed regions in each of the patterned regions. Once the GaN seed regions are formed, growth is switched to InGaN to coalesce over the patterned GaN seed regions and form (0001) InGaN growth regions 2310a/230b/230c of each of the respective relaxed InGaN growth layer 2304a/2304b/2304c. The different (0001) InGaN growth regions will have different a-lattice parameters according to the patterning of the GaN seed regions. Subsequently, and still in a single epitaxial deposition process an n-type InGaN layer 2305 can be deposited overlying each of the (0001) InGaN growth regions. The n-type InGaN layer 2305 comprises three n-type InGaN regions 2305a/2305b/2305c characterized by different in-plane a-lattice parameters and a different molar fraction of InN commensurate with the respective underlying (0001) InGaN growth regions 2310a/2310b/2310c of the relaxed InGaN growth layers 2304a/2304b/2304c.

The portion of the n-type InGaN layer 2305a overlying relaxed InGaN growth layer 2304a can have an in-plane a-lattice parameter a1 for which a1≥a0, the portion of n-type InGaN layer 2305b overlying relaxed InGaN growth layer 2304b can have an in-plane a-lattice parameter a2 for which a1≥a2, and the portion of the n-type InGaN layer 2305c overlying relaxed InGaN growth layer 2304c can have an in-plane a-lattice parameter a3 for which a3>a2.

After the n-type InGaN layer 2305 is deposited, an active layer 2306 can be deposited overlying the n-type InGaN layer 2305 in the same single epitaxial deposition process. The active layer 2306 can include a single epitaxial layer or multiple epitaxial layers. The active layer 2306 can comprise active regions 2306a/2306b/2306c having an in-plane a-lattice parameter and InN molar fraction commensurate with that of the underlying the respective portion of n-type InGaN layer 2205 and growth surface 2310 of relaxed InGaN growth layers 2304a/2304b/2304c.

After the active layer 2306 is deposited, a p-type InGaN layer 2307 can be deposited overlying the active layer 2306 in a single epitaxial deposition process. As with the underlying layers, the p-type InGaN layer 2307 can comprise p-type InGaN regions (not identified) having an in-plane a-lattice parameter and InN content commensurate with that of the underlying active layer, n-type InGaN layer, and growth surface 2310 of the relaxed InGaN growth layer 2304a/2304b/2304c.

The semiconductor structure shown in FIG. 23 can include additional epitaxial layers such as cladding layers, electron blocking layers, reflective layers, and others.

In FIG. 23, three different optoelectronic elements corresponding to relaxed InGaN growth layers 2304a/2304b/2304c, n-type InGaN regions 2305a/2305b/2305c, active regions 2306a/2306b/2306c, and p-type InGaN regions 2307a/2307b/2307c characterized by different in-plane a-lattice parameters and InN molar fraction are shown. However, more than three different relaxed InGaN growth layers having different relaxed (0001) InGaN growth regions can be fabricated on the wafer. The relaxed InGaN growth layers can be configured to form pixels. The multiple relaxed InGaN growth layers can be configured into interleaved arrays.

An InGaN growth layer can include a region that does not include a patterned GaN seed region in which case the (0001) InGaN growth region as well as the overlying epitaxial layers are pseudomorphic to GaN. This is reflected in FIG. 23 where region 2304 can be a non-patterned GaN seed region and the n-type InGaN region can be pseudomorphic to GaN and characterized by an in-plane a-lattice parameter a0 the same as GaN without In.

The semiconductor structure shown in FIG. 23 can subsequently be processed to isolate individual optoelectronic elements and to add electrodes.

The wafer can then be etched and metallized to provide electrical contacts.

Transparent conductive oxides (TCO), e.g., indium-tin-oxide (ITO), electrical contacts can be used on the p-type InGaN layer 2307 in an "epi-up" configuration. Alternatively, reflective contacts such as Ag-based contacts can be used in an inverted configuration.

The cathodes can be connected in common or can be isolated by insulating the separate optoelectronic elements such as by trench-etching between the individual elements down to an insulting mask layer or substrate, such as sapphire. The cathode metallization to the n-type InGaN layer 2305 can be, for example, TiAl. The first ($\lambda_1$), second ($\lambda_2$), and third ($\lambda_3$), wavelengths may be, for example, blue, green and red, respectively. However, optoelectronic elements configured to emit radiation within other wavelength ranges can be fabricated using methods provided by the present disclosure.

Figure 24:
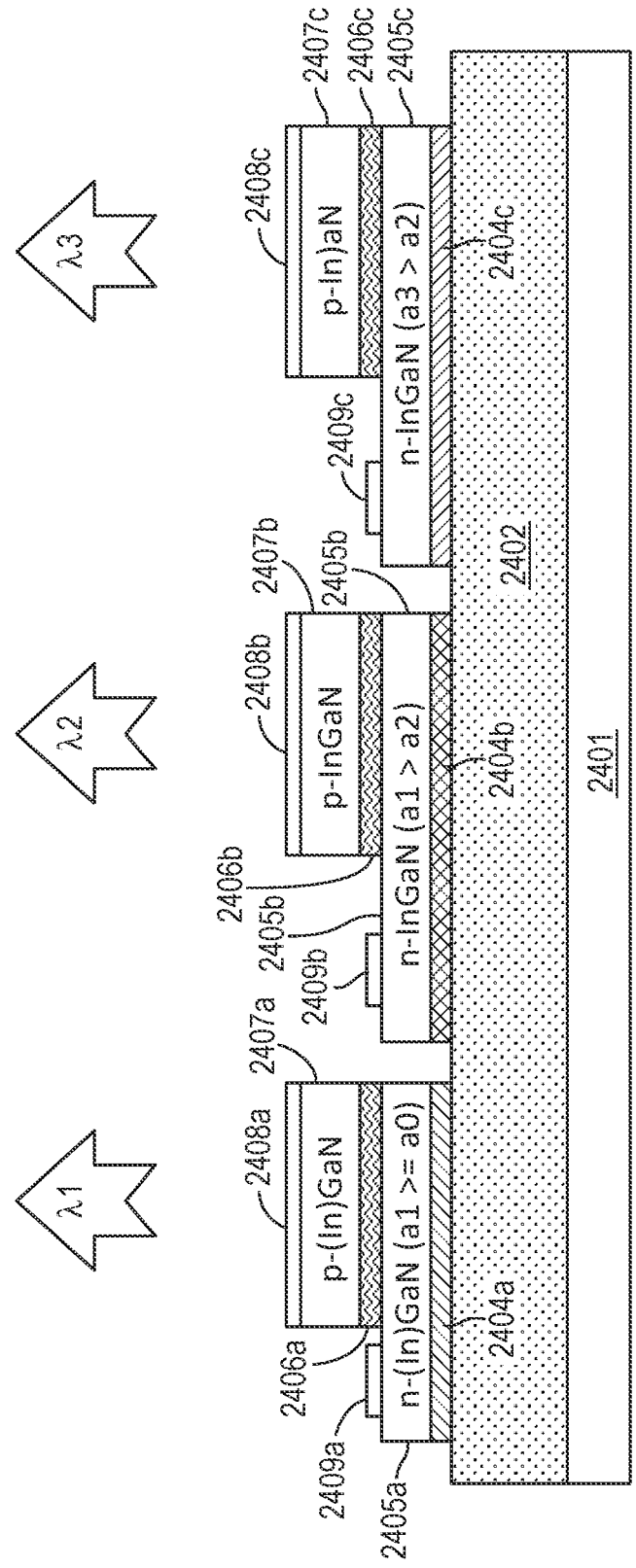
FIG. 24 shows an example of an optoelectronic device provided by the present disclosure having three isolated optoelectronic elements configured to emit radiation in different respective wavelength ranges grown on three different relaxed $In_xAl_yGa_{1-x-y}N$ growth layers overlying a single growth layer.

After the epitaxial layers are grown as described with respect to FIG. 23, the wafer can be etched and metallized to provide contacts to electrodes, as shown in FIG. 24.

An example of an optoelectronic device configured to emit radiation in three different wavelength ranges is shown in FIG. 24.

As shown in FIG. 24, the boundaries between base layers having different strain states, which may be defective, can be removed by etching down to the GaN buffer layer. Electrical contacts such as transparent conductive oxide (TCO) contacts can be deposited onto the p-type InGaN layers in an "epi-up" configuration. Alternatively, reflective contacts such as Ag-based contacts can be applied to the p-type InGaN layers in an inverted configuration. As shown in FIG. 24, the cathodes can be common or can be isolated by insulating the separate optoelectronic elements, for example, by trench-etching between the individual optoelectronic elements down to an insulting mask layer or insulating substrate, such as sapphire substrate.

Individual optoelectronic elements can be isolated and a portion of the n-InGaN layer of each of the elements can be exposed using known semiconductor fabrication methods.

A device having three optoelectronic elements is shown in FIG. 24.

A cathode 2409a/2409b/2409c can be applied overlying each of the n-type InGaN regions and an anode 2408a/2408b/2408c can be applied overlying each of the p-type InGaN regions.

As shown in FIG. 24, the optoelectronic device comprises a growth substrate 2401, a GaN buffer layer 2402, and three optoelectronic elements overlying the GaN buffer layer 2402.

The optoelectronic elements include a relaxed InGaN growth layer 2404a/2404b/2404c, an n-type InGaN region 2405a/2405b/2405c overlying the relaxed InGaN growth layer, an active region 2406a/2406b/2406c overlying the n-type InGaN region, and a p-type InGaN region 2407a/2407b/2407c overlying the respective active region.

As shown in FIG. 24 each of the optoelectronic elements emits radiation within a different wavelength range $\lambda 1$, $\lambda 2$, and $\lambda 3$.

The growth can be selectively patterned, and the overlying epitaxial layers can be deposited directly onto the selectively patterned substrate. By using a selectively patterned substrate it is not necessary to use intermediate GaN buffer layer between the growth substrate and the relaxed InGaN growth layer(s).

The emitting apertures of the various optoelectronic elements can independently be adjusted in number, size and shape, to optimize overall performance such as efficiency, contrast, and brightness uniformity. The emitting apertures can also be independently adjusted to obtain a desired optical effect.

In FIG. 24 the optoelectronic elements are configured as LEDs. The structure can be configured in substantially co-planar stripes to fabricate into edge-emitting laser diodes emitting different colors.

The active regions can also be integrated into vertical cavity resonators such as Distributed Bragg Reflector layer stacks to provide a plurality of co-planar VCSELs emitting within different wavelength ranges and grown on the same substrate.

Figure 25:
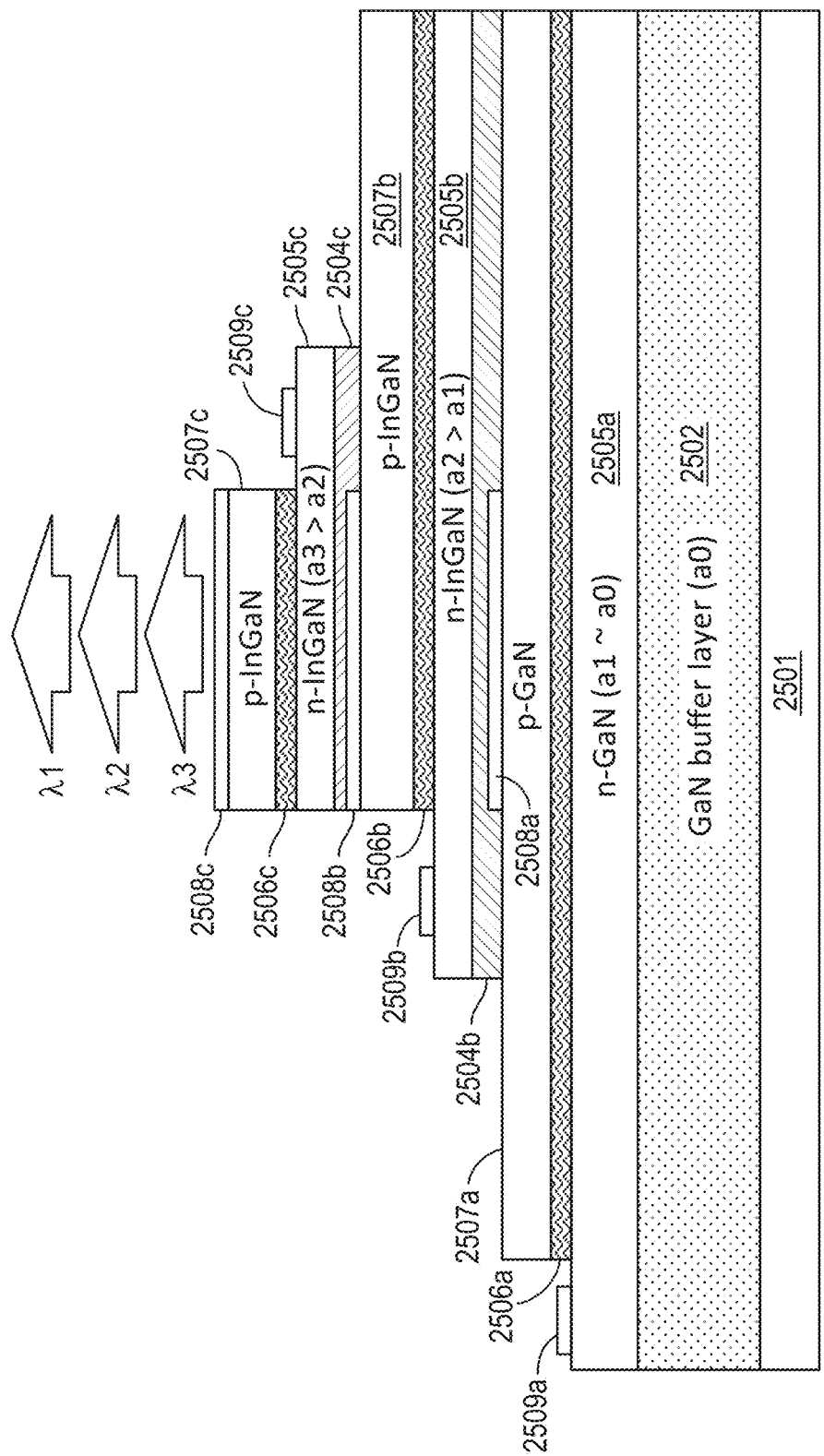
FIG. 25 shows an example of a stacked optoelectronic structure provided by the present disclosure.

FIG. 25 shows an example of a stacked optoelectronic device. In the example shown in FIG. 25 the stacked optoelectronic element is configured to emit radiation in three different wavelength ranges, $\lambda 1$, $\lambda 2$, and 3.

The stacked optoelectronic elements shown in FIG. 25 include a growth substrate 2501, and an overlying GaN layer 2502 having an in-plane a-lattice parameter a0.

The first optoelectronic element includes a first n-type GaN layer 2505a, an overlying first active region 2506a, and an overlying first p-type InGaN layer 2507a. As an alternative, the first optoelectronic element can comprise a first pattered region overlying the GaN layer 2502 and underlying a first n-type InGaN layer.

The second optoelectronic element includes a first relaxed InGaN growth layer 2504b coalesced over a second patterned GaN seed region and an overlying second n-type InGaN layer 2505b having an in-plane a-lattice parameter a2>a1, an overlying second active layer 2506b, and a second p-type InGaN layer 2507b overlying the second active layer 2506b.

The third stacked optoelectronic element includes a second relaxed InGaN growth layer 2504c coalesced over a second patterned GaN seed region and overlying the second p-type InGaN layer 2507b, an n-type InGaN layer 2505c having an in-plane a-lattice parameter a3>a2 overlying the second relaxed InGaN growth layer 2504c, a third active layer 2506c overlying the third n-type InGaN layer 2505c, and a third p-type InGaN layer 2507c overlying the third active layer 2506c.

Transparent electrodes 2508a/2508b/2508c overly p-type InGaN layers 2507a/2507b/2507c, respectively, and are configured to pass radiation emitted by underlying optoelectronic elements.

The stacked optoelectronic device shown in FIG. 25 includes cathodes 2509a/2509b/2509c overlying and electrically interconnected to n-type InGaN layer 2505a/2505b/2505c, respectively.

The first optoelectronic element is configured to emit radiation in a first wavelength range $\lambda 1$, the second optoelectronic element is configured to emit radiation in a second wavelength range $\lambda 2$, and the third optoelectronic element is configured to emit radiation in a third wavelength range $\lambda 3$.

It can be desirable that the materials comprising each optoelectronic element are transparent to radiation emitted by the active region of underlying optoelectronic elements. In other words, a "fully transparent" epitaxial stack is desired, for all emitted wavelengths corresponding to emissions from the different active regions. To achieve this, the growth conditions and composition of the highest InN molar fraction base layer is selected to be transparent to emission from the active layer associated with the lowest InN molar fraction region. For example, in the case of an RGB-emitting device, the composition of the base layer for a red-emitting active region is selected to be substantially transparent to the emission of an underlying blue-emitting active region.

Using known bandgap vs. alloy composition parameters for InGaN, this all-epitaxial-transparency can be achieved, for example, for red, green, blue emitters grown on an InGaN base layer having regions with different InGaN compositions and in-plane a-lattice parameters, where the overlying InGaN layers are deposited in a single epitaxial growth process.

In certain aspects, a semiconductor structure comprises a first optoelectronic element and a second optoelectronic element wherein the first optoelectronic element comprises a first active layer characterized by a first in-plane a-lattice parameter; the second optoelectronic element comprises a second active layer characterized by a second in-plane a-lattice parameter; and the second in-plane a-lattice parameter is greater than the first in-plane a-lattice parameter.

The first optoelectronic element and the second optoelectronic element can overly a common substrate or may not overly a substrate. The semiconductor structure can be incorporated into an optoelectronic device.

In certain aspects, a semiconductor structure can comprise an InGaN layer such as a GaN buffer layer or a first relaxed InGaN growth layer and a second relaxed InGaN growth layer. The first relaxed InGaN growth layer can comprise a first relaxed (0001) InGaN region having a first in-plane a-lattice parameter, and the second relaxed InGaN growth layer can comprise a second relaxed (0001) InGaN region having a second in-plane a-lattice parameter, where the second in-plane a-lattice parameter is greater than the first in-plane a-lattice parameter. For example, first in-plane a-lattice parameter can differ, for example, by greater than 0.005 Å, by greater than 0.0075 Å, by greater than 0.01 Å, by greater than 0.05 Å, by greater than 0.1 Å, or by greater than 0.2 Å. For example, first in-plane a-lattice parameter can differ, for example, by greater than 0.2%, by greater than 0.3%, by greater than 0.5%, by greater than 1%, or by greater than 3%. The semiconductor structure can overly a common substrate. The semiconductor structure can comprise overlying epitaxial layers to form multiple optoelectronic elements. The optoelectronic elements can overly a common substrate or may not overly a substrate. The semiconductor structures can overly a common GaN buffer layer.

While the present disclosure describes detailed embodiments directed to the InGaN-GaN material system, the invention is not so limited and can be analogously applied to other systems, such as the AlGaN-AlN system which is interesting for ultra-violet emitters and detectors.

Aspects of the Invention

The invention is further defined by one or more of the following aspects.

Aspect 1. A semiconductor structure comprising:
a first relaxed (In)GaN growth layer comprising a first (0001) (In)GaN growth region;
a second relaxed InGaN growth layer, wherein the second relaxed InGaN growth layer comprises:
a patterned GaN seed region; and
a second (0001) InGaN growth region overlying the patterned GaN seed regions; and wherein,
the first (0001) (In)GaN growth region is characterized by a first in-plane a-lattice parameter;
the second (0001) InGaN growth region is characterized by a second in-plane a-lattice parameter; and
the second in-plane a-lattice parameter is greater than the first in-plane a-lattice parameter.

Aspect 2. The semiconductor structure of aspect 1, wherein the first relaxed (In)GaN growth layer and the second relaxed InGaN growth layer overly a common substrate, a common GaN buffer layer, or both a common substrate and a common GaN buffer layer.

Aspect 3. The semiconductor structure of aspect 2, wherein,
the substrate comprises a first substrate region and a second substrate region, wherein,
the first relaxed (In)GaN growth layer overlies the first substrate region; and the second relaxed InGaN growth layer overlies the second substrate region.

Aspect 4. The semiconductor structure of any one of aspects 2 to 3, wherein the substrate comprises sapphire, silicon, silicon-carbide, gallium-nitride, silicon-on-insulator (SOI), or aluminum-nitride.

Aspect 5. The semiconductor structure of any one of aspects 2 to 4, wherein,
the GaN buffer layer comprises a first GaN buffer region and a second GaN buffer region, wherein,
the first relaxed (In)GaN growth layer overlies the first GaN buffer region; and
the second relaxed InGaN growth layer overlies the second GaN buffer region.

Aspect 6. The semiconductor structure of aspect 5, wherein the GaN buffer layer has an in-plane a-lattice parameter of 3.189 Å.

Aspect 7. The semiconductor structure of any one of aspects 1 to 6, wherein the semiconductor structure comprises:
a first optoelectronic element overlying the first relaxed (In)GaN growth layer; and
a second optoelectronic element overlying the second relaxed InGaN growth layer.

Aspect 8. The semiconductor structure of aspect 7, wherein each of the first optoelectronic element independently comprises:
an n-type (In)GaN layer overlying the relaxed (In)GaN growth layer;
an active layer overlying the n-type (In)GaN layer; and a p-type (In)GaN layer overlying the active layer.

Aspect 9. The semiconductor structure of aspect 8, wherein the active layer is characterized by the in-plane a-lattice parameter of the underlying (0001) InGaN growth region.

Aspect 10. The semiconductor structure of any one of aspects 1 to 9, wherein the second in-plane a-lattice parameter is greater that the first in-plane a-lattice parameter by greater than 0.005 Å.

Aspect 11. The semiconductor structure of any one of aspects 1 to 9, wherein the second in-plane a-lattice parameter is greater that the first in-plane a-lattice parameter by from 0.005 Å to 3.54 Å.

Aspect 12. The semiconductor structure of any one of aspects 1 to 11, wherein the first relaxed (In)GaN growth layer does not comprise a patterned GaN seed region.

Aspect 13. The semiconductor structure of any one of aspects 1 to 11, wherein each of the first relaxed (In)GaN growth layer and the second relaxed InGaN growth layer independently comprise:
a plurality of GaN seed regions;
a coalesced InGaN region between adjacent GaN seed regions;
a relaxed InGaN region overlying the plurality of GaN seed regions and the coalesced InGaN regions; and a (0001) InGaN growth region overlying the relaxed InGaN region.

Aspect 14. The semiconductor structure of any one of aspects 1 to 13, wherein the first (0001) (In)GaN growth region is characterized by an in-plane a-lattice parameter of 3.189 Å.

Aspect 15. The semiconductor structure of any one of aspects 1 to 13, wherein the first (0001) (In)GaN growth region is characterized by an in-plane a-lattice parameter greater than 3.189 Å.

Aspect 16. The semiconductor structure of any one of aspects 1 to 15, wherein the second (0001) growth InGaN region is characterized by an in-plane a-lattice parameter greater than 3.189 Å.

Aspect 17. The semiconductor structure of any one of aspects 1 to 15, wherein the second (0001) growth InGaN region is characterized by an in-plane a-lattice parameter from 3.189 Å to 3.545 Å.

Aspect 18. The semiconductor structure of any one of aspects 1 to 13, wherein,
the first (0001) (In)GaN growth region is characterized by an in-plane a-lattice parameter from 3.189 Å to 3.545 Å; and
the second (0001) InGaN growth region is characterized by an in-plane a-lattice parameter from 3.189 Å to 3.545 Å

Aspect 19. The semiconductor structure of any one of aspects 1 to 18, wherein,
the first (0001) (In)GaN growth region comprises a first InN molar fraction;
the second (0001) InGaN growth region comprises a second InN molar fraction; and
the second InN molar fraction is greater than the first InN molar fraction.

Aspect 20. The semiconductor structure of aspect 19, wherein the first InN molar fraction is 0 mol %.

Aspect 21. The semiconductor structure of aspect 19, wherein each of the first InN molar fraction and the second InN molar fraction is independently from 0 mol % to 100 mol %.

Aspect 22. The semiconductor structure of any one of aspects 1 to 21, wherein the first (In)GaN growth layer comprises GaN.

Aspect 23. The semiconductor structure of any one of aspects 1 to 21, wherein, the first (In)GaN growth layer comprises InGaN.

Aspect 24. The semiconductor structure of any one of aspects 1 to 21, wherein,
the first (In)GaN growth layer comprises a first InGaN, wherein the first (In)GaN growth layer comprises a first plurality of GaN seed regions characterized by a first pattern;
the second InGaN growth layer comprises a second plurality of GaN seed regions characterized by a second pattern; and
the first second pattern is different than the first pattern.

Aspect 25. The semiconductor structure of aspect 24, wherein the first and second patterns differ in the size of the GaN seed regions, the shape of the GaN seed regions, fill factor of the GaN seed regions, spacing of the GaN seed regions, crystallographic orientation of the GaN seed regions, the pattern of the seed regions, or a combination of any of the foregoing.

Aspect 26. The semiconductor structure of any one of aspects 1 to 25, comprising a dielectric region proximal to each of the GaN seed regions.

Aspect 27. The semiconductor structure of aspect 26, wherein the dielectric region comprises SiOx, SiNx, or AlOx.

Aspect 28. The semiconductor structure of any one of aspects 1 to 27, wherein each of the GaN seed regions comprises growth surfaces coplanar with a GaN crystallographic plane.

Aspect 29. The semiconductor structure of aspect 1, wherein,
a first (0001) InGaN region overlying the first plurality of GaN seed regions, wherein the first (0001) InGaN growth region is characterized by a first in-plane a-lattice parameter and a first InN molar fraction; and
a second (0001) InGaN growth region overlying the second plurality of GaN seed regions, wherein the second (0001) InGaN region is characterized by a second in-plane a-lattice parameter and a second InN molar fraction.

Aspect 30. The semiconductor structure of aspect 29, wherein the (0001) InGaN growth region is characterized by an in-plane a-lattice parameter that is greater than 3.189 Å.

Aspect 31. The semiconductor structure of aspect 29, wherein the in-plane a-lattice parameter is within a range from 3.19 Å to 3.54 Å.

Aspect 32. The semiconductor structure of any one of aspects 29 to 31, wherein each of the GaN seed regions comprises $In_xGa_{1-x}N$ ($0 \leq x < 1$) and a Wurtzite III-nitride crystal structure.

Aspect 33. The semiconductor structure of any one of aspects 29 to 32, wherein each of the GaN seed regions has 6 planar GaN seed facets.

Aspect 34. The semiconductor structure of any one of aspects 29 to 33, wherein each of the GaN seed regions is characterized by a hexagonal base.

Aspect 35. The semiconductor structure of any one of aspects 29 to 34, wherein each of the GaN seed regions comprises seed surfaces coplanar with a crystallographic plane of GaN.

Aspect 36. The semiconductor structure of aspect 35, wherein each of the crystallographic planes is a crystallographically equivalent {10-11} plane.

Aspect 37. The semiconductor structure of aspect 35, wherein each of the crystallographic planes is a crystallographically equivalent {1-100} plane.

Aspect 38. The semiconductor structure of aspect 35, wherein each of the crystallographic planes is a crystallographically equivalent {11-20} plane.

Aspect 39. The semiconductor structure of aspect 35, wherein each of the crystallographic planes is a plane rotated about a {1-100} plane or a {11-20} plane.

Aspect 40. The semiconductor structure of aspect 35, wherein a region at a midpoint between GaN seed regions is a coalesced InGaN region.

Aspect 41. The semiconductor structure of any one of aspects 29 to 40, wherein the relaxed InGaN layer comprises more than one relaxed InGaN region wherein each relaxed InGaN region has a different InN molar fraction.

Aspect 42. The semiconductor structure of aspects 29 to 40, wherein each of the first relaxed InGaN growth layer and the second relaxed InGaN growth layer is independently configured to provide a (0001) InGaN growth region having a defined degree of in-plane a-lattice relaxation.

Aspect 43. The semiconductor structure of any one of aspects 29 to 42, wherein each of the first InGaN growth layer and the second InGaN growth layer is independently configured to have a (0001) InGaN growth region characterized by a different in-plane a-lattice parameter.

Aspect 44. The semiconductor structure of any one of aspects 29 to 43, wherein each of the first InGaN growth layer and the second InGaN growth layer is independently configured to have a (0001) InGaN growth region characterized by a different InN molar fraction.

Aspect 45. The semiconductor structure of any one of aspects 1 to 44, comprising:
a first n-type (In)GaN layer overlying the first relaxed (In)GaN growth layer;
a first active layer overlying the first n-type (In)GaN layer;
a first p-type (In)GaN layer overlying the first active layer.
a second n-type (In)GaN layer overlying the second relaxed (In)GaN growth layer;
a second active layer overlying the second n-type (In)GaN layer; and a second p-type (In)GaN layer overlying the second active layer.

Aspect 46. The semiconductor structure of aspect 45, wherein the first n-type (In)GaN layer comprises GaN.

Aspect 47. The semiconductor structure of aspect 45, wherein the first n-type (In)GaN layer comprises InGaN.

Aspect 48. The semiconductor structure of aspect 47, wherein each of the first n-type InGaN layer and the second n-type InGaN layer independently has an in-plane a-lattice parameter equivalent to that of the respective underlying (0001) (In)GaN region.

Aspect 49. The semiconductor structure of any one of aspects 45 to 48, wherein,
the first n-type (In)GaN layer is characterized by a first in-plane a-lattice parameter;
the second n-type InGaN layer is characterized by a second in-plane a-lattice parameter; and
the second in-plane a-lattice parameter is greater than the first in-plane a-lattice parameter.

Aspect 50. The semiconductor structure of any one of aspects 45 to 49, wherein each of the first n-type InGaN layer and the second n-type InGaN layer is independently characterized by an in-plane a-lattice parameter that is equivalent to that of the respective underling (0001) (In)GaN region.

Aspect 51. The semiconductor structure of any one of aspects 45 to 50, wherein,
the first n-type (In)GaN layer comprises a first InN molar fraction;
the second n-type InGaN layer comprises a second InN molar fraction; and
the second InN molar fraction is greater than the first InN molar fraction.

Aspect 52. The semiconductor structure of any one of aspects 45 to 51, wherein the first active layer comprises more than one first active layers.

Aspect 53. The semiconductor structure of any one of aspects 45 to 52, wherein the second active layer comprises more than one active layer.

Aspect 54. The semiconductor structure of any one of aspects 45 to 51, wherein each of the first active layer and the second active layer comprises more than one active layer.

Aspect 55. The semiconductor structure of any one of aspects 45 to 54, wherein the first active layer comprises from 1 to 40 active layers, the second active region comprises from 1 to 40 active layers, or each of the first active layer and the second active layer comprises from 1 to 40 active layers.

Aspect 56. The semiconductor structure of any one of aspects 45 to 55, wherein,
the first active layer comprises a first InN molar fraction;
the second active layer comprises a second InN molar fraction; and
the second InN molar fraction is greater than the second InN molar fraction.

Aspect 57. The semiconductor structure of any one of aspects 45 to 56, wherein,
the first active layer is characterized by a first in-plane strain value;
the second active layer is characterized by a second in-plane strain value; and
the first strain value is similar to the second strain value.

Aspect 58. The semiconductor structure of aspect 57, wherein the second in-plane strain value is within 10% of the first in-plane strain value.

Aspect 59. The semiconductor structure of aspect 57, wherein the second in-plane strain value is within 1% of the first in-plane strain value.

Aspect 60. The semiconductor structure of aspect 57, wherein each of the first strain value and the second strain value is independently in a range from 1% to 2% of a compressive strain.

Aspect 61. The semiconductor structure of any one of aspects 45 to 60, wherein each of the first active layer and the second active layer comprises a multiple quantum well structure.

Aspect 62. The semiconductor structure of any one of aspects 45 to 61, wherein each of the first active layer and the second active layer comprises a light emitting diode structure.

Aspect 63. The semiconductor structure of any one of aspects 45 to 62, wherein each of the first active layer and the second active layer comprises a laser diode structure.

Aspect 64. The semiconductor structure of any one of aspects 45 to 63, wherein,
the first p-type (In)GaN layer is characterized by a first in-plane a-lattice parameter;
the second p-type InGaN layer is characterized by a second in-plane a-lattice parameter; and
the second in-plane a-lattice parameter is greater than the first in-plane a-lattice parameter.

Aspect 65. The semiconductor structure of any one of aspects 45 to 64, wherein each of the first p-type InGaN layer and the second p-type InGaN layer is independently characterized by an in-plane a-lattice parameter that is equivalent to that of the respective underlying (0001) (In)GaN region.

Aspect 66. The semiconductor structure of any one of aspects 45 to 65, wherein,
the first p-type (In)GaN layer comprises a first InN molar fraction;
the second p-type InGaN layer comprises a second InN molar fraction; and
the second InN molar fraction is greater than the first InN molar fraction.

Aspect 67. The semiconductor structure of any one of aspects 45 to 66, wherein each of the first p-type (In)GaN layer and the second p-type InGaN layer independently has an in-plane a-lattice parameter in a range from 3.19 Å to 3.35 Å.

Aspect 68. The semiconductor structure of any one of aspects 7 to 67, wherein the first optoelectronic element and the second optoelectronic element are configured to emit radiation within a different wavelength range.

Aspect 69. The semiconductor structure of any one of aspects 7 to 68, wherein each of the first optoelectronic element and the second optoelectronic element independently comprises a light-emitting diode, a laser diode, or a vertical cavity surface emitting laser.

Aspect 70. The semiconductor structure of any one of aspects 7 to 69, further comprising: a cathode electrically connected to each of the first n-type (In)GaN layer and to the second InGaN layer; and
an anode electrically connected to each of the first p-type (In)GaN layer and to the second p-type InGaN layers.

Aspect 71. The semiconductor structure of aspect 70, wherein the cathode comprises Ti and Al.

Aspect 72. The semiconductor structure of any one of aspects 70 to 71, wherein the cathode is interconnected to each of the first n-type (In)GaN layer and to the second InGaN layer in common.

Aspect 73. The semiconductor structure of any one of aspects 70 to 72, wherein the cathode is independently interconnected to each the first n-type (In)GaN layer and to the second InGaN layer in common.

Aspect 74. The semiconductor structure of any one of aspects 73 to 73, wherein the anode comprises a transparent conductive oxide layer or a reflective contact.

Aspect 75. The semiconductor structure of any one of aspects 73 to 74, wherein the anode is interconnected to each of the first n-type (In)GaN layer and to the second InGaN layer in common.

Aspect 76. The semiconductor structure of any one of aspects 73 to 75, wherein the anode is independently interconnected to each the first n-type (In)GaN layer and to the second InGaN layer in common.

Aspect 77. The semiconductor structure of any one of aspects 7 to 76, wherein each of the first optoelectronic element and the second optoelectronic element are electrically isolated from each other.

Aspect 78. A semiconductor device comprising the semiconductor structure of any one of aspects 1 to 77.

Aspect 79. A lighting system or a display system comprising the semiconductor device of aspect 78.

Aspect 80. A method of fabricating a semiconductor structure, comprising: (a) depositing a first relaxed (In)GaN growth layer overlying a first substrate region of a substrate; and
(b) depositing a second relaxed InGaN growth layer overlying a second substrate region of the substrate, wherein the second relaxed InGaN growth layer comprises a patterned GaN seed region,
wherein,
the first relaxed (In)GaN growth layer comprises a first (0001) (In)GaN region characterized by a first in-plane a-lattice parameter;
the second relaxed InGaN growth layer comprises a second (0001) InGaN region characterized by a second in-plane a-lattice parameter; and
the second in-plane a-lattice parameter is greater than the first in-plane a-lattice parameter.

Aspect 81. The method of aspect 80, wherein depositing the second relaxed InGaN growth layer comprises:
fabricating a patterned GaN seed region;

growing InGaN on the GaN seed regions to cause InGaN grown on adjacent seed regions to coalesce and to form a relaxed InGaN region; and growing the relaxed InGaN region to provide a (0001) InGaN growth region.

Aspect 82. The method of aspect 80, comprising, after depositing the first relaxed (In)GaN growth layer and depositing the second relaxed InGaN growth layer, fabricating a first optoelectronic element overlying the first relaxed InGaN growth layer and fabricating a second optoelectronic element overlying the second relaxed InGaN growth layer.

Aspect 83. The method of any one of aspects 80 to 82, wherein, the first optoelectronic element comprises epitaxial layers overlying the first relaxed (In)GaN growth layer; and the second optoelectronic element comprises epitaxial layers overlying the second relaxed InGaN growth layer.

Aspect 84. The method of any one of aspects 80 to 83, wherein the epitaxial layers comprise an n-type (In)GaN layer, an active layer, a p-type (In)GaN layer, or a combination of any of the foregoing.

Aspect 85. The method of any one of aspects 80 to 84, wherein the first relaxed (In)GaN growth layer comprises GaN.

Aspect 86. The method of any one of aspects 80 to 85, wherein the first relaxed (In)GaN growth layer comprises a first GaN seed region.

Aspect 87. The method of any one of aspects 80 to 86, wherein the method comprises simultaneously fabricating the first optoelectronic element and the second optoelectronic element.

Aspect 88. The method of any one of aspects 80 to 87, wherein the method comprises sequentially fabricating the first optoelectronic element and the second optoelectronic element.

Aspect 89. The method of any one of aspects 80 to 88, wherein each of the first optoelectronic element and the second optoelectronic element is independently selected from a light emitting diode, a laser diode, and a vertical cavity surface emitting laser.

Aspect 90. The method of any one of aspects 80 to 89, comprising, after depositing the first relaxed (In)GaN growth layer and depositing the second relaxed InGaN growth layer:

(c) depositing a first n-type (In)GaN layer overlying the first relaxed (In)GaN growth layer and depositing a second n-type InGaN layer overlying the second relaxed InGaN growth layer;

(d) depositing a first active layer overlying the first n-type (In)GaN layer and depositing a second active layer overlying the second n-type InGaN layer;

(e) depositing a first p-type (In)GaN layer overlying the first active layer and depositing a second p-type InGaN layer overlying the second active layer, wherein, the first active layer is characterized by a first in-plane a-lattice parameter;

the second active layer is characterized by a second in-plane a-lattice parameter; and the second in-plane a-lattice parameter is greater than the first in-plane a-lattice parameter.

Aspect 91. The method of aspect 90, wherein depositing the first n-type (In)GaN layer and depositing the second n-type InGaN layer comprises simultaneously depositing.

Aspect 92. The method of aspect 90, wherein depositing the first n-type (In)GaN layer and depositing the second n-type InGaN layer comprises independently depositing.

Aspect 93. The method of any one of aspects 90 to 92, wherein depositing the first active layer and depositing the second active layer comprises simultaneously depositing.

Aspect 94. The method of any one of aspects 90 to 92, wherein depositing the first active layer and depositing the second active layer comprises independently depositing.

Aspect 95. The method of any one of aspects 90 to 94, wherein depositing the first p-type (In)GaN layer and depositing the second p-type InGaN layer comprises simultaneously depositing.

Aspect 96. The method of any one of aspects 90 to 94, wherein depositing the first p-type (In)GaN layer and depositing the second p-type InGaN layer comprises independently depositing.

Aspect 97. The method of any one of aspects 90 to 96, wherein simultaneously depositing comprises depositing using the same deposition conditions.

Aspect 98. The method of any one of aspects 90 to 96, wherein independently depositing comprises depositing using different deposition conditions.

Aspect 99. The method of any one of aspects 80 to 98, comprising depositing electrical contacts overlying each of the n-type (In)GaN layers.

Aspect 100. The method of any one of aspects 80 to 99, comprising depositing electrical contacts overlying each of the p-type (In)GaN layers.

Aspect 101. A semiconductor structure fabricated using the method of any one of aspects 80 to 100.

Aspect 102. A semiconductor device comprising the semiconductor structure of aspect 101.

Aspect 103. The semiconductor device of aspect 102, wherein the semiconductor device comprises a lighting system or a display system.

Aspect 1 Å. A Wurtzite III-nitride crystal semiconductor structure comprising:

a substrate comprising a first substrate region and a second substrate region;

a first $In_{x1}Al_{y1}Ga_{1-x1-y1}N$ growth layer comprising a first (0001) $In_{x1}Al_{y1}Ga_{1-x1-y1}N$ growth region overlying the first substrate region;

a second patterned $In_{x2s}Al_{y2s}Ga_{1-x2s-y2s}N$ seed region overlying the second substrate region;

a second $In_{x2}Al_{y2}Ga_{1-x2-y2}N$ growth layer comprising a second (0001) $In_{x2}Al_{y2}Ga_{1-x2-y2}N$ growth region overlying the second patterned $In_{x2s}Al_{y2s}Ga_{1-x2s-y2s}N$ seed region, wherein, the first (0001) $In_{x1}Al_{y1}Ga_{1-x1-y1}N$ growth region is characterized by a first in-plane a-lattice parameter;

the second (0001) $In_{x2}Al_{y2}Ga_{1-x2-y2}N$ growth region is characterized by a second in-plane a-lattice parameter;

the second in-plane a-lattice parameter is greater than the first in-plane a-lattice parameter;

$$0 \leq x2s \leq 1, 0 \leq y2s \leq 1, \text{ and } x2s + y2s \leq 1$$

$$0 \leq x1 \leq 1, 0 \leq y1 \leq 1, \text{ and } x1 + y1 \leq 1; \text{ and}$$

$$0 < x2 \leq 1, 0 \leq y2 \leq 1, x2 + y2 \leq 1, \text{ and } x2 > x1.$$

Aspect 2A. The semiconductor structure of aspect 1A, wherein the first $In_{x1}Al_{y1}Ga_{1-x1-y1}N$ growth layer is a GaN layer comprising a first (0001) GaN growth region.

Aspect 3A. The semiconductor structure of aspect 1A, wherein the first $In_{x1}Al_{y1}Ga_{1-x1-y1}N$ growth layer is an $In_{x1}Ga_{1-x1}N$ layer comprising a first (0001) $In_{x1}Ga_{1-x1}N$ growth region.

Aspect 4A. The semiconductor structure of aspect 1A, wherein the first $In_{x1}Al_{y1}Ga_{1-x1-y1}N$ growth layer is an $In_{x1}Al_{y1}Ga_{1-x1-y1}N$ layer comprises a first (0001) $In_{x1}Al_{y1}Ga_{1-x1-y1}N$ growth region, wherein $0 \leq x1 < 1$, $0 \leq y1 < 1$, and $x1+y1 \leq 1$.

Aspect 5A. The semiconductor structure of any one of aspects 1A to 4A, wherein the second patterned $In_{x2s}Al_{y2s}Ga_{1-x2s-y2s}N$ seed region comprises a patterned GaN seed region.

Aspect 6A. The semiconductor structure of any one of aspects 1A to 4A, wherein the second patterned $In_{x2s}Al_{y2s}Ga_{1-x2s-y2s}N$ seed region comprises a patterned $In_{x2s}Ga_{1-x2s}N$ seed region.

Aspect 7A. The semiconductor structure of any one of aspects 1A to 4A, wherein the second patterned $In_{x2s}Al_{y2s}Ga_{1-x2s-y2s}N$ seed region comprises a patterned $In_{x2s}Al_{y2s}Ga_{1-x2s-y2s}N$ seed region, wherein $0 \leq x2s < 1$, $0 < y2s < 1$, and $x2s+y2s \leq 1$.

Aspect 8A. The semiconductor structure of any one of aspects 1A to 7A, wherein the second (0001) $In_{x2}Al_{y2}Ga_{1-x2-y2}N$ growth region comprises a second (0001) $In_{x2}Ga_{1-x2}N$ growth region.

Aspect 9A. The semiconductor structure of any one of aspects 1A to 7A, wherein the second patterned $In_{x2s}Al_{y2s}Ga_{1-x2s-y2s}N$ seed region comprises a patterned AlN seed region.

Aspect 10A. The semiconductor structure of aspects 1A to 9A, comprising a first patterned $In_{x1s}Al_{y1s}Ga_{1-x1s-y1s}N$ seed region underlying the first $In_{x1}Al_{y1}Ga_{1-x1-y1}N$ growth region, wherein, $$0 \leq x1s \leq 1, 0 \leq y1s \leq 1, \text{ and } x1s + y1s \leq 1;$$

each of the first patterned $In_{x1s}Al_{y1s}Ga_{1-x1s-y1s}N$ seed region and the second patterned $In_{x2s}Al_{y2s}Ga_{1-x2s-y2s}N$ seed region comprise the same composition.

Aspect 11A. The semiconductor structure of any one of aspects 1A to 9A, comprising a first patterned $In_{x1s}Al_{y1s}Ga_{1-x1s-y1s}N$ seed region underlying the first $In_{x1}Al_{y1}Ga_{1-x1-y1}N$ growth region, wherein, $$0 \leq x1s \leq 1, 0 \leq y1s \leq 1, \text{ and } x1s + y1s \leq 1;$$

each of the first patterned $In_{x1s}Al_{y1s}Ga_{1-x1s-y1s}N$ seed region and the second patterned $In_{x2s}Al_{y2s}Ga_{1-x2s-y2s}N$ seed region comprise a different composition.

Aspect 12A. The semiconductor structure of any one of aspects 1A to 1A1, wherein each of the first $In_{x1}Al_{y1}Ga_{1-x1-y1}N$ growth layer and the second $In_{x2}Al_{y2}Ga_{1-x2-y2}N$ growth layer comprise a different composition.

Aspect 13A. The semiconductor structure of any one of aspects 1A to 12A, wherein a first plane parallel to a (0001) plane of the Wurtzite III-nitride structure and intersecting a first patterned $In_{x1s}Al_{y1s}Ga_{1-x1s-y1s}N$ seed region, $0 \leq x1s \leq 1$, $0 \leq y1s \leq 1$, and $x1s+y1s \leq 1$, is characterized by:

an intersection of the first plane and a first edge of the first patterned seed region locates a first $In_{x1s}Al_{y1s}Ga_{1-x1s-y1s}N/In_{x1}Al_{y1}Ga_{1-x1-y1}N$ heterojunction; and the first $In_{x1s}Al_{y1s}Ga_{1-x1s-y1s}N/In_{x1}Al_{y1}Ga_{1-x1-y1}N$ heterojunction is coplanar with a first crystallographic plane of the seed region, a facet of the seed region, or a combination thereof.

Aspect 14A. The semiconductor structure of aspect 13A, wherein the first $In_{x1s}Al_{y1s}Ga_{1-x1s-y1s}N/In_{x1}Al_{y1}Ga_{1-x1-y1}N$ heterojunction comprises a grading of composition from x1s and y1s to x1 and y1.

Aspect 15A. The semiconductor structure of any one of aspects 13A to 14A, wherein any second plane parallel to the (0001) plane of the Wurtzite III-nitride crystal structure and intersecting a second edge of the seed region locates a second $In_{x1s}Al_{y1s}Ga_{1-x1s-y1s}N/In_{x1}Al_{y1}Ga_{1-x1-y1}N$ heterojunction, wherein the second $In_{x1s}Al_{y1s}Ga_{1-x1s-y1s}N/In_{x1}Al_{y1}Ga_{1-x1-y1}N$ heterojunction is coplanar with a second crystallographic plane of the seed region.

Aspect 16A. The semiconductor structure of aspect 15A, wherein each of the first crystallographic plane and the second crystallographic plane is crystallographically equivalent.

Aspect 17A. The semiconductor structure of any one of aspects 1A to 12A, wherein a first plane parallel to a (0001) plane of the Wurtzite III-nitride structure and intersecting the second patterned $In_{x2s}Al_{y2s}Ga_{1-x2s-y2s}N$ seed region is characterized by:

an intersection of the first plane and a first edge of the first patterned seed region locates a first $In_{x2s}Al_{y2s}Ga_{1-x2s-y2s}N/In_{x2}Al_{y2}Ga_{1-x2-y2}N$ heterojunction; and the first $In_{x2s}Al_{y2s}Ga_{1-x2s-y2s}N/In_{x2}Al_{y2}Ga_{1-x2-y2}N$ heterojunction is coplanar with a first crystallographic plane of the seed region.

Aspect 18A. The semiconductor structure of aspect 17A, wherein the first $In_{x2s}Al_{y2s}Ga_{1-x2s-y2s}N/In_{x2}Al_{y2}Ga_{1-x2-y2}N$ heterojunction comprises a grading of composition from x2s and y2s to x2 and y2.

Aspect 19A. The semiconductor structure of any one of aspects 17A to 18A, wherein any second plane parallel to the (0001) plane of the Wurtzite III-nitride crystal structure and intersecting a second edge of the seed region locates a second $In_{x2s}Al_{y2s}Ga_{1-x2s-y2s}N/In_{x2}Al_{y2}Ga_{1-x2-y2}N$ heterojunction, wherein the second $In_{x2s}Al_{y2s}Ga_{1-x2s-y2s}N/In_{x2}Al_{y2}Ga_{1-x2-y2}N$ heterojunction is coplanar with a second crystallographic plane of the seed region.

Aspect 20A. The semiconductor structure of aspect 19A, wherein each of the first crystallographic plane and the second crystallographic plane is crystallographically equivalent.

Aspect 21A. The semiconductor structure of any one of aspects 1A to 20A, wherein the first (0001) $In_{x1}Al_{y1}Ga_{1-x1-y1}N$ growth region is characterized by an in-plane a-lattice parameter of about 3.19 Å.

Aspect 22A. The semiconductor structure of any one of aspects 1A to 20A, wherein the second (0001) $In_{x2}Al_{y2}Ga_{1-x2-y2}N$ growth region is characterized by an in-plane a-lattice parameter that is greater than 3.19 Å, Aspect 23A. The semiconductor structure of any one of aspects 1A to 20A, wherein, the first (0001) $In_{x1}Al_{y1}Ga_{1-x1-y1}N$ growth region is characterized by a first in-plane a-lattice parameter that is greater than 3.19 Å;

the second (0001) $In_{x2}Al_{y2}Ga_{1-x2-y2}N$ growth region is characterized by a second in-plane a-lattice parameter that is greater than 3.19 Å; and the first in-plane a-lattice parameter is different than the second in-plane a-lattice parameter by more than 0.2%.

Aspect 24A. The semiconductor structure of any one of aspects 1A to 23A, wherein the substrate comprises sapphire, silicon, silicon-carbide, gallium-nitride, silicon-on-insulator (SOI), gallium oxide, or aluminum-nitride.

Aspect 25A. The semiconductor structure of any one of aspects 1A to 24A, wherein the first $In_{x1}Al_{y1}Ga_{1-x1-y1}N$ growth layer and the second $In_{x2}Al_{y2}Ga_{1-x2-y2}N$ growth layer overly a common GaN buffer layer, wherein the common GaN buffer layer overlies the substrate.

Aspect 26A. The semiconductor structure of aspect 25A, wherein, the GaN buffer layer comprises a first GaN buffer region and a second GaN buffer region;

the first $In_{x1}Al_{y1}Ga_{1-x1-y1}N$ growth layer overlies the first GaN buffer region; and the second $In_{x2}Al_{y2}Ga_{1-x2-y2}N$ growth layer overlies the second GaN buffer region.

Aspect 27A. The semiconductor structure of aspect 25A, wherein the GaN buffer layer has an in-plane a-lattice parameter of about 3.189 Å.

Aspect 28A. The semiconductor structure of any one of aspects 1A to 27A, wherein the semiconductor structure comprises:

(a) a first optoelectronic element overlying the first $In_{x1}Al_{y1}Ga_{1-x1-y1}N$ growth layer; and (b) a second optoelectronic element overlying the second $In_{x2}Al_{y2}Ga_{1-x2-y2}N$ growth layer.

Aspect 29A. The semiconductor structure of any one of aspects 1A to 24A, wherein the semiconductor structure comprises:

(a) a first optoelectronic element overlying the first (0001) $In_{x1}Al_{y1}Ga_{1-x1-y1}N$ growth region; and (b) a second optoelectronic element overlying the second (0001) $In_{x2}Al_{y2}Ga_{1-x2-y2}N$ growth region.

Aspect 30A. The semiconductor structure of any one of aspects 28A to 29A, wherein, the first optoelectronic element comprises:
an n-type $In_{x1}Al_{y1}Ga_{1-x1-y1}N$ layer overlying the first (0001) $In_{x1}Al_{y1}Ga_{1-x1-y1}N$ growth layer;
a first $In_{x1}Al_{y1}Ga_{1-x1-y1}N$ active region overlying the n-type $In_{x1}Al_{y1}Ga_{1-x1-y1}N$ layer; and
a p-type $In_{x1}Al_{y1}Ga_{1-x1-y1}N$ layer overlying the first $In_{x1}Al_{y1}Ga_{1-x1-y1}N$ active region; and the second optoelectronic element comprises:
an n-type $In_{x2}Al_{y2}Ga_{1-x2-y2}N$ layer overlying the second (0001) $In_{x2}Al_{y2}Ga_{1-x2-y2}N$ growth layer;
a second $In_{x1}Al_{y1}Ga_{1-x1-y1}N$ active region overlying the n-type $In_{x2}Al_{y2}Ga_{1-x2-y2}N$ layer; and
a p-type $In_{x2}Al_{y2}Ga_{1-x2-y2}N$ layer overlying the second $In_{x1}Al_{y1}Ga_{1-x1-y1}N$ active region.

Aspect 31A. The semiconductor structure of aspect 30A, wherein each of the first active region and the second active region is characterized by an in-plane a-lattice parameter of the underlying (0001) growth region.

Aspect 32A. The semiconductor structure of any one of aspects 30A to 31A, wherein, the first active region is characterized by a first in-plane a-lattice parameter;

the second active region is characterized by a second in-plane a-lattice parameter;

the second in-plane a-lattice parameter is greater that the first in-plane a-lattice parameter by greater than 0.005 Å.

Aspect 33A. The semiconductor structure of aspect 32A, wherein the second in-plane a-lattice parameter is greater that the first in-plane a-lattice parameter by from 0.005 Å to 0.54 Å.

Aspect 34A. The semiconductor structure of any one of aspects 1A to 33A, wherein the first $In_{x1}Al_{y1}Ga_{1-x1-y1}N$ growth layer is a GaN growth layer.

Aspect 35A. The semiconductor structure of any one of aspects 1A to 33A, wherein the first $In_{x1}Al_{y1}Ga_{1-x1-y1}N$ growth layer is a $In_{x1}Ga_{1-x1}N$ growth layer.

Aspect 36A. The semiconductor structure of any one of aspects 1A to 33A, wherein each of the first $In_{x1}Al_{y1}Ga_{1-x1-y1}N$ growth layer and the second $In_{x2}Al_{y2}Ga_{1-x2-y2}N$ growth layer independently overly a patterned GaN seed region, and comprise:

a coalesced region between adjacent GaN seed regions; and a (0001) growth region overlying the region.

Aspect 37A. The semiconductor structure of any one of aspects 1A to 36A, wherein the first (0001) $In_{x1}Al_{y1}Ga_{1-x1-y1}N$ growth region is a (0001) GaN growth region characterized by an in-plane a-lattice parameter of about 3.189 Å.

Aspect 38A. The semiconductor structure of any one of aspects 1A to 36A, wherein the first (0001) $In_{x1}Al_{y1}Ga_{1-x1-y1}N$ growth region is a (0001) $In_{x1}Ga_{1-x1}N$ growth region characterized by an in-plane a-lattice parameter greater than 3.189 Å.

Aspect 39A. The semiconductor structure of any one of aspects 1A to 38A, wherein the second (0001) $In_{x2}Al_{y2}Ga_{1-x2-y2}N$ growth region is characterized by an in-plane a-lattice parameter greater than 3.189 Å.

Aspect 40A. The semiconductor structure of any one of aspects 1A to 38A, wherein the second (0001) $In_{x2}Al_{y2}Ga_{1-x2-y2}N$ growth region is a (0001) $In_{x2}Ga_{1-x2}N$ growth region characterized by an in-plane a-lattice parameter greater than 3.189 Å.

Aspect 41A. The semiconductor structure of any one of aspects 1A to 38A, wherein the second (0001) $In_{x2}Al_{y2}Ga_{1-x2-y2}N$ growth region is characterized by an in-plane a-lattice parameter from 3.190 Å to 3.545 Å.

Aspect 42A. The semiconductor structure of any one of aspects 1A to 38A, wherein, the first (0001) $In_{x1}Al_{y1}Ga_{1-x1-y1}N$ growth region is characterized by a first in-plane a-lattice parameter from 3.189 Å to 3.545 Å;

the second (0001) $In_{x2}Al_{y2}Ga_{1-x2-y2}N$ growth region is characterized by a second in-plane a-lattice parameter from 3.189 Å to 3.545 Å; and wherein the second in-plane a-lattice parameter is greater than the first in-plane a-lattice parameter.

Aspect 43A. The semiconductor structure of any one of aspects 1A to 42A, wherein each of the first (0001) $In_{x1}Al_{y1}Ga_{1-x1-y1}N$ growth region and the second (0001) $In_{x2}Al_{y2}Ga_{1-x2-y2}N$ growth region is independently characterized by an in-plane a-lattice parameter within a range from 3.190 Å to 3.50 Å.

Aspect 44A. The semiconductor structure of any one of aspects 1A to 43A, wherein, the first (0001) $In_{x1}Al_{y1}Ga_{1-x1-y1}N$ growth region comprises a first InN molar fraction;

the second (0001) $In_{x2}Al_{y2}Ga_{1-x2-y2}N$ growth region comprises a second InN molar fraction; and the second InN molar fraction is greater than the first InN molar fraction.

Aspect 45A. The semiconductor structure of aspect 44A, wherein the first InN molar fraction is 0 mol %.

Aspect 46A. The semiconductor structure of aspect 44A, wherein each of the first InN molar fraction and the second InN molar fraction is independently greater than 0 mol %.

Aspect 47A. The semiconductor structure of aspect 44A, wherein each of the first InN molar fraction and the second InN molar fraction is independently greater than 0 mol % and less than 100 mol %.

Aspect 48A. The semiconductor structure of aspect 1A, wherein the first $In_{x1}Al_{y1}Ga_1.X_{1-y1}N$ growth layer is a GaN growth layer.

Aspect 49A. The semiconductor structure of aspect 1A, wherein, the first $In_{x1}Al_{y1}Ga_{1-x1-y1}N$ growth layer is a $In_{x1}Ga_{1-x1}N$ growth layer.

Aspect 50A. The semiconductor structure of any one of aspects 1A to 49A, wherein, the first $In_{x1}Al_{y1}Ga_{1-x1-y1}N$ growth layer overlies a first patterned $In_{x1s}Al_{y1s}Ga_{1-x1s-y1s}N$ seed region characterized by a first pattern, wherein 0≤x1s≤1, 0≤y1s≤1, and x1s+y1s≤1;

the second $In_{x2}Al_{y2}Ga_{1-x2-y2}N$ growth layer overlies the second patterned $In_{x2s}Al_{y2s}Ga_{1-x2s-y2s}N$ seed region characterized by a second pattern; and the first second pattern is different than the first pattern.

Aspect 51A. The semiconductor structure of aspect 50A, wherein, the first patterned $In_{x1s}Al_{y1s}Ga_{1-x1s-y1s}N$ seed region is a first patterned GaN region; and the second patterned $In_{x2s}Al_{y2s}Ga_{1-x2s-y2s}N$ seed region is a second patterned GaN region.

Aspect 52A. The semiconductor structure of any one of aspects 50A to 51A, wherein the first and second patterns differ in the size of the seed regions, the shape of the seed regions, fill factor of the seed regions, spacing of the seed regions, crystallographic orientation of the seed regions, the base geometry of the seed regions, the two-dimensional pattern of the seed regions, or a combination of any of the foregoing.

Aspect 53A. The semiconductor structure of any one of aspects 1A to 52A, comprising a dielectric region proximate to each of the seed regions.

Aspect 54A. The semiconductor structure of aspect 53A, wherein the dielectric region comprises $SiO_x$, $SiN_x$, $AlO_x$, or a combination of any of the foregoing.

Aspect 55A. The semiconductor structure of any one of aspects 1A to 54A, wherein, the first (0001) $In_{x1}Al_{y1}Ga_{1-x1-y1}N$ growth region overlies a first patterned $In_{x1s}Al_{y1s}Ga_{1-x1s-y1s}N$ seed region, wherein 0≤x1s≤1, 0≤y1s≤1, and x1s+y1s≤1; and each of the first patterned $In_{x1s}Al_{y1s}Ga_{1-x1s-y1s}N$ seed region the second patterned $In_{x2s}Al_{y2s}Ga_{1-x2s-y2s}N$ seed region comprises growth surfaces coplanar with a Wurtzite III-nitride crystallographic plane.

Aspect 56A. The semiconductor structure of any one of aspects 1A to 54A, wherein, the first (0001) $In_{x1}Al_{y1}Ga_{1-x1-y1}N$ growth region overlies a first patterned $In_{x1s}Al_{y1s}Ga_{1-x1s-y1s}N$ seed region, wherein 0≤x1s≤1, 0≤y1s≤1, and x1s+y1s≤1; and wherein the first (0001) $In_{x1}Al_{y1}Ga_{1-x1-y1}N$ growth region is characterized by a first in-plane a-lattice parameter and a first InN molar fraction;

the second (0001) $In_{x2}Al_{y2}Ga_{1-x2-y2}N$ growth region overlies the second patterned $In_{x2s}Al_{y2s}Ga_{1-x2s-y2s}N$ seed region, wherein the second (0001) $In_{x2}Al_{y2}Ga_{1-x2-y2}N$ growth region is characterized by a second in-plane a-lattice parameter and a second InN molar fraction;

the first in-plane a-lattice parameter is different than the second in-plane a-lattice parameter; and the first InN molar fraction is different than the second InN molar fraction.

Aspect 57A. The semiconductor structure of any one of aspects 54A to 55A, wherein each of the first in-plane a-lattice parameter and the second in-plane a-lattice parameter is independently greater than 3.189 Å.

Aspect 58A. The semiconductor structure of any one of aspects 54A to 55A, wherein each of the first in-plane a-lattice parameter and the second in-plane a-lattice parameter is independently within a range from 3.189 Å to 3.54 Å.

Aspect 59A. The semiconductor structure of any one of aspects 55A to 58A, wherein, the first patterned seed region comprises $In_{x1s}Ga_{1-x1s}N$ and is characterized by a Wurtzite III-nitride crystal structure, wherein 0≤x1s<1; and the second patterned seed region comprises $In_{x2s}Ga_{1-x2s}N$ and is characterized by a Wurtzite III-nitride crystal structure, wherein 0≤x2s<1.

Aspect 60A. The semiconductor structure of any one of aspects 55A to 58A, wherein, the first patterned seed region comprises $In_{x1s}Ga_{1-x1s}N$ and is characterized by a Wurtzite III-nitride crystal structure, wherein 0≤x1s≤1; and the second patterned seed region comprises $In_{x2s}Ga_{1-x2s}N$ and is characterized by a Wurtzite III-nitride crystal structure, wherein 0≤x2s≤1.

Aspect 61A. The semiconductor structure of any one of aspects 55A to 58A, wherein each of the first and second patterned seed regions comprise GaN and is characterized by a Wurtzite III-nitride crystal structure.

Aspect 62A. The semiconductor structure of aspect 61A, wherein each of the first and second patterned seed regions has six planar seed facets.

Aspect 63A. The semiconductor structure of aspect 61A, wherein each of the first and second patterned seed regions is characterized by a hexagonal base.

Aspect 64A. The semiconductor structure of any one of aspects 61A to 63A, wherein each of the first and second seed regions comprises seed surfaces coplanar with a crystallographic plane of a Wurtzite III-nitride.

Aspect 65A. The semiconductor structure of aspect 64A, wherein each of the crystallographic planes is a crystallographically equivalent {10-11} plane.

Aspect 66A. The semiconductor structure of aspect 64A, wherein each of the crystallographic planes is a crystallographically equivalent {1-100} plane.

Aspect 67A. The semiconductor structure of aspect 64A, wherein each of the crystallographic planes is a crystallographically equivalent {11-20} plane.

Aspect 68A. The semiconductor structure of aspect 64A, wherein each of the crystallographic planes is a plane rotated between a {1-100} plane and a {11-20} plane.

Aspect 69A. The semiconductor structure of aspect 64, wherein a region at a midpoint between adjacent seed regions is a coalesced growth region.

Aspect 70A. The semiconductor structure of any one of aspects 61A to 65A, wherein each of the first and second seed regions are substantially free of (0001) facets.

Aspect 71A. The semiconductor structure of any one of aspects 1A to 70A, wherein the first $In_{x1}Al_{y1}Ga_{1-x1-y1}N$ growth layer comprises more than one $In_{x1}Al_{y1}Ga_{1-x1-y1}N$ growth region wherein each $In_{x1}Al_{y1}Ga_{1-x1-y1}N$ growth region has a different InN molar fraction.

Aspect 72A. The semiconductor structure of any one of aspects 1A to 71A, wherein the second $In_{x2}Al_{y2}Ga_{1-x2-y2}N$ growth layer comprises more than one $In_{x2}Al_{y2}Ga_{1-x2-y2}N$ growth region wherein each $In_{x2}Al_{y2}Ga_{1-x2-y2}N$ growth region has a different InN molar fraction.

Aspect 73A. The semiconductor structure of aspects 1A to 72A, wherein each of the first $In_{x1}Al_{y1}Ga_{1-x1-y1}N$ growth layer and the second $In_{x2}Al_{y2}Ga_{1-x2-y2}N$ growth layer is independently configured to provide a (0001) growth region having a defined degree of in-plane a-lattice relaxation.

Aspect 74A. The semiconductor structure of any one of aspects 1A to 72A, wherein each of the first $In_{x1}Al_{y1}Ga_{1-x1-y1}N$ growth layer and the second $In_{x2}Al_{y2}Ga_{1-x2-y2}N$ growth layer is independently configured to have a (0001) growth region characterized by a different in-plane a-lattice parameter.

Aspect 75A. The semiconductor structure of any one of aspects 1A to 72A, wherein each of the first $In_{x1}Al_{y1}Ga_{1-x1-y1}N$ growth layer and the second $In_{x2}Al_{y2}Ga_{1-x2-y2}N$ growth layer is independently configured to have a (0001) growth region characterized by a different InN molar fraction.

Aspect 76A. The semiconductor structure of any one of aspects 1A to 75A, comprising:
a first n-type $In_{x1}Al_{y1}Ga_{1-x1-y1}N$ layer overlying the first (0001) $In_{x1}Al_{y1}Ga_{1-x1-y1}N$ growth region;
a first active region overlying the first n-type $In_{x1}Al_{y1}Ga_{1-x1-y1}N$ layer;
a first p-type $In_{x1}Al_{y1}Ga_{1-x1-y1}N$ layer overlying the first active region;
a second n-type $In_{x2}Al_{y2}Ga_{1-x2-y2}N$ layer overlying the second (0001) $In_{x2}Al_{y2}Ga_{1-x2-y2}N$ growth region;
a second active region overlying the second n-type $In_{x2}Al_{y2}Ga_{1-x2-y2}N$ layer; and
a second p-type $In_{x2}Al_{y2}Ga_{1-x2-y2}N$ layer overlying the second active region.

Aspect 77A. The semiconductor structure of aspect 76A, wherein the first n-type $In_{x1}Al_{y1}Ga_{1-x1-y1}N$ layer comprises GaN.

Aspect 78A. The semiconductor structure of aspect 76A, wherein the first n-type $In_{x1}Al_{y1}Ga_{1-x1-y1}N$ layer comprises $In_{x1}Ga_{1-x1}N$.

Aspect 79A. The semiconductor structure of aspect 76A, wherein each of the first n-type $In_{x1}Al_{y1}Ga_{1-x1-y1}N$ layer and the second n-type $In_{x2}Al_{y2}Ga_{1-x2-y2}N$ layer independently has an in-plane a-lattice parameter equivalent to that of the respective underlying (0001) growth region.

Aspect 80A. The semiconductor structure of any one of aspects 76A to 79A, wherein,
the first n-type $In_{x1}Al_{y1}Ga_{1-x1-y1}N$ growth layer is characterized by a first in-plane a-lattice parameter;
the second n-type $In_{x2}Al_{y2}Ga_{1-x2-y2}N$ growth layer is characterized by a second in-plane a-lattice parameter; and
the second in-plane a-lattice parameter is greater than the first in-plane a-lattice parameter.

Aspect 81A. The semiconductor structure of any one of aspects 76A to 79A, wherein each of the first n-type $In_{x1}Al_{y1}Ga_{1-x1-y1}N$ layer and the second n-type $In_{x2}Al_{y2}Ga_{1-x2-y2}N$ layer is independently characterized by an in-plane a-lattice parameter that is equivalent to that of the respective underlying (0001) growth region.

Aspect 82A. The semiconductor structure of any one of aspects 76A to 79A, wherein,
the first n-type $In_{x1}Al_{y1}Ga_{1-x1-y1}N$ layer comprises a first InN molar fraction;
the second n-type $In_{x2}Al_{y2}Ga_{1-x2-y2}N$ layer comprises a second InN molar fraction; and
the second InN molar fraction is greater than the first InN molar fraction.

Aspect 83A. The semiconductor structure of any one of aspects 76A to 82A, wherein the first active region comprises more than one first active layer.

Aspect 84A. The semiconductor structure of any one of aspects 76A to 83A, wherein the second active region comprises more than one active layer.

Aspect 85A. The semiconductor structure of any one of aspects 76A to 84A, wherein each of the first active region and the second active region independently comprise more than one active layer.

Aspect 86A. The semiconductor structure of any one of aspects 76A to 85A, wherein the first active region comprises from 1 to 40 active layers, the second active region comprises from 1 to 40 active layers, or each of the first active region and the second active region comprises from 1 to 40 active layers.

Aspect 87A. The semiconductor device of any one of aspects 76A to 86A, wherein each of the first active region and the second active region independently comprises one or more quantum wells or quantum dots containing an In-bearing III-nitride material.

Aspect 88A. The semiconductor structure of any one of aspects 76A to 87A, wherein,
the first active region comprises a first InN molar fraction;
the second active region comprises a second InN molar fraction; and
the second InN molar fraction is greater than the first InN molar fraction.

Aspect 89A. The semiconductor structure of any one of aspects 76A to 83A, wherein,
the first active region is characterized by a first in-plane strain value;
the second active region is characterized by a second in-plane strain value; and
the first strain value is similar to the second strain value.

Aspect 90A. The semiconductor structure of aspect 89A, wherein the second in-plane strain value is within 10% of the first in-plane strain value.

Aspect 91A. The semiconductor structure of aspect 89A, wherein the second in-plane strain value is within 1% of the first in-plane strain value.

Aspect 92A. The semiconductor structure of aspect 89A, wherein each of the first strain value and the second strain value is independently in a range from 1% to 2% of a compressive strain.

Aspect 93A. The semiconductor structure of any one of aspects 76A to 92A, wherein each of the first active region and the second active region comprises a multiple quantum well structure.

Aspect 94A. The semiconductor structure of any one of aspects 76A to 92A, wherein each of the first active region and the second active region comprises a light emitting diode structure.

Aspect 95A. The semiconductor structure of any one of aspects 76A to 92A, wherein each of the first active region and the second active region comprises a laser diode structure.

Aspect 96A. The semiconductor structure of any one of aspects 76A to 92A, wherein,
the first p-type $In_{x1}Al_{y1}Ga_{1-x1-y1}N$ layer is characterized by a first in-plane a-lattice parameter;
the second p-type $In_{x2}Al_{y2}Ga_{1-x2-y2}N$ layer is characterized by a second in-plane a-lattice parameter; and
the second in-plane a-lattice parameter is greater than the first in-plane a-lattice parameter.

Aspect 97A. The semiconductor structure of any one of aspects 76A to 96A, wherein each of the first p-type $In_{x1}Al_{y1}Ga_{1-x1-y1}N$ layer and the second p-type $In_{x2}Al_{y2}Ga_{1-x2-y2}N$ layer is independently characterized by an in-plane a-lattice parameter that is equivalent to that of the respective underlying (0001) growth region.

Aspect 98A. The semiconductor structure of any one of aspects 76A to 97A wherein,
the first p-type $In_{x1}Al_{y1}Ga_{1-x1-y1}N$ layer comprises a first InN molar fraction;
the second p-type $In_{x2}Al_{y2}Ga_{1-x2-y2}N$ layer comprises a second InN molar fraction; and
the second InN molar fraction is greater than the first InN molar fraction.

Aspect 99A. The semiconductor structure of any one of aspects 76A to 98A, wherein each of the first p-type $In_{x1}Al_{y1}Ga_{1-x1-y1}N$ layer and the second p-type $In_{x2}Al_{y2}Ga_{1-x2-y2}N$ layer independently has an in-plane a-lattice parameter in a range from 3.19 Å to 3.35 Å.

Aspect 100A. The semiconductor device of any one of aspects 76A to 99A, comprising a capping layer comprising an Al-bearing III-nitride material, wherein the capping layer is interposed between the active region and the overlying p-type III-nitride layer.

Aspect 101A. The semiconductor structure of any one of aspects 22A to 100A, wherein each of the first optoelectronic element and the second optoelectronic element are configured to emit electromagnetic radiation within a different wavelength range.

Aspect 102A. The semiconductor structure of any one of aspects 28A to 33A, wherein each of the first optoelectronic element and the second optoelectronic element independently comprises a light-emitting diode, a super-luminescent light emitting diode, a laser diode, or a vertical cavity surface emitting laser.

Aspect 103A. The semiconductor structure of aspect 102A, further comprising:
a cathode electrically connected to each of the first n-type $In_{x1}Al_{y1}Ga_{1-x1-y1}N$ layer and to the second $In_{x2}Al_{y2}Ga_{1-x2-y2}N$ layer; and
an anode electrically connected to each of the first p-type $In_{x1}Al_{y1}Ga_{1-x1-y1}N$ layer and to the second p-type $In_{x2}Al_{y2}Ga_{1-x2-y2}N$ layers.

Aspect 104A. The semiconductor structure of aspect 103A, wherein the cathode comprises Ti and Al.

Aspect 105A. The semiconductor structure of any one of aspects 103A to 104A, wherein the cathode is interconnected to each of the first n-type $In_{x1}Al_{y1}Ga_{1-x1-y1}N$ layer and to the second $In_{x2}Al_{y2}Ga_{1-x2-y2}N$ layer in common.

Aspect 106A. The semiconductor structure of any one of aspects 103A to 104A, wherein the cathode is independently interconnected to each the first n-type $In_{x1}Al_{y1}Ga_{1-x1-y1}N$ layer and to the second $In_{x2}Al_{y2}Ga_{1-x2-y2}N$ layer in common.

Aspect 107A. The semiconductor structure of any one of aspects 103A to 106A, wherein the anode comprises a transparent conductive oxide layer or a reflective contact.

Aspect 108A. The semiconductor structure of any one of aspects 103A to 107A, wherein the anode is interconnected to each of the first n-type $In_{x1}Al_{y1}Ga_{1-x1-y1}N$ layer and to the second $In_{x2}Al_{y2}Ga_{1-x2-y2}N$ layer in common.

Aspect 109A. The semiconductor structure of any one of aspects 103 to 107, wherein the anode is independently interconnected to each the first n-type $In_{x1}Al_{y1}Ga_{1-x1-y1}N$ layer and to the second $In_{x2}Al_{y2}Ga_{1-x2-y2}N$ layer in common.

Aspect 110A. The semiconductor structure of any one of aspects 103A to 109A, wherein the first optoelectronic element and the second optoelectronic element are electrically isolated from each other.

Aspect 111A. A wafer comprising the semiconductor structure of any one of aspects 1A to 108A.

Aspect 112A. An optoelectronic element comprising the semiconductor structure of any one of aspects 1A to 108A.

Aspect 113A. A multi-color optoelectronic device comprising the semiconductor structure of any one of aspects 1A to 108A.

Aspect 114A. A semiconductor device comprising the semiconductor structure of any one of aspects 1A to 108A.

Aspect 115A. A lighting system or a display system comprising the semiconductor device of aspect 114 Å.

Aspect 116A. A method of fabricating a Wurtzite III-nitride crystal semiconductor structure, comprising:
(a) depositing a first $In_{x1}Al_{y1}Ga_{1-x1-y1}N$ growth layer overlying a first substrate region of a substrate; and
(b) depositing a second $In_{x2}Al_{y2}Ga_{1-x2-y2}N$ growth layer overlying a second substrate region of the substrate, wherein the second $In_{x2}Al_{y2}Ga_{1-x2-y2}N$ growth layer overlies a second patterned $In_{x2s}Al_{y2s}Ga_{1-x2s-y2s}N$ seed region,
wherein,
the first $In_{x1}Al_{y1}Ga_{1-x1-y1}N$ growth layer comprises a first (0001) $In_{x1}Al_{y1}Ga_{1-x1-y1}N$ growth region characterized by a first in-plane a-lattice parameter;
the second $In_{x2}Al_{y2}Ga_{1-x2-y2}N$ growth layer comprises a second (0001) $In_{x2}Al_{y2}Ga_{1-x2-y2}N$ growth region characterized by a second in-plane a-lattice parameter; and
the second in-plane a-lattice parameter is greater than the first in-plane a-lattice parameter, wherein, $0 \le x2s \le 1$, $0 \le y2s \le 1$, and $x2s + y2s \le 1$ $0 \le x1 \le 1$, $0 \le y1 \le 1$, and $x1 + y1 \le 1$; and $0 < x2 \le 1$, $0 \le y2 \le 1$, $x2 + y2 \le 1$, and $x2 > x1$.

Aspect 117A. The method of aspect 116A, comprising, before step (a),
depositing a first patterned $In_{x1s}Al_{y1s}Ga_{1-x1s-y1s}N$ seed region overlying the first substrate region, wherein $0 \le x1s \le 1$, $0 \le y1s \le 1$, and $x1s+y1s \le 1$; and
depositing the first $In_{x1}Al_{y1}Ga_{1-x1-y1}N$ growth layer overlying first patterned $In_{x1s}Al_{y1s}Ga_{1-x1s-y1s}N$ seed region.

Aspect 118A. The method of aspect 117A, wherein the first patterned $In_{x1s}Al_{y1s}Ga_{1-x1s-y1s}N$ seed region comprises a first GaN seed region.

Aspect 119A. The method of any one of aspects 117A to 118A, wherein the second patterned $In_{x1s}Al_{y1s}Ga_{1-x1s-y1s}N$ seed region comprises a second patterned GaN seed region.

Aspect 120A. The method of any one of aspects 117A to 119A, wherein the first $In_{x1}Al_{y1}Ga_{1-x1-y1}N$ growth layer and the second $In_{x2}Al_{y2}Ga_{1-x2-y2}N$ growth layer have a different elemental composition.

Aspect 121A. The method of any one of aspects 117 to 120, wherein,
the first $In_{x1}Al_{y1}Ga_{1-x1-y1}N$ growth layer comprises a first $In_{x1}Ga_{1-x1}N$ growth layer;
the second $In_{x2}Al_{y2}Ga_{1-x2-y2}N$ growth layer comprises a second $In_{x2}Ga_{1-x2}N$ growth layer; and
the first $In_{x1}Ga_{1-x1}N$ growth layer and the second $In_{x2}Ga_{1-x2}N$ growth layer have a different elemental composition.

Aspect 122A. The method of any one of aspects 117A to 121A, wherein depositing the first $In_{x1}Al_{y1}Ga_{1-x1-y1}N$ growth layer comprises growing a GaN growth layer to provide a (0001) GaN growth region.

Aspect 123A. The method of any one of aspects 117A to 122A, wherein depositing the first $In_{x1}Al_{y1}Ga_{1-x1-y1}N$ growth layer comprises:
fabricating a first patterned $In_{x1s}Al_{y1s}Ga_{1-x1s-y1s}N$ seed region on the first substrate portion, wherein $0 \leq x1s \leq 1$, $0 \leq y1s \leq 1$, and $x1s+y1s \leq 1$;
growing $In_{x1}Al_{y1}Ga_{1-x1-y1}N$ on the first patterned $In_{x1s}Al_{y1s}Ga_{1-x1s-y1s}N$ seed region to cause the $In_{x1}Al_{y1}Ga_{1-x1-y1}N$ grown on adjacent patterned $In_{x1s}Al_{y1s}Ga_{1-x1s-y1s}N$ seed regions to coalesce and to form a first $In_{x1}Al_{y1}Ga_{1-x1-y1}N$ growth layer; and
growing the first $In_{x1}Al_{y1}Ga_{1-x1-y1}N$ growth layer to provide a (0001) $In_{x1}Al_{y1}Ga_{1-x1-y1}N$ growth region.

Aspect 124A. The method of any one of aspects 117A to 123A, wherein depositing the second $In_{x2}Al_{y2}Ga_{1-x2-y2}N$ growth layer comprises:
fabricating a second patterned $In_{x2s}Al_{y2s}Ga_{1-x2s-y2s}N$ seed region;
growing $In_{x2}Al_{y2}Ga_{1-x2-y2}N$ on the second patterned $In_{x2s}Al_{y2s}Ga_{1-x2s-y2s}N$ seed region to cause the $In_{x2s}Al_{y2s}Ga_{1-x2s-y2s}N$ grown on adjacent $In_{x2s}Al_{y2s}Ga_{1-x2s-y2s}N$ seed regions to coalesce and to form a $In_{x2}Al_{y2}Ga_{1-x2-y2}N$ growth layer; and
growing the $In_{x2}Al_{y2}Ga_{1-x2-y2}N$ growth layer to provide a (0001) $In_{x2}Al_{y2}Ga_{1-x2-y2}N$ growth region.

Aspect 125A. The method of any one of aspects 117A to 124A, comprising, after depositing the first $In_{x1}Al_{y1}Ga_{1-x1-y1}N$ growth layer and after depositing the second $In_{x2}Al_{y2}Ga_{1-x2-y2}N$ growth layer, fabricating a first optoelectronic element overlying the first (0001) $In_{x1}Al_{y1}Ga_{1-x1-y1}N$ growth region and fabricating a second optoelectronic element overlying the second (0001) $In_{x2}Al_{y2}Ga_{1-x2-y2}N$ growth region.

Aspect 126A. The method of any aspect 125A, wherein,
the first optoelectronic element comprises epitaxial layers overlying the first (0001) $In_{x1}Al_{y1}Ga_{1-x1-y1}N$ growth region; and
the second optoelectronic element comprises epitaxial layers overlying the second (0001) $In_{x2}Al_{y2}Ga_{1-x2-y2}N$ growth region.

Aspect 127A. The method of aspect 126A, wherein the epitaxial layers comprise a n-type layer, an active region, a p-type layer, or a combination of any of the foregoing.

Aspect 128A. The method of any one of aspects 126A to 127A, wherein the first $In_{x1}Al_{y1}Ga_{1-x1-y1}N$ growth layer comprises GaN.

Aspect 129A. The method of any one of aspects 126A to 127A, wherein the first $In_{x1}Al_{y1}Ga_{1-x1-y1}N$ growth layer comprises $In_{x1}Ga_{1-x1}N$.

Aspect 130A. The method of any one of aspects 126A to 127A, wherein the second $In_{x2}Al_{y2}Ga_{1-x2-y2}N$ growth layer comprises $In_{x2}Ga_{1-x2}N$.

Aspect 131A. The method of any one of aspects 126A to 130A, wherein the method comprises simultaneously fabricating the first optoelectronic element and the second optoelectronic element.

Aspect 132A. The method of any one of aspects 126A to 130A, wherein the method comprises sequentially fabricating the first optoelectronic element and the second optoelectronic element.

Aspect 133A. The method of any one of aspects 126A to 132A, wherein each of the first optoelectronic element and the second optoelectronic element is independently selected from a light emitting diode, a super-luminescent light emitting diode, a laser diode, and a vertical cavity surface emitting laser.

Aspect 134A. The method of any one of aspects 117A to 133A, comprising, after depositing the first $In_{x1}Al_{y1}Ga_{1-x1-y1}N$ growth layer and after depositing the second $In_{x2}Al_{y2}Ga_{1-x2-y2}N$ growth layer:
(c) depositing a first n-type $In_{x1}Al_{y1}Ga_{1-x1-y1}N$ layer overlying the $In_{x1}Al_{y1}Ga_{1-x1-y1}N$ growth layer and depositing a second n-type $In_{x2}Al_{y2}Ga_{1-x2-y2}N$ layer overlying the second $In_{x2}Al_{y2}Ga_{1-x2-y2}N$ growth layer;
(d) depositing a first active region overlying the first n-type $In_{x1}Al_{y1}Ga_{1-x1-y1}N$ layer and depositing a second active region overlying the second n-type $In_{x2}Al_{y2}Ga_{1-x2-y2}N$ layer;
(e) depositing a first p-type $In_{x1}Al_{y1}Ga_{1-x1-y1}N$ layer overlying the first active region and depositing a second p-type $In_{x2}Al_{y2}Ga_{1-x2-y2}N$ layer overlying the second active region, wherein,
the first active region is characterized by a first in-plane a-lattice parameter;
the second active region is characterized by a second in-plane a-lattice parameter; and
the second in-plane a-lattice parameter is greater than the first in-plane a-lattice parameter.

Aspect 135A. The method of aspect 134A, wherein depositing the first n-type $In_{x1}Al_{y1}Ga_{1-x1-y1}N$ layer and depositing the second n-type $In_{x2}Al_{y2}Ga_{1-x2-y2}N$ layer comprises simultaneously depositing.

Aspect 136A. The method of aspect 134A, wherein depositing the first n-type $In_{x1}Al_{y1}Ga_{1-x1-y1}N$ layer and depositing the second n-type $In_{x2}Al_{y2}Ga_{1-x2-y2}N$ layer comprises independently depositing.

Aspect 137A. The method of any one of aspects 134A to 136A, wherein depositing the first active region and depositing the second active region comprises simultaneously depositing.

Aspect 138A. The method of any one of aspects 134A to 136A, wherein depositing the first active region and depositing the second active region comprises independently depositing.

Aspect 139A. The method of any one of aspects 134A to 138A, wherein depositing the first p-type $In_{x1}Al_{y1}$ Ga$_{1-x1-y1}$N layer and depositing the second p-type In$_{x2}$Al$_{y2}$Ga$_{1-x2-y2}$N layer comprises simultaneously depositing.

Aspect 140. The method of any one of aspects 134A to 138A, wherein depositing the first p-type In$_{x1}$Al$_{y1}$Ga$_{1-x1-y1}$N layer and depositing the second p-type In$_{x2}$Al$_{y2}$Ga$_{1-x2-y2}$N layer comprises independently depositing.

Aspect 141A. The method of any one of aspects 134A to 140A, wherein simultaneously depositing comprises depositing using the same deposition conditions.

Aspect 142A. The method of any one of aspects 134A to 140A, wherein independently depositing comprises depositing using different deposition conditions.

Aspect 143A. The method of any one of aspects 134A to 142A, comprising depositing electrical contacts overlying each of the n-type layers.

Aspect 144A. The method of any one of aspects 134A to 143A, comprising depositing electrical contacts overlying each of the p-type layers.

Aspect 145A. A semiconductor structure fabricated using the method of any one of aspects 116A to 144 Å.

Aspect 146. A semiconductor wafer comprising the semiconductor structure of any one of aspects 1A to 110 Å.

Aspect 147A. A multi-wavelength optoelectronic element comprising the semiconductor structure of any one of aspects 1A to 110 Å.

Aspect 148A. A semiconductor device comprising the semiconductor device comprising the optoelectronic element of aspect 147 Å.

Aspect 149A. A lighting system or a display system comprising the semiconductor device of aspect 148A.

Finally, it should be noted that there are alternative ways of implementing the embodiments disclosed herein. Accordingly, the present embodiments are to be considered as illustrative and not restrictive, and the claims are not to be limited to the details given herein but may be modified within the scope and equivalents thereof.

What is claimed is:

1. A Wurtzite III-nitride crystal semiconductor structure configured to emit radiation at multiple wavelengths comprising:
a substrate comprising a first substrate region and a second substrate region;
a first In$_{x1}$Al$_{y1}$Ga$_{1-x1-y1}$N growth layer comprising a first (0001) In$_{x1}$Al$_{y1}$Ga$_{1-x1-y1}$N growth region overlying the first substrate region;
a second patterned In$_{x2s}$Al$_{y2s}$Ga$_{1-x2s-y2s}$N seed region comprising a plurality of seed regions overlying the second substrate region, wherein each of the seed regions of the second patterned In$_{x2s}$Al$_{y2s}$Ga$_{1-x2s-y2s}$N seed region is six sided with a hexagonal base and triangular facets that are each coplanar with one of the {1-101} equivalent planes;
a second In$_{x2}$Al$_{y2}$Ga$_{1-x2-y2}$N growth layer comprising a second (0001) In$_{x2}$Al$_{y2}$Ga$_{1-x2-y2}$N growth region overlying the second patterned In$_{x2s}$Al$_{y2s}$Ga$_{1-x2s-y2s}$N seed region, wherein,
the first (0001) In$_{x1}$Al$_{y1}$Ga$_{1-x1-y1}$N growth region is characterized by a first in-plane a-lattice parameter;
the second (0001) In$_{x2}$Al$_{y2}$Ga$_{1-x2-y2}$N growth region is characterized by a second in-plane a-lattice parameter;
the second in-plane a-lattice parameter is greater than the first in-plane a-lattice parameter;

$0 \le x2s \le 1, 0 \le y2s \le 1$, and $x2s + y2s \le 1$;

$0 \le x1 \le 1, 0 \le y1 \le 1$, and $x1 + y1 \le 1$; and $0 < x2 \le 1, 0 \le y2 \le 1, x2 + y2 \le 1$, and $x2 > x1$.

2. The semiconductor structure of claim 1, wherein the substrate comprises sapphire, silicon, silicon carbide, gallium nitride, silicon-on-insulator, gallium oxide or aluminum nitride.

3. The semiconductor structure of claim 1, wherein the second patterned In$_{x2s}$Al$_{y2s}$Ga$_{1-x2s-y2s}$N seed region comprises GaN.

4. The semiconductor structure of claim 1, wherein
a first patterned In$_{x1s}$Al$_{y1s}$Ga$_{1-x1s-y1s}$N seed region overlies the first substrate region, wherein $0 \le x1s \le 1$, $0 \le y1s \le 1$, and $x1s+y1s \le 1$; and
the first In$_{x1}$Al$_{y1}$Ga$_{1-x1-y1}$N growth layer overlies the first patterned In$_{x1s}$Al$_{y1s}$Ga$_{1-x1s-y1s}$N seed region.

5. The semiconductor structure of claim 4, wherein each of the first patterned In$_{x1s}$Al$_{y1s}$Ga$_{1-x1s-y1s}$N seed region and the second patterned In$_{x2s}$Al$_{y2s}$Ga$_{1-x2s-y2s}$N seed region comprises GaN.

6. The semiconductor structure of claim 4, wherein each of the first patterned In$_{x1s}$Al$_{y1s}$Ga$_{1-x1s-y1s}$N seed region and the second patterned In$_{x2s}$Al$_{y2s}$Ga$_{1-x2s-y2s}$N seed region comprises the same composition.

7. The semiconductor structure of claim 1, wherein each of the first patterned In$_{x1s}$Al$_{y1s}$Ga$_{1-x1s-y1s}$N seed region and the second patterned In$_{x2s}$Al$_{y2s}$Ga$_{1-x2s-y2s}$N seed region comprise a different composition.

8. The semiconductor structure of claim 1, wherein a first plane parallel to a (0001) plane of the Wurtzite III-nitride structure and intersecting the seed regions is characterized by:
an intersection of the first plane and a first edge of the second patterned seed region locates a first In$_{x1s}$Al$_{y1s}$Ga$_{1-x1s-y1s}$N/In$_{x1}$Al$_{y1}$Ga$_{1-x1-y1}$N heterojunction; and
the first In$_{x1s}$Al$_{y1s}$Ga$_{1-x1s-y1s}$N/In$_{x1}$Al$_{y1}$Ga$_{1-x1-y1}$N heterojunction is coplanar with a first crystallographic plane of the seed region.

9. The semiconductor structure of claim 8, wherein the first In$_{x1s}$Al$_{y1s}$Ga$_{1-x1s-y1s}$N/In$_{x1}$Al$_{y1}$Ga$_{1-x1-y1}$N heterojunction comprises a grading of composition from x1s and y1s, to x1 and y1.

10. The semiconductor structure of claim 8, wherein any second plane parallel to the (0001) plane of the Wurtzite III-nitride crystal structure and intersecting a second edge of the seed regions locates a second In$_{x1s}$Al$_{y1s}$Ga$_{1-x1s-y1s}$N/In$_{x1}$Al$_{y1}$Ga$_{1-x1-y1}$N heterojunction, wherein the second In$_{x1s}$Al$_{y1s}$Ga$_{1-x1s-y1s}$N/In$_{x1}$Al$_{y1}$Ga$_{1-x1-y1}$N heterojunction is coplanar with a second crystallographic plane of the seed region.

11. The semiconductor structure of claim 10, wherein each of the first crystallographic plane and the second crystallographic plane is crystallographically equivalent.

12. The semiconductor structure of claim 1, wherein a first plane parallel to a (0001) plane of the Wurtzite III-nitride structure and intersecting the seed regions is characterized by:
an intersection of the first plane and a first edge of the first patterned seed region locates a first In$_{x2s}$Al$_{y2s}$Ga$_{1-x2s-y2s}$N/In$_{x2}$Al$_{y2}$Ga$_{1-x2-y2}$N heterojunction; and the first $In_{x2s}Al_{y2s}Ga_{1-x2s-y2s}N/In_{x2}Al_{y2}Ga_{1-x2-y2}N$ heterojunction is coplanar with a first crystallographic plane of the seed region.

13. The semiconductor structure of claim 12, wherein the first $In_{x2s}Al_{y2s}Ga_{1-x2s-y2s}N/In_{x2}Al_{y2}Ga_{1-x2-y2}N$ heterojunction comprises a grading of composition from x2s and y2s, to x2 and y2.

14. The semiconductor structure of claim 12, wherein any second plane parallel to the (0001) plane of the Wurtzite III-nitride crystal structure and intersecting a second edge of the seed regions locates a second $In_{x2s}Al_{y2s}Ga_{1-x2s-y2s}N/In_{x2}Al_{y2}Ga_{1-x2-y2}N$ heterojunction, wherein the second $In_{x2s}Al_{y2s}Ga_{1-x2s-y2s}N/In_{x2}Al_{y2}Ga_{1-x2-y2}N$ heterojunction is coplanar with a second crystallographic plane of the seed region.

15. The semiconductor structure of claim 10, wherein each of the first crystallographic plane and the second crystallographic plane is crystallographically equivalent.

16. The semiconductor structure of claim 1, comprising a first patterned $In_{x1s}Al_{y1s}Ga_{1-x1s-y1s}N$ seed region overlying the first substrate region and the first $In_{x1}Al_{y1}Ga_{1-x1-y1}N$ growth layer overlies the first patterned $In_{x1}Al_{y1}Ga_{1-x1-y1}N$ seed region.

17. The semiconductor structure of claim 16, wherein each of the seed regions of the first patterned $In_{x1}Al_{y1}Ga_{1-x1-y1}N$ seed region is six sided with a hexagonal base and triangular facets that are each coplanar with one of the {1-101} equivalent planes.

18. The semiconductor structure of claim 1, wherein the second patterned $In_{x2s}Al_{y2s}Ga_{1-x2s-y2s}N$ seed region comprises $In_{x2s}Ga_{1-x2s}N$, wherein $0 \le x2s \le 1$.

19. The semiconductor structure of claim 1, wherein,
the first (0001) $In_{x1}Al_{y1}Ga_{1-x1-y1}N$ growth region comprises $In_{x1}Ga_{1-x1}N$, wherein $0 \le x1 \le 1$;
the second (0001) $In_{x2}Al_{y2}Ga_{1-x2-y2}N$ growth region comprises $In_{x2}Ga_{1-x2}N$, wherein $0 < x2 \le 1$; and
x2>x1.

20. The semiconductor structure of claim 1, wherein each of the first (0001) $In_{x1}Al_{y1}Ga_{1-x1-y1}N$ growth region and the second (0001) $In_{x2}Al_{y2}Ga_{1-x2-y2}N$ growth region comprise a different elemental composition.

21. The semiconductor structure of claim 1, wherein each of the first (0001) $In_{x1}Al_{y1}Ga_{1-x1-y1}N$ growth region and the second (0001) $In_{x2}Al_{y2}Ga_{1-x2-y2}N$ growth region is independently characterized by an in-plane a-lattice parameter within a range from 3.189 Å to 3.50 Å.

22. The semiconductor structure of claim 1, wherein,
the first $In_{x1}Al_{y1}Ga_{1-x1-y1}N$ growth layer comprises $In_{x1}Ga_{1-x1}N$;
the second $In_{x2}Al_{y2}Ga_{1-x2-y2}N$ growth layer comprises $In_{x2}Ga_{1-x2}N$;
the first (0001) $In_{x1}Al_{y1}Ga_{1-x1-y1}N$ growth region comprises $In_{x1}Ga_{1-x1}N$;
the second (0001) $In_{x2}Al_{y2}Ga_{1-x2-y2}N$ growth region comprises $In_{x2}Ga_{1-x2}N$; and
x2>x1.

23. The semiconductor structure of claim 1, comprising:
a first n-type $In_{x1}Al_{y1}Ga_{1-x1-y1}N$ layer overlying the first (0001) $In_{x1}Al_{y1}Ga_{1-x1-y1}N$ growth region;
a first active region layer overlying the first n-type $In_{x1}Al_{y1}Ga_{1-x1-y1}N$ layer;
a first p-type $In_{x1}Al_{y1}Ga_{1-x1-y1}N$ layer overlying the first active region;
a second n-type $In_{x2}Al_{y2}Ga_{1-x2-y2}N$ layer overlying the second (0001) $In_{x2}Al_{y2}Ga_{1-x2-y2}N$ growth region;
a second active region overlying the second n-type $In_{x2}Al_{y2}Ga_{1-x2-y2}N$ layer; and a second p-type $In_{x2}Al_{y2}Ga_{1-x2-y2}N$ layer overlying the second active region.

24. The semiconductor structure of claim 1, wherein the semiconductor structure comprises:
a first optoelectronic element overlying the first (0001) $In_{x1}Al_{y1}Ga_{1-x1-y1}N$ growth region; and
a second optoelectronic element overlying the second (0001) $In_{x2}Al_{y2}Ga_{1-x2-y2}N$ growth region.

25. The semiconductor structure of claim 24, wherein,
the first optoelectronic element is configured to emit electromagnetic radiation at a first wavelength; and
the second optoelectronic element is configured to emit electromagnetic radiation at a second wavelength; and
the first wavelength is shorter than the second wavelength.

26. A semiconductor wafer comprising a Wurtzite III-nitride crystal semiconductor structure comprising:
a substrate comprising a first substrate region and a second substrate region;
a first $In_{x1}Al_{y1}Ga_{1-x1-y1}N$ growth layer comprising a first (0001) $In_{x1}Al_{y1}Ga_{1-x1-y1}N$ growth region overlying the first substrate region;
a second patterned $In_{x2s}Al_{y2s}Ga_{1-x2s-y2s}N$ seed region comprising a plurality of seed regions overlying the second substrate region, wherein each of the seed regions of the second patterned $In_{x2s}Al_{y2s}Ga_{1-x2s-y2s}N$ seed region is six sided with a hexagonal base and triangular facets that are each coplanar with one of the {1-101} equivalent planes;
a second $In_{x2}Al_{y2}Ga_{1-x2-y2}N$ growth layer comprising a second (0001) $In_{x2}Al_{y2}Ga_{1-x2-y2}N$ growth region overlying the second patterned $In_{x2s}Al_{y2s}Ga_{1-x2s-y2s}N$ seed region, wherein,
the first (0001) $In_{x1}Al_{y1}Ga_{1-x1-y1}N$ growth region is characterized by a first in-plane a-lattice parameter;
the second (0001) $In_{x2}Al_{y2}Ga_{1-x2-y2}N$ growth region is characterized by a second in-plane a-lattice parameter;
the second in-plane a-lattice parameter is greater than the first in-plane a-lattice parameter:

$$0 \le x2s \le 1, 0 \le y2s \le 1, \text{ and } x2s + y2s \le 1;$$
$$0 \le x1 \le 1, 0 \le y1 \le 1, \text{ and } x1 + y1 \le 1; \text{ and}$$
$$0 < x2 \le 1, 0 \le y2 \le 1, x2 + y2 \le 1, \text{ and } x2 > x1.$$

27. A multi-wavelength optoelectronic element comprising the semiconductor structure of claim 1.

28. A semiconductor device comprising a multi-wavelength optoelectronic element, wherein the multi-wavelength optoelectronic element comprises a Wurtzite III-nitride crystal semiconductor structure comprising:
a substrate comprising a first substrate region and a second substrate region;
a first $In_{x1}Al_{y1}Ga_{1-x1-y1}N$ growth layer comprising a first (0001) $In_{x1}Al_{y1}Ga_{1-x1-y1}N$ growth region overlying the first substrate region;
a second patterned $In_{x2s}Al_{y2s}Ga_{1-x2s-y2s}N$ seed region comprising a plurality of seed regions overlying the second substrate region, wherein each of the seed regions of the second patterned $In_{x2s}Al_{y2s}Ga_{1-x2s-y2s}N$ seed region is six sided with a hexagonal base and triangular facets that are each coplanar with one of the {1-101} equivalent planes;

a second $In_{x2}Al_{y2}Ga_{1-x2-y2}N$ growth layer comprising a second (0001) $In_{x2}Al_{y2}Ga_{1-x2-y2}N$ growth region overlying the second patterned $In_{x2s}Al_{y2s}Ga_{1-x2s-y2s}N$ seed region, wherein, the first (0001) $In_{x1}Al_{y1}Ga_{1-x1-y1}N$ growth region is characterized by a first in-plane a-lattice parameter;

the second (0001) $In_{x2}Al_{y2}Ga_{1-x2-y2}N$ growth region is characterized by a second in-plane a-lattice parameter;

the second in-plane a-lattice parameter is greater than the first in-plane a-lattice parameter;

$0 \le x2s \le 1, 0 \le y2s \le 1$, and $x2s + y2s \le 1$;

$0 \le x1 \le 1, 0 \le y1 \le 1$, and $x1 + y1 \le 1$; and $0 < x2 \le 1, 0 \le y2 \le 1, x2 + y2 \le 1$, and $x2 > x1$.

29. A lighting system or a display system comprising the semiconductor device of claim 28.

\* \* \* \* \*

UNITED STATES PATENT AND TRADEMARK OFFICE
CERTIFICATE OF CORRECTION

| | | |
|---|---|---|
| PATENT NO. | : 12,107,113 B2 | Page 1 of 1 |
| APPLICATION NO. | : 18/401290 | |
| DATED | : October 1, 2024 | |
| INVENTOR(S) | : Michael R. Krames | |

It is certified that error appears in the above-identified patent and that said Letters Patent is hereby corrected as shown below:

In the Claims

In Claim 16, Column 63, Line 20, that reads "first patterned $In_{x1}Al_{y1}Ga_{1-x1-y1}N$ seed region" should read -- first patterned $In_{x1s}Al_{y1s}Ga_{1-x1s-y1s}N$ seed region --.

In Claim 17, Column 63, Lines 25-26, that reads "first patterned $In_{x1}Al_{y1}Ga_{1-x1-y1}N$ seed region" should read -- first patterned $In_{x1s}Al_{y1s}Ga_{1-x1s-y1s}N$ seed region --.

Signed and Sealed this
Seventeenth Day of December, 2024

Derrick Brent
*Acting Director of the United States Patent and Trademark Office*